US010636973B2

(12) United States Patent
Takahiro et al.

(10) Patent No.: US 10,636,973 B2
(45) Date of Patent: Apr. 28, 2020

(54) POLYMER MATERIAL, MATERIAL FOR ELECTROLUMINESCENCE DEVICE, COMPOSITION, THIN FILM, AND ELECTROLUMINESCENCE DEVICE COMPRISING THE SAME

(71) Applicant: SAMSUNG ELECTRONICS CO., LTD., Suwon-si, Gyeonggi-do (KR)

(72) Inventors: Fujiyama Takahiro, Yokohama (JP); Fumiaki Kato, Yokohama (JP); Takao Motoyama, Yokohama (JP); Yusaku Konishi, Yokohama (JP); Mitsunori Ito, Yokohama (JP); Furuta Keigo, Yokohama (JP)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/244,164

(22) Filed: Jan. 10, 2019

(65) Prior Publication Data

US 2019/0214566 A1 Jul. 11, 2019

(30) Foreign Application Priority Data

Jan. 10, 2018 (JP) ................................ 2018-002095
Jun. 20, 2018 (KR) ........................ 10-2018-0070738

(51) Int. Cl.
*H01L 51/00* (2006.01)
*C08G 61/12* (2006.01)
(Continued)

(52) U.S. Cl.
CPC ........ *H01L 51/0035* (2013.01); *C08G 61/124* (2013.01); *C09K 11/02* (2013.01); *H05B 33/22* (2013.01); *C08G 2261/12* (2013.01); *C08G 2261/149* (2013.01); *C08G 2261/1412* (2013.01); *C08G 2261/1434* (2013.01);
(Continued)

(58) Field of Classification Search
CPC ... H01L 51/00; H01L 51/003; H01L 51/0035; H01L 51/50; H01L 51/50; H01L 51/5004; H01L 51/502; H01L 51/505; H01L 51/5056; C08G 2261/12; C08G 2261/14; C08G 2261/141; C08G 2261/1412; C08G 2261/143; C08G 2261/1434;
(Continued)

(56) References Cited

U.S. PATENT DOCUMENTS 8,330,142 B2 12/2012 Cho et al.
8,580,393 B2 11/2013 Mizuki et al.
(Continued)

FOREIGN PATENT DOCUMENTS

JP 2010199067 A 9/2010
JP 5090746 A 12/2012
(Continued)

OTHER PUBLICATIONS

Extended European Search Report dated Apr. 30, 2019, of the corresponding European Patent Application No. 19150691.4.

*Primary Examiner* — Monica D Harrison
(74) *Attorney, Agent, or Firm* — Cantor Colburn LLP

(57) ABSTRACT

A polymer material includes a structural unit represented by Chemical Formula 1

+X—Y+ Chemical Formula 1 wherein, in Chemical Formula 1, X and Y are as defined herein.

19 Claims, 6 Drawing Sheets

(51) Int. Cl.

| | |
|---|---|
| ***H05B 33/22*** | (2006.01) |
| ***C09K 11/02*** | (2006.01) |
| *H01L 51/50* | (2006.01) |

(52) U.S. Cl.

CPC ...... *C08G 2261/312* (2013.01); *H01L 51/502* (2013.01); *H01L 51/5004* (2013.01); *H01L 51/5056* (2013.01); *H01L 2251/552* (2013.01)

(58) Field of Classification Search

CPC ........ C08G 2261/149; C08G 2261/312; C09K 11/02; H05B 33/22

USPC .......................................................... 257/13

See application file for complete search history.

(56) References Cited

U.S. PATENT DOCUMENTS

| | | | |
|---|---|---|---|
| 10,038,143 | B2 | 7/2018 | Ono et al. |
| 2006/0121314 | A1 | 6/2006 | Choi et al. |
| 2011/0284829 | A1 | 11/2011 | Fukushima et al. |
| 2014/0175421 | A1* | 6/2014 | Pan .................... H01L 51/0035 257/40 |
| 2016/0133842 | A1 | 5/2016 | Fujiyama et al. |
| 2017/0170400 | A1 | 6/2017 | Spencer et al. |
| 2017/0253795 | A1 | 9/2017 | Yoshioka et al. |
| 2017/0283546 | A1 | 10/2017 | Sakakibara et al. |
| 2017/0288163 | A1 | 10/2017 | Pintani et al. |

FOREIGN PATENT DOCUMENTS

| | | | |
|---|---|---|---|
| JP | 5587172 | B2 | 9/2014 |
| JP | 5691177 | B2 | 4/2015 |
| JP | 2015187942 | A | 10/2015 |
| KR | 20070017733 | A | 2/2007 |
| KR | 1249640 | B1 | 4/2013 |
| KR | 1306399 | B1 | 9/2013 |
| KR | 1412887 | B1 | 6/2014 |
| KR | 20170046715 | A | 5/2017 |
| KR | 20170048424 | A | 5/2017 |
| KR | 20170065553 | A | 6/2017 |
| WO | 2014042265 | A1 | 3/2014 |
| WO | 2016026123 | A1 | 2/2016 |
| WO | 2017107117 | A1 | 6/2017 |

* cited by examiner

POLYMER MATERIAL, MATERIAL FOR ELECTROLUMINESCENCE DEVICE, COMPOSITION, THIN FILM, AND ELECTROLUMINESCENCE DEVICE COMPRISING THE SAME

CROSS-REFERENCE TO RELATED APPLICATION

This application claims priority to and the benefit of Japanese Patent Application No. 2018-002095 filed on Jan. 10, 2018, in the Japan Patent Office, and Korean Patent Application No. 10-2018-0070738 filed on Jun. 20, 2018, in the Korean Patent Office, and all the benefits accruing therefrom under 35 U.S.C. § 119, the entire disclosures of which are incorporated herein by reference.

BACKGROUND

1. Field

A polymer material and a material for an electroluminescence device, a composition, a thin film, and an electroluminescence device including the same are disclosed.

2. Description of the Related Art

There is a continuing interest in the development of a display device corresponding to a wide color gamut. For example, in the organic electroluminescence device, attempts have been made to improve the color gamut by changing the material constituting the light emitting layer.

Examples of the organic light-emitting materials constituting the light emitting layer of the organic electroluminescence devices include a fluorescent light-emitting material and a phosphorescent light-emitting material. However, when these materials are used, it can be difficult to obtain a sharp emission spectrum.

Quantum dots are materials having a sharp emission spectrum, and there is a continuing interest in a quantum dot light emitting device in which quantum dots are applied to a light emitting layer.

SUMMARY

An embodiment provides a polymer material capable of improving luminous efficiency of an electroluminescence device, a material for an electroluminescence device, a composition, a thin film, and an electroluminescence device including the same.

According to an embodiment, a polymer material includes a structural unit represented by Chemical Formula 1.

$$-[X-Y]-$$ Chemical Formula 1

In Chemical Formula 1,

X is represented by Chemical Formula 2, and

Y is a substituted or unsubstituted C6 to C60 divalent aromatic cyclic group, a substituted or unsubstituted C6 to C60 divalent alicyclic cyclic group, a substituted or unsubstituted C3 to C60 divalent aromatic heterocyclic group, or a substituted or unsubstituted C3 to C60 divalent alicyclic heterocyclic group.

Chemical Formula 2

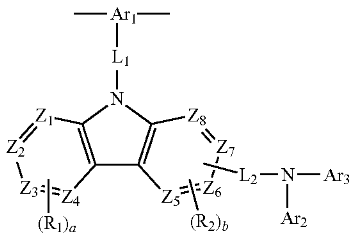

In Chemical Formula 2, $Ar_1$ is a substituted or unsubstituted C6 to C60 trivalent aromatic cyclic group, or a substituted or unsubstituted C3 to C60 trivalent aromatic heterocyclic group, $Ar_2$ and $Ar_3$ are each independently a substituted or unsubstituted C6 to C60 monovalent aromatic cyclic group, or a substituted or unsubstituted C3 to C60 monovalent aromatic heterocyclic group, $L_1$ and $L_2$ are each independently a single bond, a substituted or unsubstituted C6 to C60 divalent aromatic cyclic group, or a substituted or unsubstituted C3 to C60 divalent aromatic heterocyclic group, each $R_1$ and $R_2$ are the same or different, and are independently a substituted or unsubstituted C1 to C20 alkyl group, a substituted or unsubstituted C1 to C20 alkoxy group, a substituted or unsubstituted C6 to C60 monovalent aromatic cyclic group, or a substituted or unsubstituted C3 to C60 monovalent aromatic heterocyclic group, or $R_1$ and $R_2$ are combined with each other to form one ring that is a pentagonal ring, a hexagonal ring, or a fused ring, a is an integer ranging from 0 to 4, b is an integer ranging from 0 to 3, and $Z_1$ to $Z_8$ are each independently a nitrogen atom or —CH═.

Y is a substituted or unsubstituted C6 to C60 divalent aromatic cyclic group, or a substituted or unsubstituted C3 to C60 divalent aromatic heterocyclic group.

X may be a group represented by Chemical Formulae 2-1 to 2-6.

(2-1)

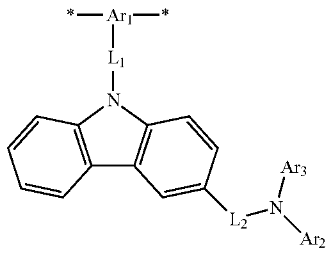

(2-2)

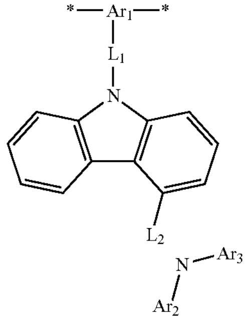

-continued (2-3)

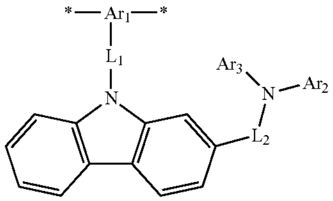

(2-4)

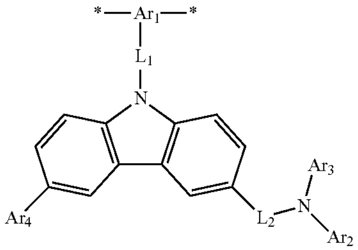

(2-5)

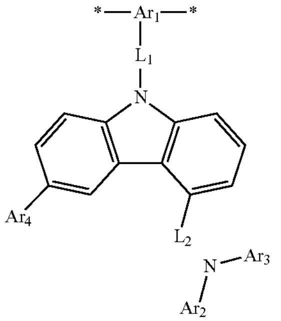

(2-6)

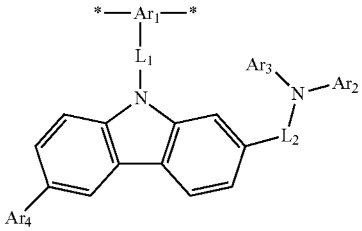

In Chemical Formulae 2-1 to 2-6, $Ar_1$, $Ar_2$, $Ar_3$, $L_1$, and $L_2$ are the same as in claim 1, $Ar_4$ is a substituted or unsubstituted C6 to C60 monovalent aromatic cyclic group, or a substituted or unsubstituted C3 to C60 monovalent aromatic heterocyclic group, and

* is a linking point.

$L_1$ and $L_2$ may each independently be a single bond, a phenylene group, a biphenylene group, a fluorenylene group, a naphthylene group, an anthrylene group, a phenanthrylene group, a naphthacenylene group, a pyrenylene group, a terphenylene group, a tolylene group, a t-butyl phenylene group, or a (phenylpropyl)phenylene group.

Y may be a group represented by Chemical Formulae 2-7 to 2-14.

(2-7)

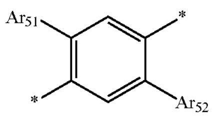

-continued (2-8)

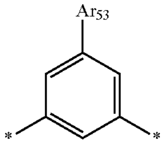

(2-9)

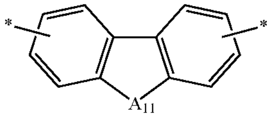

(2-10)

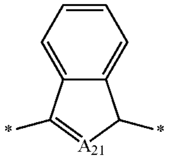

(2-11)

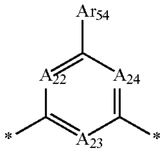

(2-12)

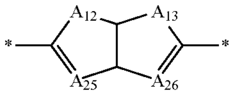

(2-13)

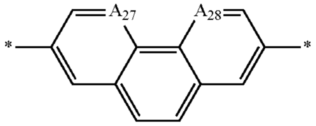

(2-14)

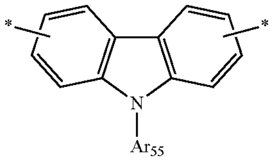

In Chemical Formulae 2-7 to 2-14, $Ar_{51}$ to $Ar_{55}$ are each independently hydrogen, deuterium, a substituted or unsubstituted C1 to C20 alkyl group, a substituted or unsubstituted C1 to C20 heteroalkyl group, a substituted or unsubstituted C6 to C60 monovalent aromatic cyclic group, or a substituted or unsubstituted C3 to C60 monovalent aromatic heterocyclic group, $A_{11}$ to $A_{13}$ are each independently —O—, —S—, —Se—, $—CR_3R_4—$, or $—SiR_5R_6—$ wherein $R_3$ to $R_6$ are each independently hydrogen, deuterium, a substituted or unsubstituted alkyl group, a substituted or unsubstituted aryl group, or a substituted or unsubstituted heteroaryl group, $A_{21}$ to $A_{28}$ are each independently $—CR_7=$, $—N=$, or $—SiR_8=$ wherein $R_7$ to $R_8$ are each independently hydrogen, deuterium, a substituted or unsubstituted alkyl group, a substituted or unsubstituted aryl group, or a substituted or unsubstituted heteroaryl group, and

* is a linking point.

$Ar_1$ may be a group represented by Chemical Formulae 2-15 to 2-26.

(2-15)

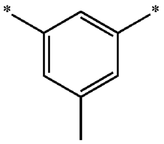

(2-16)

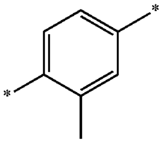

(2-17)

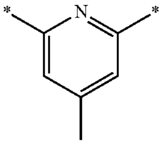

(2-18)

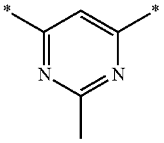

(2-19)

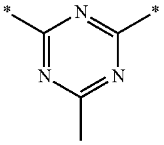

(2-20)

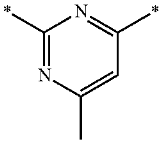

(2-21)

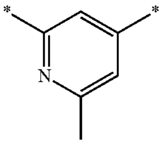

(2-22)

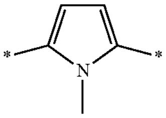

(2-23)

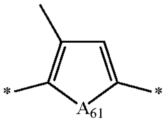

(2-24)

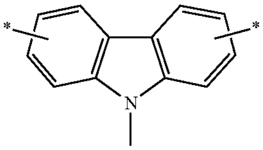

-continued (2-25)

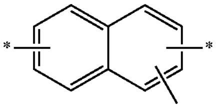

(2-26)

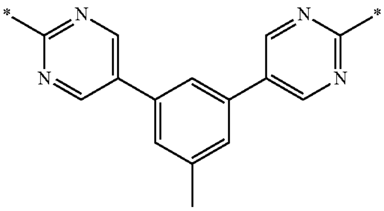

In Chemical Formulae 2-15 to 2-26, $A_{61}$ is —O—, —S—, —Se—, —$NR_{61}$— (wherein $R_{61}$ is hydrogen, deuterium, a substituted or unsubstituted alkyl group, a substituted or unsubstituted aryl group, or a substituted or unsubstituted heteroaryl group), or —$CR_{62}R_{63}$— (wherein $R_{62}$ and $R_{63}$ are each independently hydrogen, deuterium, a substituted or unsubstituted alkyl group, a substituted or unsubstituted aryl group, or a substituted or unsubstituted heteroaryl group), and

* is a linking point.

$Ar_2$ and $Ar_3$ may each independently be a group represented by Chemical Formulae 2-27 to 2-70.

(2-27)

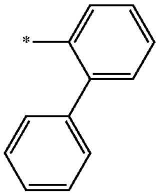

(2-28)

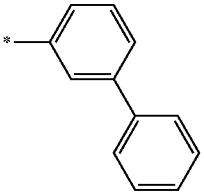

(2-29)

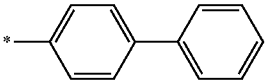

(2-30)

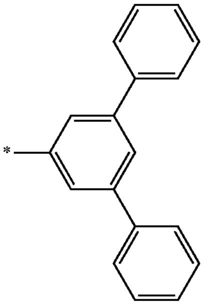

-continued
(2-31)
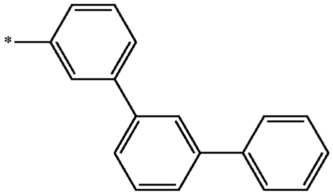
(2-32)
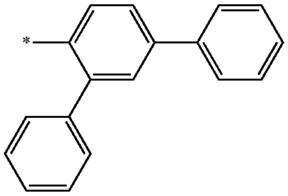
(2-33)
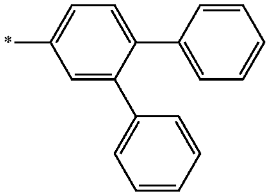
(2-34)
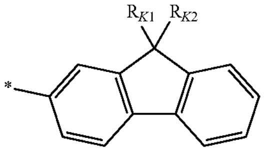
(2-35)
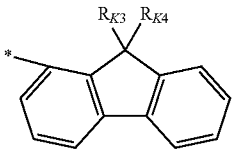
(2-36)
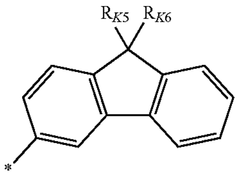
(2-37)
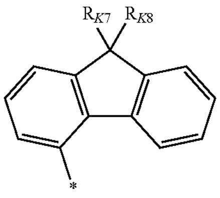
(2-38)
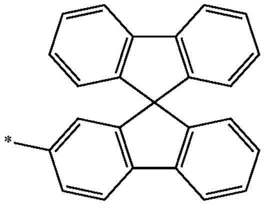
-continued
(2-39)
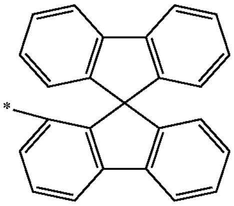
(2-40)
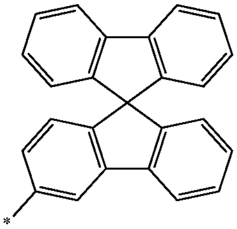
(2-41)
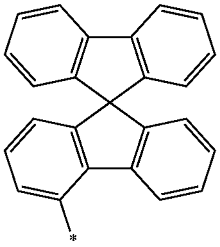
(2-42)
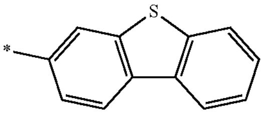
(2-43)
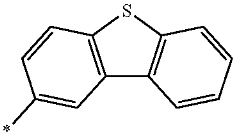
(2-44)
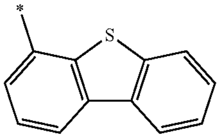
(2-45)
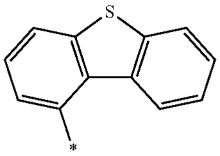
(2-46)
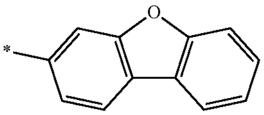
(2-47)
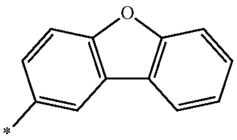

-continued (2-48)

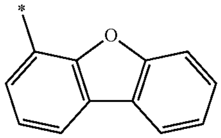

(2-49)

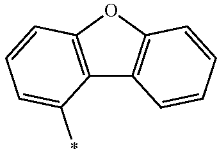

(2-50)

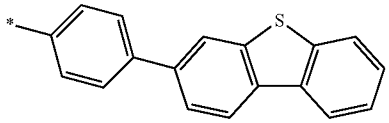

(2-51)

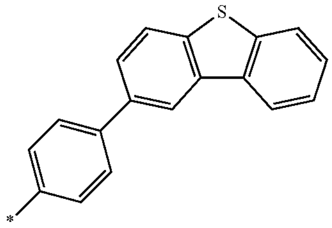

(2-52)

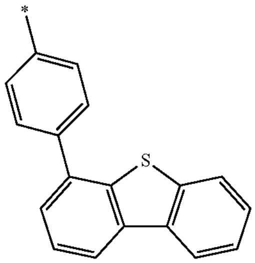

(2-53)

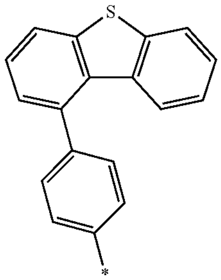

(2-54)

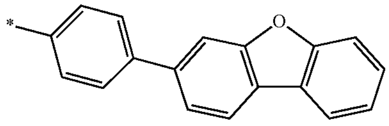

(2-55)

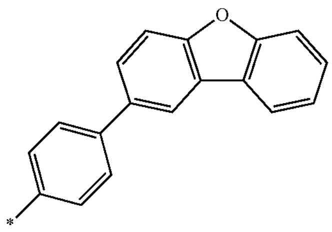

-continued (2-56)

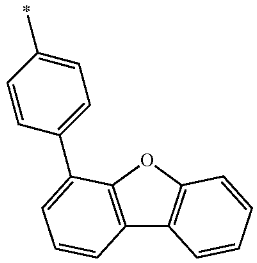

(2-57)

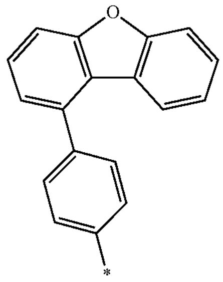

In Chemical Formulae 2-27 to 2-70, $R_{71}$ is a substituted or unsubstituted C1 to C20 alkyl group, a substituted or unsubstituted C1 to C20 alkoxy group, a substituted or unsubstituted C6 to C60 monovalent aromatic cyclic group, or a substituted or unsubstituted monovalent aromatic heterocyclic group, wherein, in Chemical Formula 2-34, 2-35, 2-36, and 2-37, $R_{K1}$ to $R_{K8}$ are each independently a substituted or unsubstituted C1 to C20 alkyl group, and

* is a linking point.

The polymer material comprises an alternating copolymer comprising the structural unit represented by Chemical Formula 1, and the alternating copolymer material may be represented by Chemical Formula 3.

$$E-(X—Y)_m-E$$ Chemical Formula 3

In Chemical Formula 3, each E is the same or different, and is independently a substituted or unsubstituted C6 to C60 monovalent aromatic cyclic group, or a substituted or unsubstituted C3 to C60 monovalent aromatic heterocyclic group, m is an integer of 2 or more, and each X and each Y is independently the same or different.

E may be a group represented by Chemical Formulae 3-1 to 3-14.

(3-1)

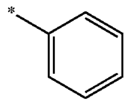

(3-2)

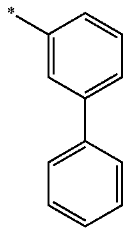

-continued (3-3)

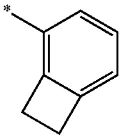

(3-4)

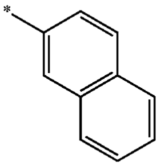

(3-5)

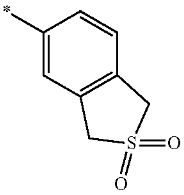

(3-6)

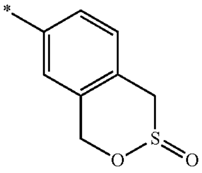

(3-7)

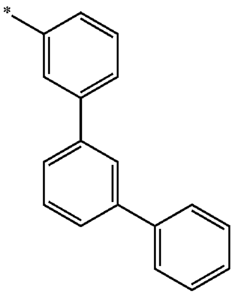

(3-8)

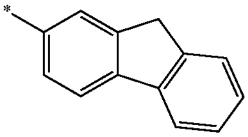

(3-9)

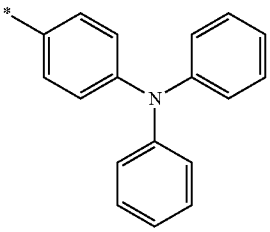

-continued (3-10)

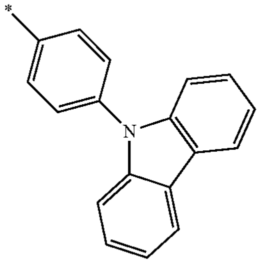

(3-11)

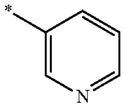

(3-12)

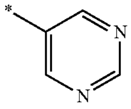

(3-13)

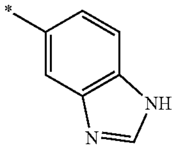

(3-14)

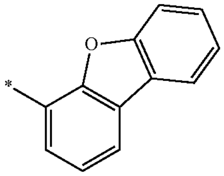

In Chemical Formulae 3-1 to 3-14,

* is a linking point.

A number average molecular weight ($M_n$) of the polymer material may be about 10,000 to about 1,000,000 grams per mole.

A HOMO (highest occupied molecular orbital) energy level of the polymer material may be about 5.5 electron Volts (eV) to about 6.0 eV.

On the other hand, a material for an electroluminescence device may include the polymer material.

A composition may include the polymer material; and at least one of a solvent or a dispersive medium.

A thin film may include the polymer material.

An electroluminescence device may include a pair of electrodes facing each other; and at least one organic layer including a polymer material of any one of claim 1 to claim 12 disposed between the pair of electrodes.

The at least one organic layer may be formed by coating a composition including the polymer material.

The electroluminescence device may further include a quantum dot layer including a plurality of inorganic nanoparticles disposed between the pair of electrodes.

The at least one organic layer may include a hole transport layer and the hole transport layer may include the polymer material.

A method for the manufacture of a polymer material may include:

providing at least one first monomer represented by Chemical Formula 4;

Chemical Formula 4

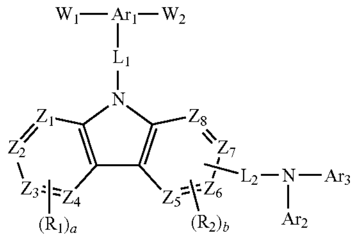

providing at least one second monomer represented by Chemical Formula 5; and $W_3$—Y—$W_4$    Chemical Formula 5 polymerizing the first monomer and the second monomer to obtain the polymer material, wherein, in Chemical Formulae 4 and 5, $Ar_1$ is a substituted or unsubstituted C6 to C60 trivalent aromatic cyclic group, or a substituted or unsubstituted C3 to C60 trivalent aromatic heterocyclic group, $Ar_2$ and $Ar_3$ are each independently a substituted or unsubstituted C6 to C60 monovalent aromatic cyclic group, or a substituted or unsubstituted C3 to C60 monovalent aromatic heterocyclic group, Y is a substituted or unsubstituted C6 to C60 divalent aromatic cyclic group, a substituted or unsubstituted C6 to C60 divalent alicyclic cyclic group, a substituted or unsubstituted C3 to C60 divalent aromatic heterocyclic group, or a substituted or unsubstituted C3 to C60 divalent alicyclic heterocyclic group, $L_1$ and $L_2$ are each independently a single bond, a substituted or unsubstituted C6 to C60 divalent aromatic cyclic group, or a substituted or unsubstituted C3 to C60 divalent aromatic heterocyclic group, each $R_1$ and $R_2$ are the same or different, and are each independently a substituted or unsubstituted C1 to C20 alkyl group, a substituted or unsubstituted C1 to C20 alkoxy group, a substituted or unsubstituted C6 to C60 monovalent aromatic cyclic group, or a substituted or unsubstituted C3 to C60 monovalent aromatic heterocyclic group, or $R_1$ and $R_2$ are combined with each other to form one ring that is a pentagonal ring, a hexagonal ring, or a fused ring, a is an integer ranging from 0 to 4, b is an integer ranging from 0 to 3, $Z_1$ to $Z_8$ are each independently a nitrogen atom or —CH═, and $W_1$ to $W_4$ are each independently a halogen atom or a group represented by Chemical Formula 5-1

Chemical Formula 5-1

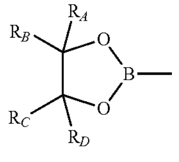

wherein, in Chemical Formula 5-1, $R_A$ to $R_D$ are each independently a C1 to C3 alkyl group.

The polymer material may improve luminous efficiency of an electroluminescence device and a material for an electroluminescence device, a composition, and a thin film including the same are provided.

In addition, the electroluminescence device including the polymer material may exhibit improved luminous efficiency by lowering energy barrier during hole injection.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
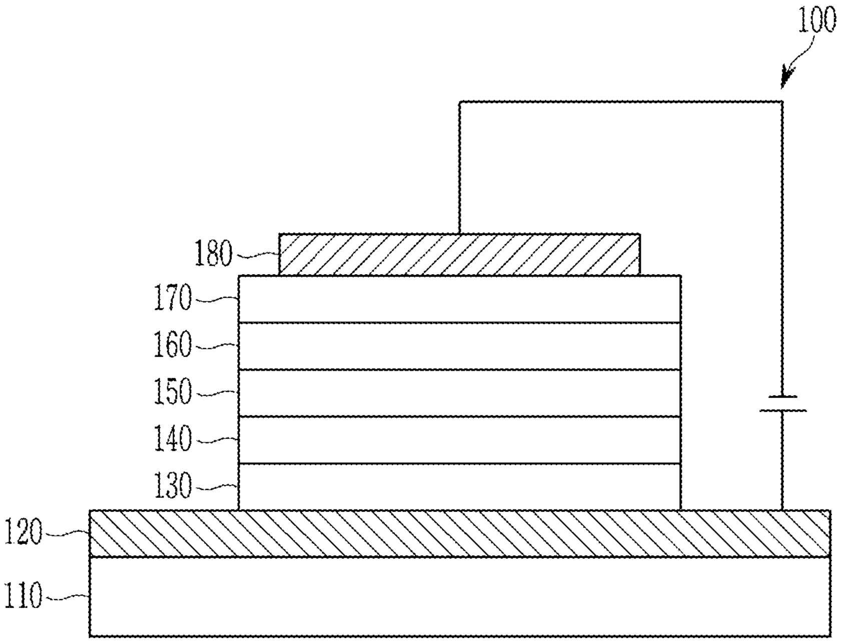
FIG. 1 is a schematic view of an electroluminescence device according to an embodiment.

Hereinafter, example embodiments will be described in detail so that a person skilled in the art would understand the same. The present disclosure may be embodied in different forms, and is not to be construed as limited to the example embodiments set forth herein, all without departing from the spirit or scope of the present disclosure.

As used herein, the singular forms "a," "an," and "the" are intended to include the plural forms, including "at least one," unless the content clearly indicates otherwise. "Combinations" is inclusive of blends, mixtures, alloys, reaction products, and the like. "Or" means "and/or" unless clearly indicated otherwise by context. Reference throughout the specification to "an embodiment" means that a particular element described in connection with the embodiment is included in at least one embodiment described herein, and may or may not be present in other embodiments. The described elements may be combined in any suitable manner in the various embodiments. "Combination thereof" is an open term that includes one or more of the named elements, optionally together with a like element not named.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The endpoints of all ranges directed to the same component or property are inclusive and independently combinable (e.g., ranges of "less than or equal to 25 wt %, or 5 wt % to 20 wt %," is inclusive of the endpoints and all intermediate values of the ranges of "5 wt % to 25 wt %," etc.). Disclosure of a narrower range or more specific group in addition to a broader range is not a disclaimer of the broader range or larger group. “About” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. In the drawings, the thickness of layers, films, panels, regions, etc., are exaggerated for clarity. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. Like reference numerals designate like elements throughout the specification and drawings.

Spatially relative terms, such as “beneath,” “under,” “below,” “lower,” “above,” “upper” and the like, may be used herein for ease of description to describe one element or feature’s relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as “below” or “beneath” other elements or features would then be oriented “above” the other elements or features. Thus, the exemplary term “below” can encompass both an orientation of above and below. The device may be otherwise oriented (rotated 90 degrees or at other orientations) and the spatially relative descriptors used herein interpreted accordingly. It will be understood that when an element such as a layer, film, region, or substrate is referred to as being “on” another element, it can be directly on the other element or intervening elements may also be present. In contrast, when an element is referred to as being “directly on” another element, there are no intervening elements present.

As used herein, for a particle diameter of a particle in the present disclosure, although it may be numerated by a measurement to show an average size of a group, the generally used method includes a mode diameter showing the maximum value of the distribution, a median diameter corresponding to the center value of integral distribution curve, a variety of average diameters (numeral average, length average, area average, mass average, volume average, etc.), or the like. Unless particularly mentioning otherwise, an average particle diameter refers to a numerical average diameter in the present disclosure, and it is obtained by measuring D50 (particle diameter at a position of distribution rate of 50%).

The “alkyl group” is a C1 to C24 linear or branched chain saturated aliphatic hydrocarbon, for example a C1 to C8 linear or branched alkyl group. The alkyl group includes both monovalent and divalent groups unless indicated otherwise. The alkyl group may be for example a methyl group, an ethyl group, a n-propyl group, an isopropyl group, a n-butyl group, an isobutyl group, a sec-butyl group, a tert-butyl group, a n-pentyl group, an isopentyl group, a tert-pentyl group, a neopentyl group, a 1,2-dimethylpropyl group, a n-hexyl group, an isohexyl group, a 1,3-dimethylbutyl group, a 1-isopropylpropyl group, a 1,2-dimethylbutyl group, a n-heptyl group, a 1,4-dimethylpentyl group, a 3-ethylpentyl group, a 2-methyl-1-isopropylpropyl group, a 1-ethyl-3-methylbutyl group, a n-octyl group, a 2-ethylhexyl group, a 3-methyl-1-isopropyl butyl group, a 2-methyl-1-isopropyl group, a 1-tert-butyl-2-methylpropyl group, a n-nonyl group, a 3,5,5-trimethylhexyl group, a n-decyl group, an isodecyl group, a n-undecyl group, a 1-methyldecyl group, a n-dodecyl group, a n-tridecyl group, a n-tetradecyl group, n-pentadecyl group, a n-hexadecyl group, n-heptadecyl group, a n-octadecyl group, a n-nonadecyl group, a n-eicosyl group, a n-heneicosyl group, a n-docosyl group, a n-tricosyl group, a n-tetracosyl group, or the like.

“Alkoxy” means an alkyl group that is linked via an oxygen (i.e., —O-alkyl). The alkoxy group may be a C1 to C24 linear or branched alkoxy group, for example a C1 to C8 linear or branched alkoxy group. The alkoxy group includes both monovalent and divalent groups unless indicated otherwise. The alkoxy group may be for example a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, or the like.

The “alkylthio group” is an alkyl group that is linked via a sulfur (i.e., —S-alkyl). The alkylthio group includes both monovalent and divalent groups unless indicated otherwise.

The “aromatic cyclic group” (also referred to as an “aryl group”) is a cyclic hydrocarbon containing at least one aromatic ring, and includes monovalent, divalent, and trivalent groups unless indicated otherwise. The aromatic cyclic group may be construed as including two or more aromatic rings, and any additional rings may be fused, pendant, spirocyclic, or a combination thereof. The fused ring may be a condensed ring. Pendant rings include biphenyl, triphenyl, or the like. In addition, the aromatic cyclic group may be substituted with one or more substituents. The aromatic cyclic group is not particularly limited, but may be for example benzene, pentalene, indene, naphthalene, anthracene, azulene, heptalene, acenaphthylene, phenalene, fluorene, anthraquinone, phenanthrene, biphenylene, triphenylene, pyrene, chrysene, pycene, perylene, pentaphene, pentacene, tetraphene, hexaphene, hexacene, rubicene, trinaphthylene, heptaphene, phenanthrene, or the like.

The “arylalkylene group” is an aryl group linked via a divalent alkyl moiety. The “arylalkenylene group” is an aryl group linked via a divalent alkenyl moiety. The "arylalkynylene group" is an aryl group linked via a divalent alkynyl moiety.

The "aryloxy group" is an aryl group that is linked via an oxygen (i.e., —O-aryl). The "arylalkoxy group" is an aryl group that is linked via a divalent alkoxy group (i.e., —O-alkyl-aryl).

The "arylthio group" is an aryl group that is linked via a sulfur (i.e., —S-aryl). The "arylalkylthio group" is an aryl group that is linked via a divalent alkylthio group (i.e., —S-alkyl-aryl).

The "aromatic heterocyclic group" (also referred to as a "heteroaryl group") is a cyclic group including one or more aromatic rings, in which at least one ring member is a heteroatom (for example, a nitrogen atom (N), an oxygen atom (O), a phosphorus atom (P), a sulfur atom (S), or a selenium atom (Se)) and the remaining ring atoms are carbon atoms (C). The aromatic heterocyclic group can be monovalent, divalent, or trivalent unless indicated otherwise. In addition, when the aromatic heterocyclic group includes two or more heteroaromatic rings, at least two heteroaromatic rings may be pendant, spiro, or fused with each other to form a ring. The fused ring may be a condensed ring. The aromatic heterocyclic group may be substituted with one or more substituents. The aromatic heterocyclic group is not particularly limited, but may be for example pyrazoline, imidazoline, oxazoline, thiazoline, triazoline, tetrazoline, oxadiazoline, pyridine, pyridazine, pyrimidine, triazine, carbazoline, azocarbazoline, indoline, quinolinine, isoquinoline, benzoimidazoline, imidazopyridine, imidazopyrimidine, furan, benzofuran, dibenzofuran, azadibenzofuran, thiophene, benzothiophene, dibenzothiophene, azadibenzothiophene, or the like.

The "alicyclic cyclic group" is a cyclic hydrocarbon having properties of an aliphatic group. The alicyclic cyclic group may be a cycloalkyl group, a cycloalkenyl group, or a cycloalkynyl group, and includes monovalent, divalent, and trivalent groups unless indicated otherwise. "Cycloalkyl" means a group that comprises one or more saturated rings in which all ring members are carbon. "Cycloalkenyl" and "cycloalkynyl" are a partially saturated variants having a double or triple bond, respectively.

The "alicyclic heterocyclic group" (or "heterocyclic group") is an alicyclic cyclic group comprising at least one non-aromatic ring that contains a heteroatom ring member. The alicyclic heterocyclic group includes monovalent, divalent, and trivalent groups unless indicated otherwise Unless indicated otherwise, the "amino group" has the general formula $—N(R)_2$, wherein each R is independently hydrogen, a substituted or unsubstituted C1 to C6 alkyl, or a substituted or unsubstituted C6 to C12 aryl.

Unless indicated otherwise, the "silyl group" has the general formula $—Si(R)_3$, wherein each R is independently hydrogen, a substituted or unsubstituted C1 to C6 alkyl, or a substituted or unsubstituted C6 to C12 aryl.

Unless indicated otherwise, the "acyl group" has the general formula —C(═O)R, wherein R is hydrogen, a substituted or unsubstituted C1 to C6 alkyl, or a substituted or unsubstituted C6 to C12 aryl.

Unless indicated otherwise, the "acyloxy group" has the general formula —OC(═O)R, wherein R is hydrogen, a substituted or unsubstituted C1 to C6 alkyl, or a substituted or unsubstituted C6 to C12 aryl.

Unless indicated otherwise, the "imine group" has the general formula —(R)C═NR or $(R)_2C$═N—, wherein each R is independently hydrogen, a substituted or unsubstituted C1 to C6 alkyl, or a substituted or unsubstituted C6 to C12 aryl.

Unless indicated otherwise, the "acid imide group" has the general formula —O(═O)NRC(═O)R or —N((C═O)$R)_2$, wherein each R is independently hydrogen, a substituted or unsubstituted C1 to C6 alkyl, or a substituted or unsubstituted C6 to C12 aryl.

Unless indicated otherwise, the "amide group" has the general formula —O(═O)$N(R)_2$ or —NC(═O)R, wherein each R is independently hydrogen, a substituted or unsubstituted C1 to C6 alkyl, or a substituted or unsubstituted C6 to C12 aryl.

Unless indicated otherwise, the "carboxyl group" has the general formula —C(═O)OR, wherein R is hydrogen, a substituted or unsubstituted C1 to C6 alkyl, or a substituted or unsubstituted C6 to C12 aryl. When the carboxyl group is a carboxyl salt, R is a metal such a lithium, sodium, or potassium and the bond O—R is an ionic bond.

As used herein, when a definition is not otherwise provided, "substituted" means a compound or radical substituted with at least one (e.g., 1, 2, 3, 4, 5, 6 or more) substituents that is alkyl group, an alkoxy group, an alkylthio group, an alkenyl group, an alkynyl group, alicyclic cyclic group, an aryl group, an aryloxy group, an arylthio group, an arylalkylene group, an arylalkoxy group, an arylalkylthio group, an arylalkenylene group, an arylalkynylene group, an amino group, a silyl group, a halogen atom, an acyl group, an acyloxy group, an imine group, an amide group, an acid imide group, an alicyclic heterocyclic group, a aromatic heterocyclic group, a carboxyl group, a cyano group (—CN), a nitro group ($—NO_2$), an alkyl sulfonyl ($—S(═O)_2$-alkyl), or an arylsulfonyl ($—S(═O)_2$-aryl). The halogen atom may be for example a fluorine atom, a chlorine atom, a bromine atom, or an iodine atom. The substituents can be monovalent or divalent, and Two or more substituents can be connected with each other to form a ring that is a pentagonal ring, a hexagonal ring, or a fused ring.

As used herein, a "pentagol ring" is a five-membered ring and may include one or more heteroatoms, and a "hexagonal ring" is a six-membered ring and may include one or more heteroatoms.

As used herein, when a definition is not otherwise provided, the term "hetero" refers to a compound or group including one to three heteroatoms that are N, O, S, Se, P, and/or Si. As used herein, "Group" refers to a group of Periodic Table of the Elements.

As used herein, "Group I" refers to Group IA and Group IB, and examples include Li, Na, K, Rb, and Cs, but are not limited thereto.

As used herein, "Group II" refers to Group IIA and Group IIB, and examples of Group II metal can be Cd, Zn, Hg, and Mg, but are not limited thereto.

As used herein, examples of "Group II metal that does not include Cd" refers to a Group II metal except Cd, for example Zn, Hg, Mg, or the like.

As used herein, "Group III" refers to Group IIIA and Group IIIB, and examples of Group III metal can be Al, In, Ga, and Tl, but are not limited thereto.

As used herein, "Group IV" refers to Group IVA and Group IVB, and examples of a Group IV metal can be Si, Ge, and Sn, but are not limited thereto. As used herein, the term "metal" can include a semi-metal such as Si.

As used herein, "Group V" refers to Group VA, and examples include nitrogen, phosphorus, arsenic, antimony, and bismuth, but are not limited thereto.

As used herein, "Group VI" refers to Group VIA, and examples include sulfur, selenium, and tellurium, but are not limited thereto.

Recently, various methods for improving the luminous efficiency of a quantum dot light emitting device have been studied.

Among them, as a method for improving the luminous efficiency of the quantum dot light emitting device, a method of controlling the carrier balance of the quantum dot light emitting device has been studied.

In the case of an organic electroluminescence device, an organic material is used as a hole injection material, an electron injection material, and a light emitting material, respectively, and an energy difference between the energy levels of the hole injection material, the electron injection material and the light emitting material is small. Therefore, an energy barrier at the time of charge injection into the light emitting layer is small.

On the contrary, in the case of the quantum dot light emitting device, since the highest occupied molecular orbital level (hereinafter referred to as HOMO level) of the quantum dot is generally large and thus an energy barrier during hole injection from a hole transport layer that is an organic layer is large and luminous efficiency is lower than the organic electroluminescence device.

The embodiments provide a polymer material capable of improving luminous efficiency of an electroluminescence device, for example, a quantum dot light emitting device through the above-described HOMO level adjustment, and a material, a composition, a thin film, and a light emitting device. Hereinafter, a polymer material, and a material for an electroluminescence device, a composition thereof, a thin film, and an electroluminescence device including the same according to one or more embodiments will be described.

Polymer Material

The polymer material according to an embodiment includes a structural unit represented by Chemical Formula 1.

$-\!\!\left[X-Y\right]\!\!-$ Chemical Formula 1

In Chemical Formula 1, each X is the same or different, and is represented by Chemical Formula 2, and each Y is the same or different, and is a substituted or unsubstituted C6 to C60 divalent aromatic cyclic group, a substituted or unsubstituted C6 to C60 divalent alicyclic cyclic group, a substituted or unsubstituted C3 to C60 divalent aromatic heterocyclic group, or a substituted or unsubstituted C3 to C60 divalent alicyclic heterocyclic group.

Chemical Formula 2

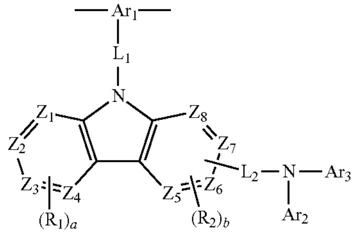

In Chemical Formula 2, $Ar_1$ is a substituted or unsubstituted C6 to C60 trivalent aromatic cyclic group, or a substituted or unsubstituted C3 to C60 trivalent aromatic heterocyclic group, $Ar_2$ and $Ar_3$ are each independently a substituted or unsubstituted C6 to C60 monovalent aromatic cyclic group, or a substituted or unsubstituted C3 to C60 monovalent aromatic heterocyclic group, $L_1$ and $L_2$ are each independently a single bond, a substituted or unsubstituted C6 to C60 divalent aromatic cyclic group, or a substituted or unsubstituted C3 to C60 divalent aromatic heterocyclic group, each $R_1$ and $R_2$ are the same or different, and are each independently a substituted or unsubstituted C1 to C20 alkyl group, a substituted or unsubstituted C1 to C20 alkoxy group, a substituted or unsubstituted C6 to C60 monovalent aromatic cyclic group, or a substituted or unsubstituted C3 to C60 monovalent aromatic heterocyclic group, or $R_1$ and $R_2$ are combined with each other to form one ring that is a pentagonal ring, a hexagonal ring, or a fused ring, a is an integer ranging from 0 to 4, b is an integer ranging from 0 to 3, and $Z_1$ to $Z_8$ are each independently a nitrogen atom or —CH=.

The polymer material according to an embodiment may include at least one structural unit represented by Chemical Formula 1 and may further include at least one other structural unit.

Herein, the polymer material according to an embodiment may include an alternating copolymer including the structural unit represented by Chemical Formula 1. The polymer material according to an embodiment may include X and Y of Chemical Formula 1 which are bonded alternately and thus reproducibility during preparation is improved.

Herein, the polymer material according to an embodiment may include a segment of an alternating copolymer including X and Y which are bonded alternately, and thus reproducibility during preparation is improved. In other words, a copolymer having first repeat units and second repeat units that each independently has the same or different X and Y of Chemical Formula 1.

In addition, in the polymer material according to an embodiment, since localized electrons of X and Y are not present, a thin film formed using the polymer material may exhibit homogeneous characteristics.

X of Chemical Formula 1

The polymer material according to an embodiment may include one kind of X or at least two X's as a structural unit. In other words, the structural units of the polymer material can each have the same or different X group.

In the polymer material according to an embodiment, X may include a nitrogen-containing aromatic heterocyclic group (e.g., carbazole backbone) substituted with an amino group. Accordingly, when the polymer material according to an embodiment includes the nitrogen-containing aromatic heterocyclic group, hole transport capability may be improved.

In addition, the polymer material according to an embodiment may include an aromatic cyclic group ($Ar_1$) in the backbone of X and a nitrogen-containing aromatic heterocyclic group bonded with a —$N(Ar_2)(Ar_3)$ group at the side chain. Accordingly, the polymer material according to an embodiment may have an increased HOMO level, and as a result, an electroluminescence device including the polymer material may exhibit improved luminous efficiency and a lowered driving voltage.

In Chemical Formula 2, $Ar_1$ may include at least one of a substituted or unsubstituted C6 to C60 trivalent aromatic cyclic group, and a substituted or unsubstituted C3 to C60 trivalent aromatic heterocyclic group.

In Chemical Formulae 1 and 2, the aromatic cyclic is not particularly limited, but may be for example benzene, pentalene, indene, naphthalene, anthracene, azulene, heptalene, acenaphthylene, phenalene, fluorene, anthraquinone, phenanthrene, biphenyl, triphenylene, pyrene, chrysene, pycene, perylene, pentaphene, pentacene, tetraphene, hexaphene, hexacene, rubicene, trinaphthylene, heptaphene, phenanthrene, or the like. In addition, the aromatic cyclic group may be substituted with one or more substituents.

In chemical Formulae 1 and 2, the aromatic heterocyclic group is not particularly limited, but may be for example pyrazoline, imidazoline, oxazoline, thiazoline, triazoline, tetrazoline, oxadiazoline, pyridine, pyridazine, pyrimidine, triazine, carbazoline, azocarbazoline, indoline, quinolinine, isoquinoline, benzoimidazoline, imidazopyridine, imidazopyrimidine, furan, benzofuran, dibenzofuran, azadibenzofuran, thiophene, benzothiophene, dibenzothiophene, azadibenzothiophene, or the like. In addition, the aromatic heterocyclic group may be substituted with one or more substituents.

In $Ar_1$, the trivalent aromatic cyclic group may be a group obtained by removing any three hydrogen atoms of the hydrogen atoms of the aromatic cyclic group.

In addition, the trivalent aromatic heterocyclic group may be for example a group obtained by removing any three hydrogen atoms of the aromatic heterocyclic group.

Among them, in terms of adjustment of HOMO levels, $Ar_1$ may be a group of Chemical Formulae 2-15 to 2-26.

(2-15)

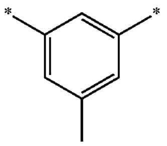

(2-16)

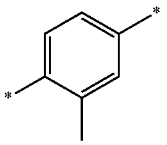

(2-17)

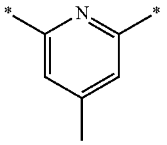

(2-18)

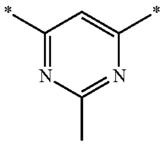

(2-19)

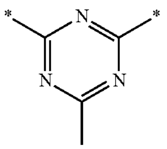

(2-20)

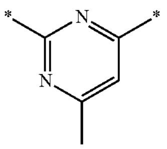

-continued (2-21)

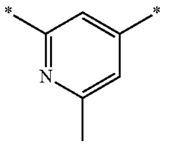

(2-22)

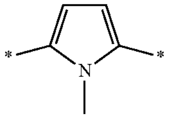

(2-23)

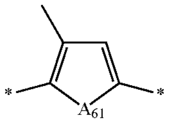

(2-24)

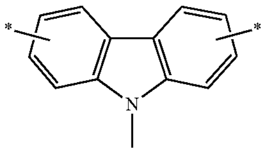

(2-25)

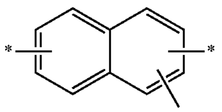

(2-26)

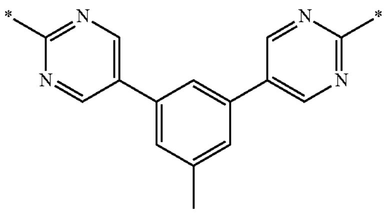

In Chemical Formulae 2-15 to 2-26

$A_{61}$ is —O—, —S—, —Se—, —$NR_{61}$— (wherein $R_{61}$ is hydrogen, deuterium, a substituted or unsubstituted C1 to C20 alkyl group, a substituted or unsubstituted C6 to C60 aryl group, or a substituted or unsubstituted C3 to C60 heteroaryl group), or —$CR_{62}R_{63}$— (wherein $R_{62}$ and $R_{63}$ are each independently hydrogen, deuterium, a substituted or unsubstituted C1 to C20 alkyl group, a substituted or unsubstituted C6 to C60 aryl group, or a substituted or unsubstituted C3 to C60 heteroaryl group), and

* is a linking point.

When the trivalent aromatic cyclic group or the trivalent aromatic heterocyclic group are substituted, the substituent is not particularly limited but may be for example a halogen atom, an alkyl group, an alkoxy group, an aromatic cyclic group, a aromatic heterocyclic group, and the like, or at least two of the groups.

The halogen atom may be for example a fluorine atom, a chlorine atom, a bromine atom, or an iodine atom.

The alkyl group may be for example a methyl group, an ethyl group, a n-propyl group, an isopropyl group, a n-butyl group, an isobutyl group, a sec-butyl group, a tert-butyl group, a n-pentyl group, an isopentyl group, a tert-pentyl group, a neopentyl group, a 1,2-dimethylpropyl group, a n-hexyl group, an isohexyl group, a 1,3-dimethylbutyl group, a 1-isopropylpropyl group, a 1,2-dimethylbutyl group, a n-heptyl group, a 1,4-dimethylpentyl group, a 3-ethylpentyl group, a 2-methyl-1-isopropylpropyl group, a 1-ethyl-3-methyl butyl group, a n-octyl group, a 2-ethylhexyl group, a 3-methyl-1-isopropylbutyl group, a 2-methyl-1-isopropyl group, a 1-tert-butyl-2-methyl propyl group, a n-nonyl group, a 3,5,5-trimethylhexyl group, a n-decyl group, an isodecyl group, a n-undecyl group, a 1-methyldecyl group, a n-dodecyl group, a n-tridecyl group, a n-tetradecyl group, n-pentadecyl group, a n-hexadecyl group, n-heptadecyl group, a n-octadecyl group, a n-nonadecyl group, a n-eicosyl group, a n-heneicosyl group, a n-docosyl group, a n-tricosyl group, a n-tetracosyl group, or the like.

The alkyl group may be a C1 to C24 linear or branched alkyl group, for example a C1 to C8 linear or branched alkyl group.

The alkoxy group may be for example a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, or the like.

The alkoxy group may be a C1 to C24 linear or branched alkoxy group, for example a C1 to C8 linear or branched alkoxy group.

Examples of the substituted aromatic heterocyclic group (or the substituted aromatic cyclic group) that may be introduced as substituents of the trivalent aromatic cyclic group (or the trivalent aromatic heterocyclic group) may be a group obtained by removing any one hydrogen atom from the aromatic heterocyclic group (or aromatic cyclic group) as defined for $Ar_1$. In Chemical Formula 2, $Ar_2$ and $Ar_3$ may independently be a substituted or unsubstituted C6 to C60 monovalent aromatic cyclic group, or a substituted or unsubstituted C3 to C60 monovalent aromatic heterocyclic group.

Herein, the substituents of the substituted monovalent aromatic cyclic group and the substituted monovalent aromatic heterocyclic group may be one of those as described above in $Ar_1$ of Chemical Formula 2, except that the trivalent aromatic cyclic group and the trivalent aromatic heterocyclic group described for Chemical Formula 2 are changed into monovalent groups and substituents substituting $Ar_2$ and $Ar_3$ may be the same as in $Ar_1$.

In terms of improvement of the HOMO level, hole transport capability, hole injection capability of the polymer material according to an embodiment, the monovalent aromatic cyclic group may be for example a phenyl group, a biphenyl group, a fluorenyl group, a naphthyl group, an anthryl group, a phenanthryl group, a naphthacenyl group, a pyrenyl group, a terphenyl group, a thryl group, a t-butylphenyl group, or a (phenylpropyl)phenyl group, for example a phenyl group, a biphenyl group, a fluorenyl group, a naphthyl group, an anthryl group, a terphenyl group, a thryl group, or the like.

In terms of improvement of the HOMO level, the hole transport capability, and the hole injection capability of the polymer material according to an embodiment, examples of the monovalent aromatic heterocyclic group may be a pyridyl group, a bipyridyl group, a pyrrolyl group, pyradinyl group, a pyridinyl group, a pyrimidyl group, an indolyl group, a puryl group, a benzofuranyl group, a dibenzofuranyl group, a quinolyl group, a quinoxanyl group, a carbazolyl group, a phenanthridinyl group, an acridinyl group, a phenazinyl group, a phenothiazinyl group, a phenoxazinyl group, an oxazolyl group, an oxadiazolyl group, a furazanyl group, a thienyl group, a thiophenyl group, an isothiophenyl group, or a dibenzothiophenyl group, for example a pyridyl group, a pyrrolyl group, a carbazolyl group, a dibenzofuranyl group, a dibenzothiophenyl group, a bipyridyl group, or the like.

In addition, in terms of improvement of the HOMO level, the hole transport capability, and the hole injection capability of the polymer material according to an embodiment, the substituent of the monovalent aromatic cyclic group or the monovalent aromatic heterocyclic group when it is substituted may be a C1 to C8 alkyl group, an alkoxy group, an alkylthio group, an aryl group, an aryloxy group, an arylthio group, an arylalkylene group, an arylalkoxy group, an arylalkylthio group, an arylalkenylene group, an arylalkynylene group, an amino group, an amino group substituted with a substituent, a silyl group, a substituted silyl group, a halogen atom, an acyl group, an acyloxy group, an imine moiety, an amide group, an acid imide group, a monovalent heterocyclic group, a carboxyl group, a substituted carboxyl group, a cyano group, a nitro group, or the like, for example a C1 to C3 alkyl group.

In an embodiment, $Ar_2$ and $Ar_3$ each may independently be a group represented by Chemical Formulae 2-27 to 2-70.

(2-27)

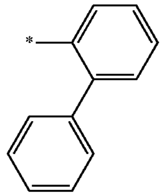

(2-28)

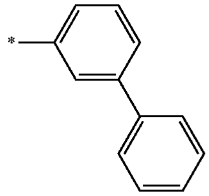

(2-29)

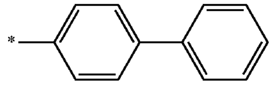

(2-30)

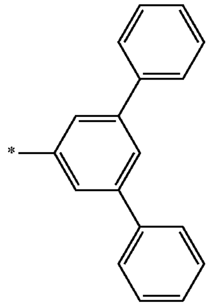

(2-31)

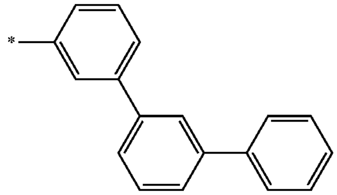

-continued
(2-32)
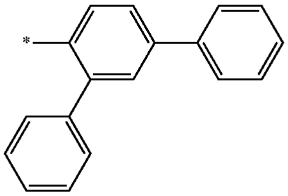
(2-33)
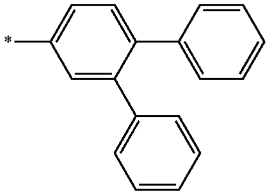
(2-34)
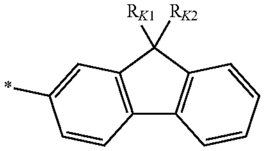
(2-35)
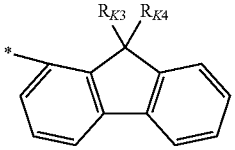
(2-36)
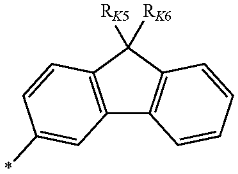
(2-37)
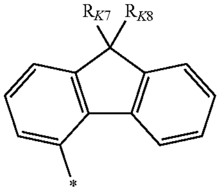
(2-38)
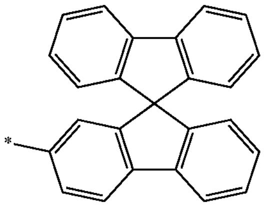
(2-39)
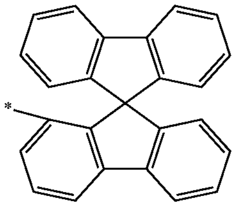
-continued
(2-40)
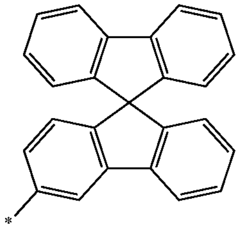
(2-41)
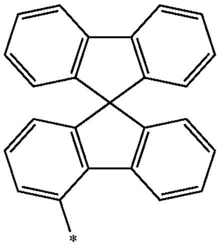
(2-42)
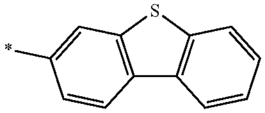
(2-43)
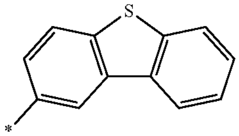
(2-44)
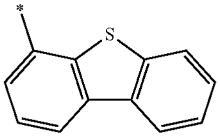
(2-45)
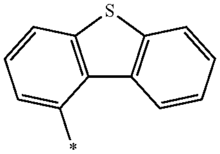
(2-46)
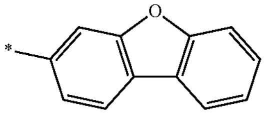
(2-47)
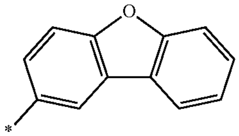
(2-48)
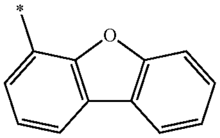

-continued (2-49)

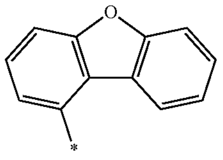

(2-50)

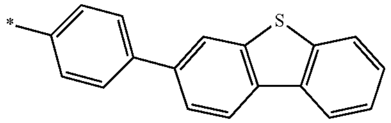

(2-51)

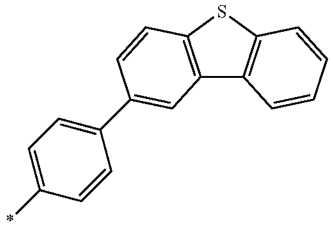

(2-52)

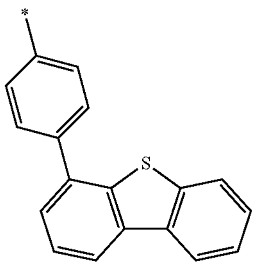

(2-53)

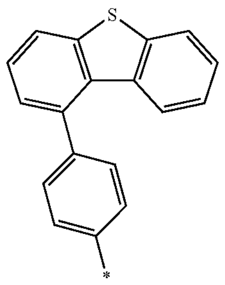

(2-54)

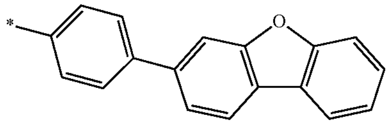

(2-55)

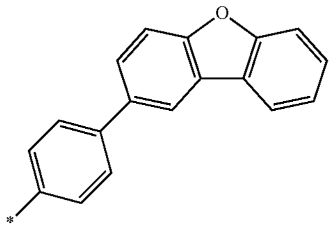

-continued (2-56)

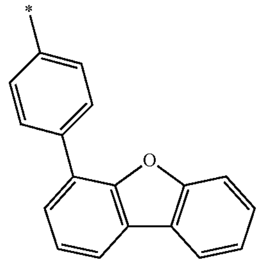

(2-57)

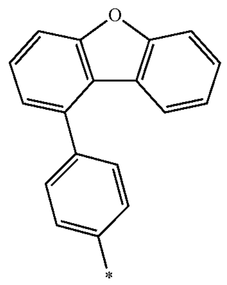

In Chemical Formulae 2-27 to 2-70, $R_{71}$ is a substituted or unsubstituted C1 to C20 alkyl group, a substituted or unsubstituted C1 to C20 alkoxy group, a substituted or unsubstituted C6 to C60 monovalent aromatic cyclic group, or a substituted or unsubstituted monovalent aromatic heterocyclic group, wherein, in Chemical Formula 2-34, 2-35, 2-36, and 2-37, $R_{K1}$, to $R_{K8}$ are each independently a substituted or unsubstituted alkyl group, and

* is a linking point.

In Chemical Formula 2, $L_1$ and $L_2$ may each independently be a single bond, a substituted or unsubstituted C6 to C60 divalent aromatic cyclic group, or a substituted or unsubstituted C3 to C60 divalent aromatic heterocyclic group.

Herein, for $L_1$ and $L_2$, the divalent aromatic cyclic group and the divalent aromatic heterocyclic group may be the same as in $Ar_1$ of Chemical Formula 2, except that the trivalent aromatic cyclic group and the trivalent aromatic heterocyclic group are changed into divalent groups and substituents substituting $Ar_2$ and $Ar_3$ may be the same as the examples provided above for the substituents in $Ar_1$.

In terms of improvement of the HOMO level, hole transport capability, hole injection capability of the polymer material according to an embodiment, the divalent aromatic cyclic group may be for example a phenylene group, a biphenylene group, a fluorenylene group, a naphthylene group, an anthrylene group, a phenanthrylene group, a naphthacenylene group, a pyrenylene group, a terphenylene group, a tolylene group, a t-butylphenylene group, or a (phenylpropyl)phenylene group, for example, a phenylene group, a biphenylene group, a fluorenylene group, a naphthylene group, an anthrylene group, a terphenylene group, or a tolylene group.

In addition, in terms of improvement of the HOMO level, hole transport capability, hole injection capability of the polymer material according to an embodiment, examples of the divalent aromatic heterocyclic group may be a pyridylene group, a bipyridylene group, a pyrrolylene group, a pyradinylene group, a pyridinylene group, a pyrimidylene group, an indolylene group, a furylene group, a benzofuranylene group, a dibenzofuranylene group, a quinolylene group, a quinoxalinylene group, a carbazolylene group, a phenanthridinylene group, an acridinylene group, a phenazinylene group, a phenothiazinylene group, a phenoxazinylene group, an oxazolylene group, an oxadiazolylene group, a furazanylene group, a thienylene group, a thiazolylene group, a thiophenylene group, an isothiophenylene group, an isothiazolylene group, or a dibenzothiophenylene group, for example a pyridylene group, a pyrrolylene group, a carbazolylene group, a dibenzofuranylene group, a dibenzothiophenylene group, a bipyridylene group, or the like.

In addition, in terms of improvement of the HOMO level, hole transport capability, hole injection capability of the polymer material according to an embodiment, the substituent of the divalent aromatic cyclic group or the divalent aromatic heterocyclic group when it is substituted may be a C1 to C50 alkyl group, an alkoxy group, an alkylthio group, an aryl group, an aryloxy group, an arylthio group, an arylalkylene group, an arylalkoxy group, an arylalkylthio group, an arylalkenylene group, an arylalkynylene group, an amino group, an amino group substituted with a substituent, a silyl group, a substituted silyl group, a halogen atom, an acyl group, an acyloxy group, an imine moiety, an amide group, an acid imide group, a monovalent heterocyclic group, a carboxyl group, a substituted carboxyl group, a cyano group, a nitro group, or the like, for example a C1 to C50 alkyl group.

$L_1$ and $L_2$ may each independently be a single bond, a phenylene group, a biphenylene group, a fluorenylene group, a naphthylene group, an anthrylene group, a phenanthrylene group, a naphthacenylene group, a pyrenylene group, a terphenylene group, a tolylene group, a t-butylphenylene group, a (phenylpropyl)phenylene group, for example a single bond, a phenylene group, a biphenylene group, a terphenylene group, or a fluorenylene group.

In Chemical Formula 2, each $R_1$ and $R_2$ may independently be a substituted or unsubstituted C1 to C20 alkyl group, a substituted or unsubstituted C1 to C20 alkoxy group, a substituted or unsubstituted C6 to C60 monovalent aromatic cyclic group, or a substituted or unsubstituted C3 to C60 monovalent aromatic heterocyclic group.

$R_1$ and $R_2$ may be combined with each other to form one ring that is a pentagonal ring, a hexagonal ring, or a fused ring.

$R_1$ and $R_2$ may be the same or different.

In addition, when a satisfies 2 to 4, each $R_1$ may be the same or different.

In addition, when b satisfies 2 or 3, each $R_2$ may be the same or different.

The C1 to C20 alkyl group is not particularly limited, but may be a methyl group, an ethyl group, a n-propyl group, an isopropyl group, a n-butyl group, an isobutyl group, a sec-butyl group, a tert-butyl group, a n-pentyl group, an isopentyl group, a tert-pentyl group, a neopentyl group, a 1,2-dimethyl propyl group, a n-hexyl group, an isohexyl group, a 1,3-dimethylbutyl group, a 1-isopropylpropyl group, a 1,2-dimethylbutyl group, a n-heptyl group, a 1,4-dimethylpentyl group, a 3-ethylpentyl group, a 2-methyl-1-isopropyl propyl group, a 1-ethyl-3-methylbutyl group, a n-octyl group, a 2-ethylhexyl group, a 3-methyl-1-isopropylbutyl group, a 2-methyl-1-isopropyl group, a 1-tert-butyl-2-methylpropyl group, a n-nonyl group, a 3,5,5-trimethyl hexyl group, a n-decyl group, an isodecyl group, a n-undecyl group, a 1-methyldecyl group, a n-dodecyl group, a n-tridecyl group, a n-tetradecyl group, n-pentadecyl group, a n-hexadecyl group, n-heptadecyl group, a n-octadecyl group, a n-nonadecyl group, a n-eicosyl group, or the like.

The C1 to C20 alkyl group may be a C1 to C20 linear or branched alkyl group, for example a C1 to C8 linear or branched alkyl group.

The C1 to C20 alkoxy group is not particularly limited, but may be a methoxy group, an ethoxy group, a n-propoxy group, an isopropoxy group, a n-butoxy group, an isobutoxy group, a sec-butoxy group, a tert-butoxy group, a n-pentoxy group, an isopentoxy group, a tert-pentoxy group, a neopentoxy group, a 1,2-dimethylpropoxy group, a n-hexyloxy group, an isohexyloxy group, a 1,3-dimethylbutoxy group, a 1-isopropylpropoxy group, a 1,2-dimethylbutoxy group, a n-heptyloxy group, a 1,4-dimethylpentyloxy group, a 3-ethylpentyloxy group, a 2-methyl-1-isopropylpropoxy group, a 1-ethyl-3-methylbutoxy group, a n-octyloxy group, a 2-ethylhexyloxy group, a 3-methyl-1-isopropylbutoxy group, a 2-methyl-1-isopropoxy group, a 1-tert-butyl-2-methylpropoxy group, a n-nonyloxy group, a 3,5,5-trimethylhexyloxy group, a n-decyloxy group, an isodecyloxy group, a n-undecyloxy group, a 1-methyldecyloxy group, a n-dodecyloxy group, a n-tridecyloxy group, a n-tetradecyloxy group, a n-pentadecyloxy group, a n-hexadecyloxy group, a n-heptadecyloxy group, a n-octadecyloxy group, a n-eicosyloxy group, or the like.

The C1 to C20 alkoxy group may be a C1 to C20 linear or branched alkoxy group, for example a C1 to C8 linear or branched alkoxy group.

Herein, the C6 to C60 aromatic cyclic group and the C3 to C60 aromatic heterocyclic group may be the same as the aromatic cyclic group and the aromatic heterocyclic group in $Ar_1$ of Chemical Formula 2, except that the trivalent aromatic cyclic group and the trivalent aromatic heterocyclic group are monovalent groups, and the substituents may be the same as in $Ar_1$.

For example, $R_1$ and $R_2$ each may be a phenyl group or a fluorenyl group.

Integer a refers to the number of $R_1$ groups bonded with the nitrogen-containing aromatic heterocyclic group positioned at the side chain of Chemical Formula 2 and may be an integer ranging from 0 to 4, for example an integer of 0 to 2, 0 or 1, or 0.

Integer b refers to the number of $R_2$ groups bonded with the nitrogen-containing aromatic heterocyclic group positioned at the side chain of Chemical Formula 2, and may be an integer ranging from 0 to 3, for example an integer of 0 to 2, 0 or 1, or 0.

In Chemical Formula 2, $Z_1$ to $Z_8$ of the nitrogen-containing aromatic heterocyclic group may each independently be a nitrogen atom or —CH=.

The nitrogen-containing aromatic heterocyclic group may have a structure of Chemical Formula 2-A.

Chemical Formula 2-A

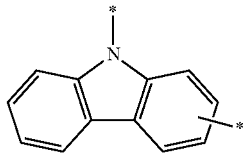

In Chemical Formula 2-A, * is a linking point.

In an embodiment, in terms of improvement of the HOMO level, the hole transport capability, the hole injection capability of the polymer material and simultaneously decreasing of a driving voltage, X may be one of the groups represented by Chemical Formulae 2-1 to 2-6. Herein, the polymer material may have a plurality of structural units Chemical Formula 1, wherein each X included in the structural unit represented by Chemical Formula 1 may be the same or different.

(2-1)

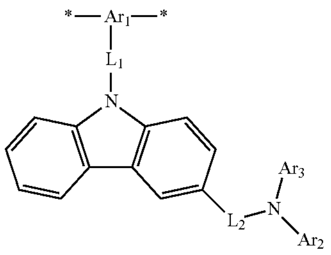

(2-2)

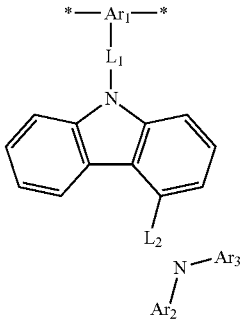

(2-3)

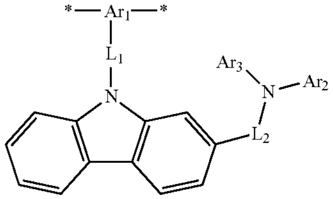

(2-4)

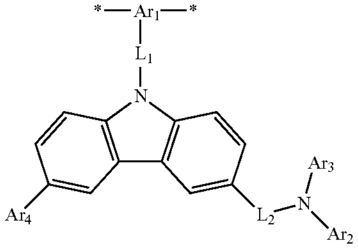

(2-5)

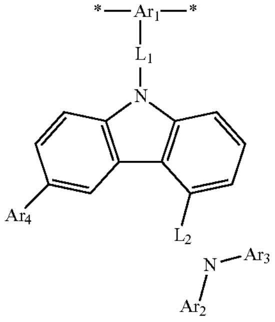

-continued (2-6)

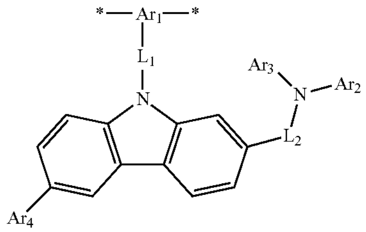

In Chemical Formulae 2-1 to 2-6, $Ar_1$, $Ar_2$, $Ar_3$, $L_1$, and $L_2$ are the same as in Chemical Formula 2, respectively, $Ar_4$ is a substituted or unsubstituted C6 to C60 monovalent aromatic cyclic group, and a substituted or unsubstituted C3 to C60 monovalent aromatic heterocyclic group, and

* is a linking point.

Examples of the X may be as follows.

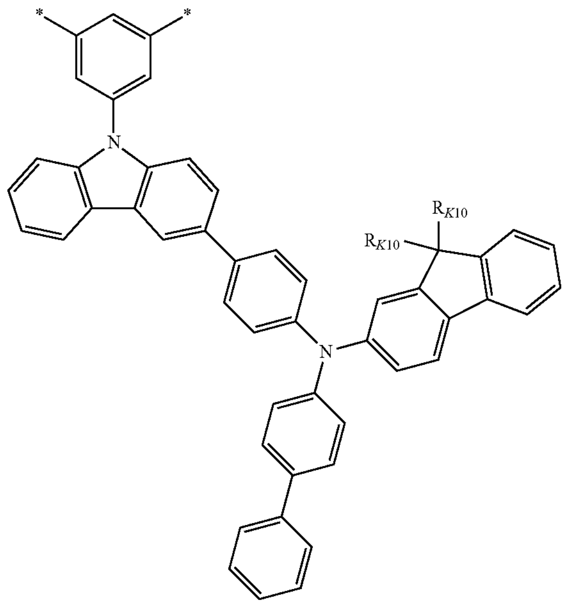

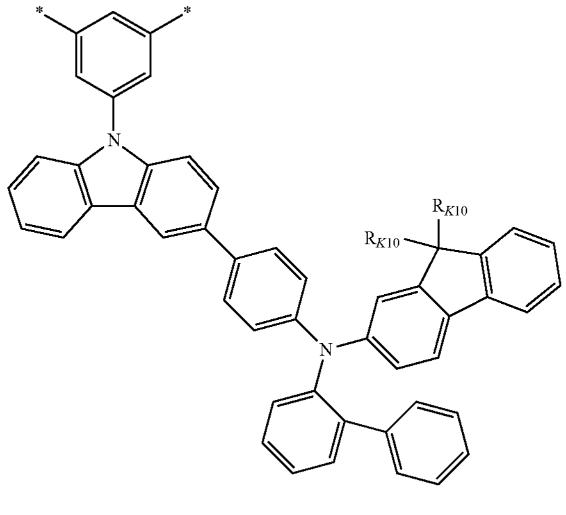

-continued
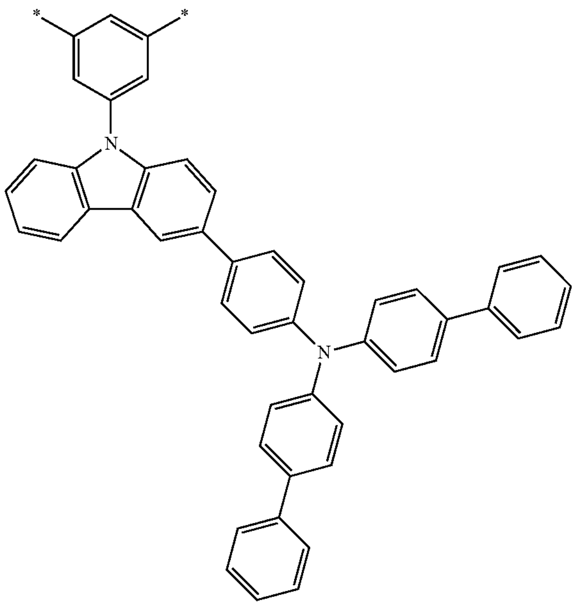
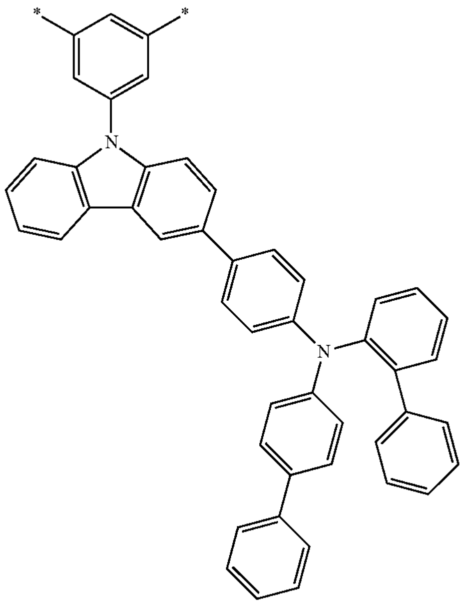
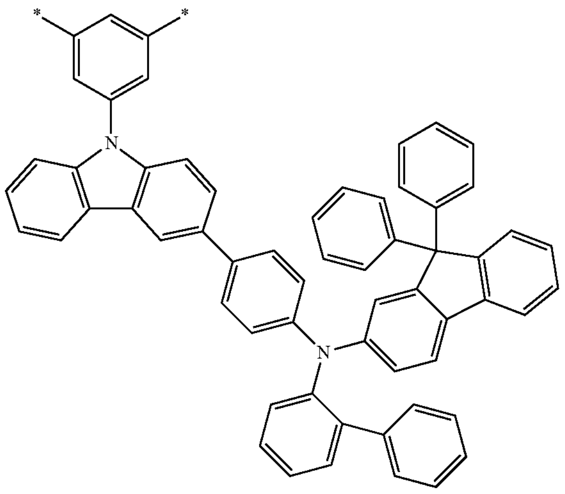
-continued
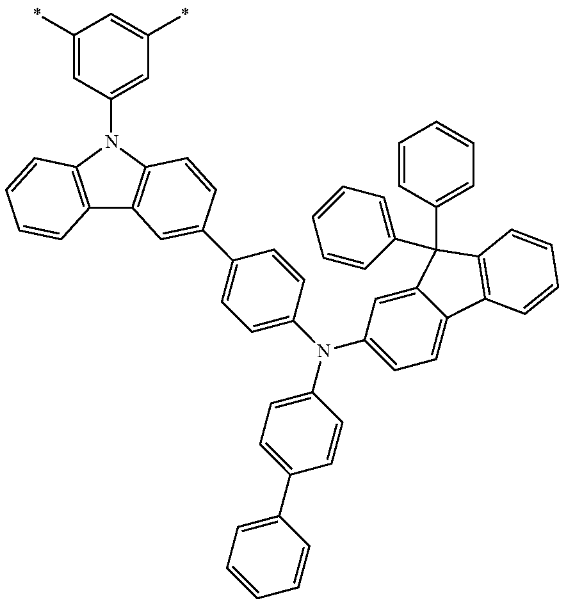
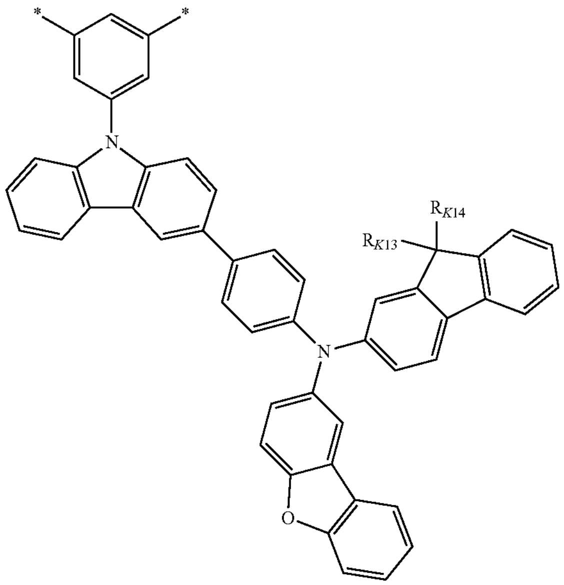
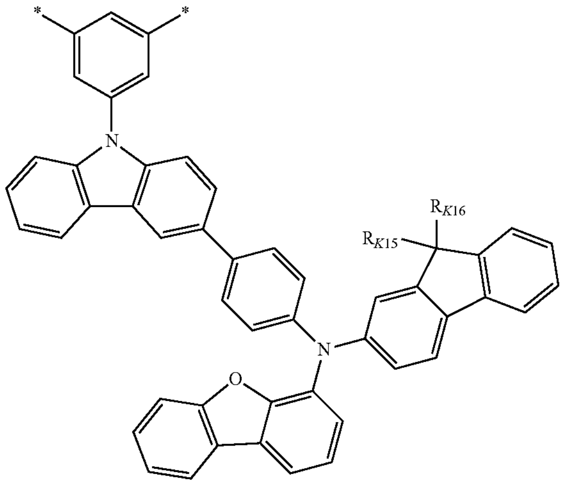

-continued
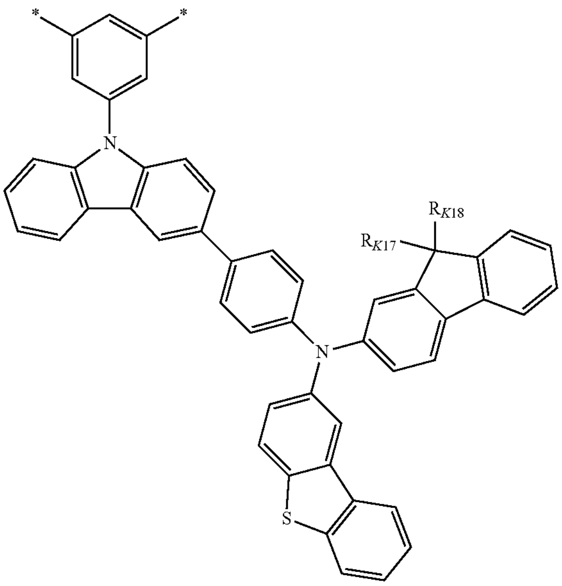
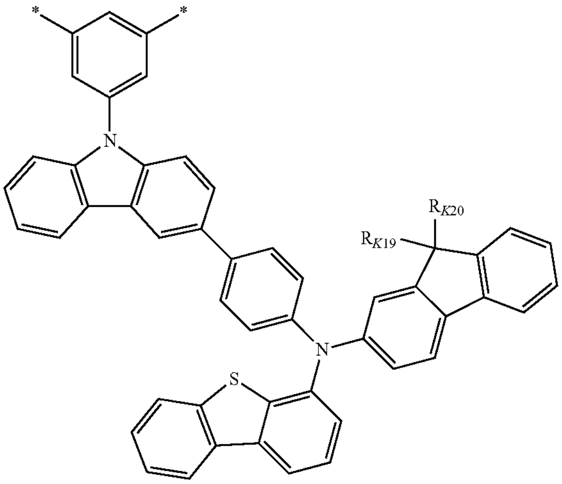
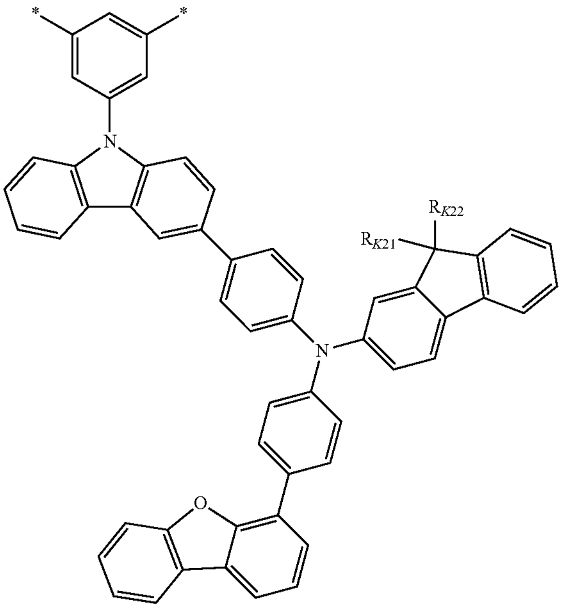
-continued
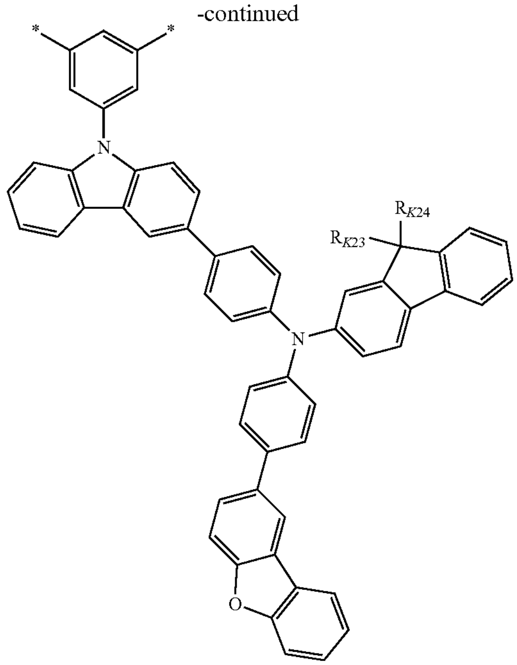
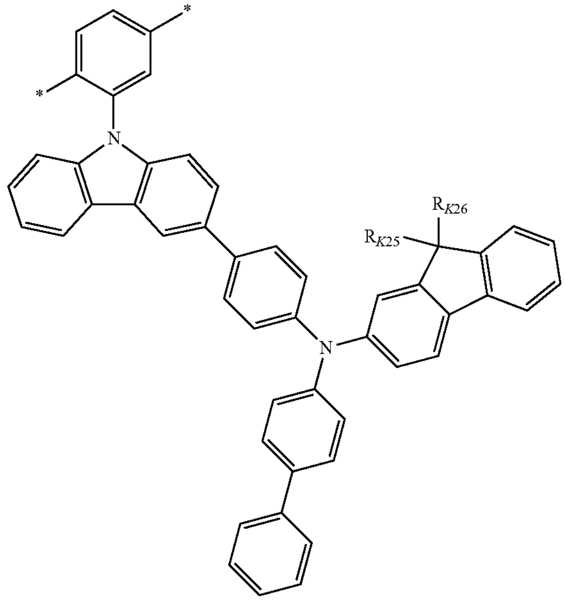
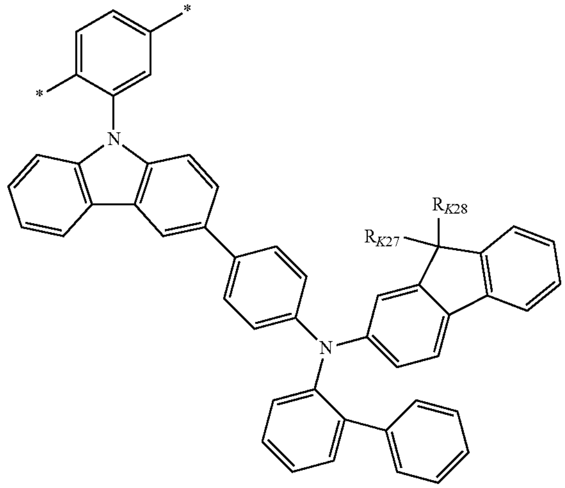

-continued
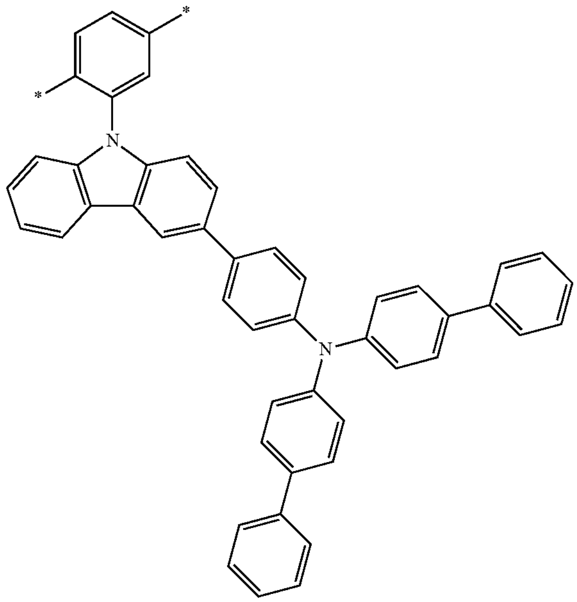
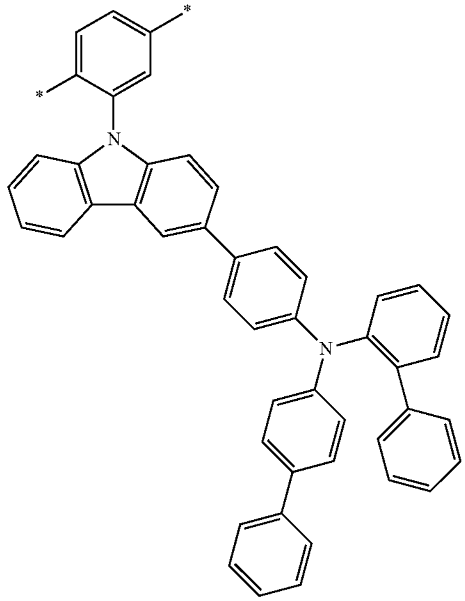
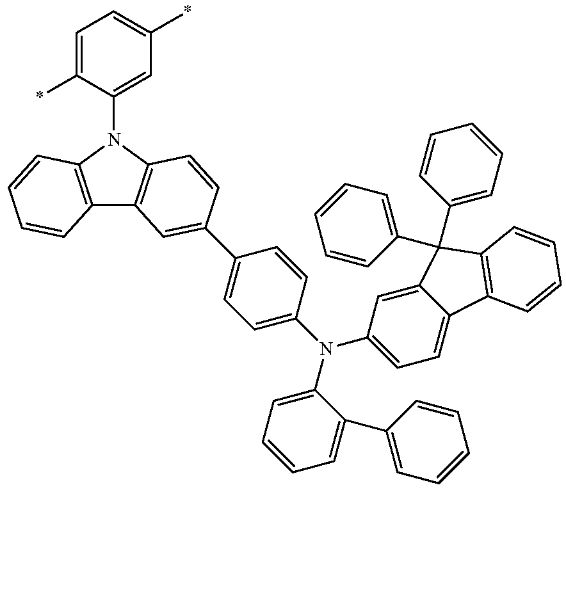
-continued
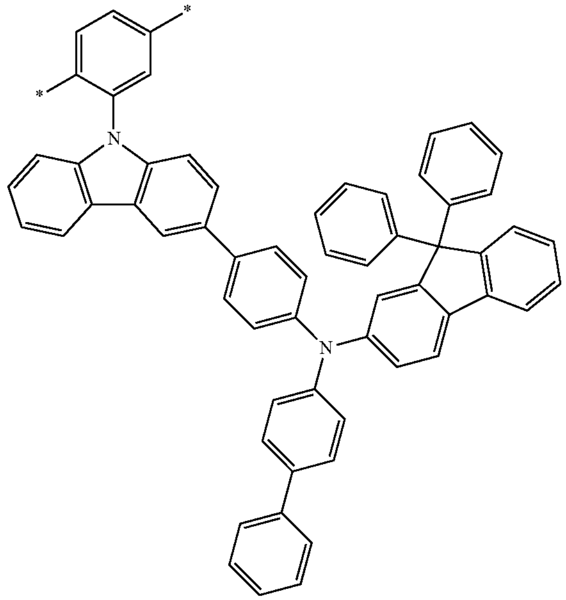
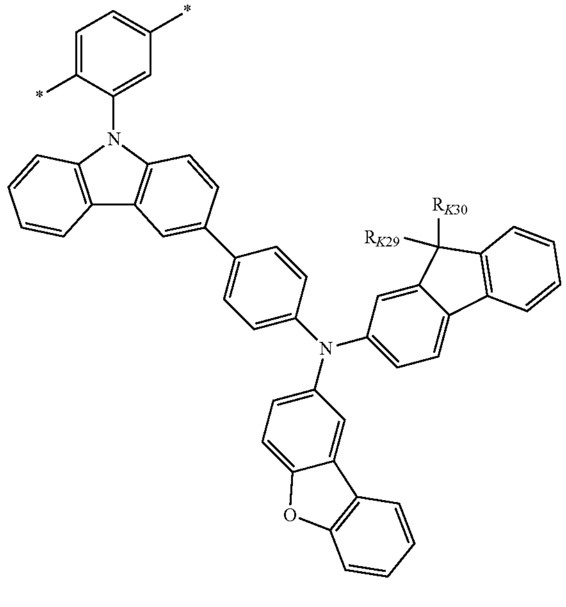
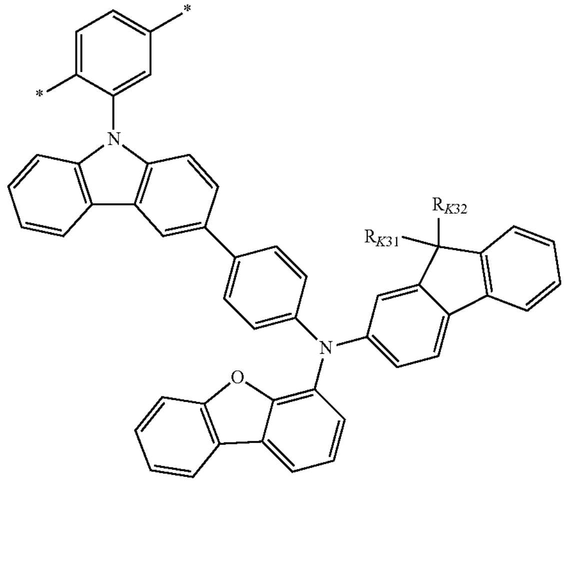

-continued
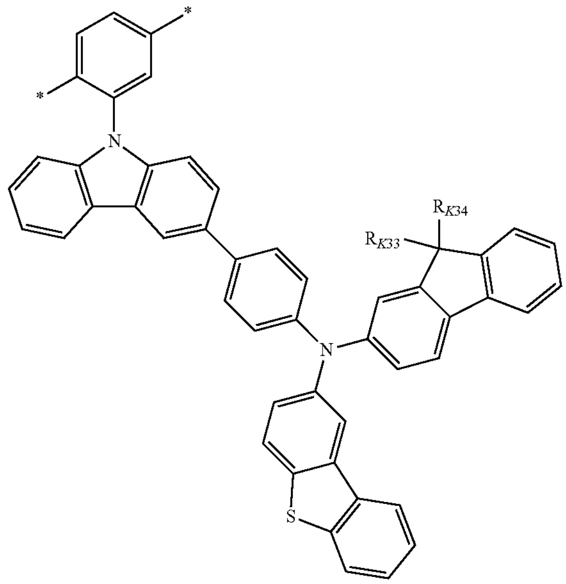
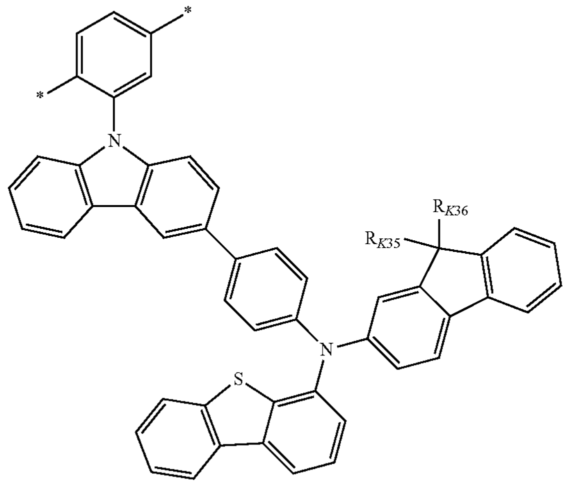
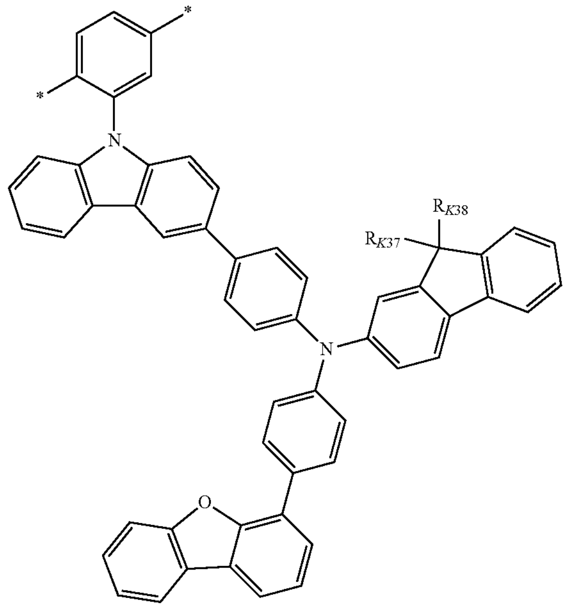
-continued
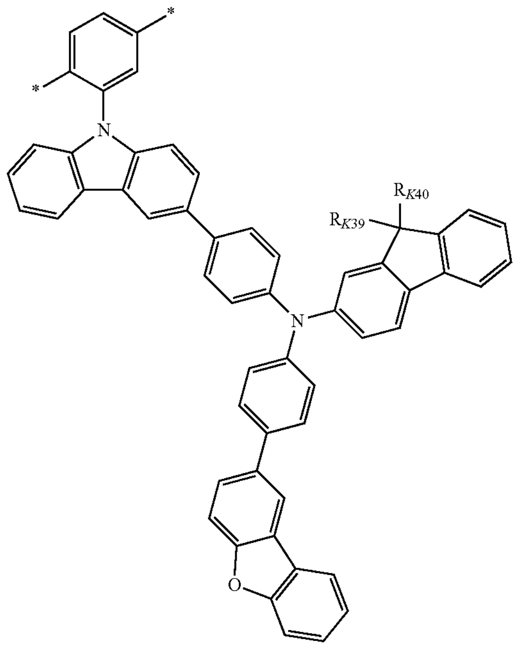
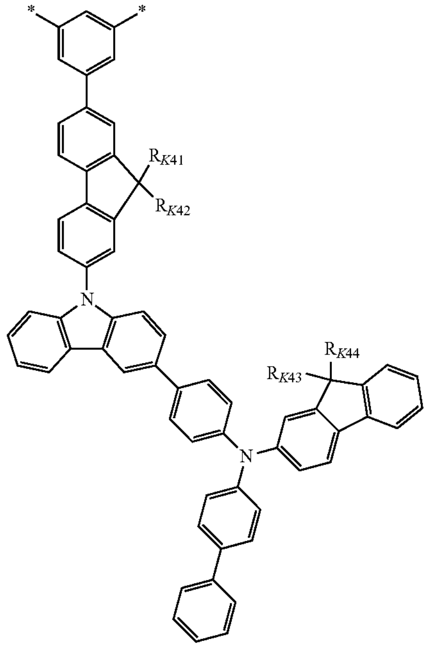

-continued
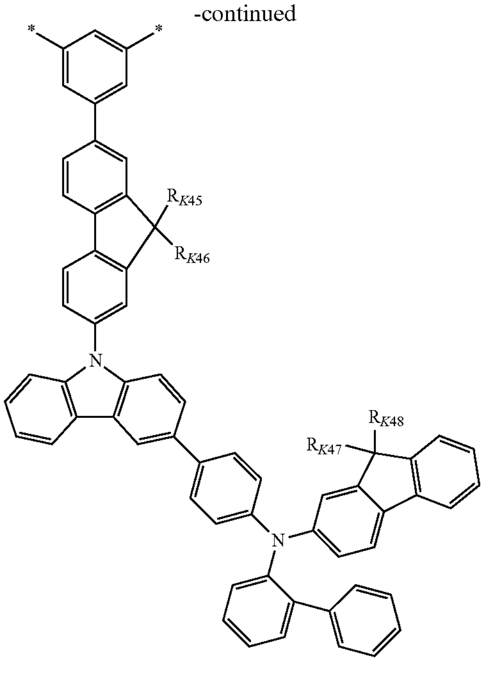
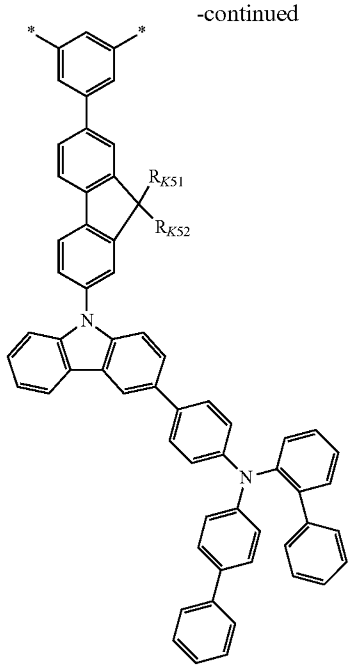
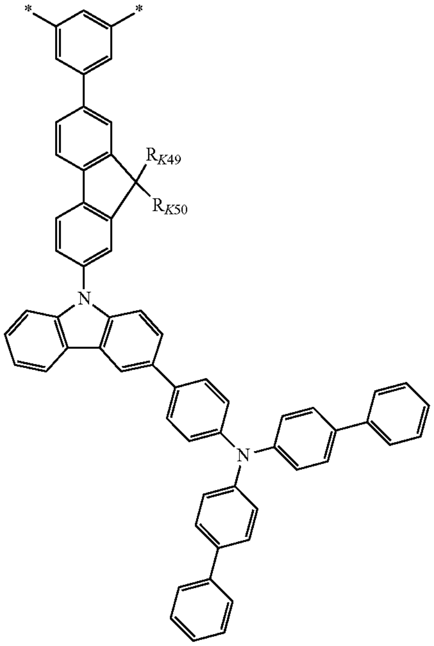
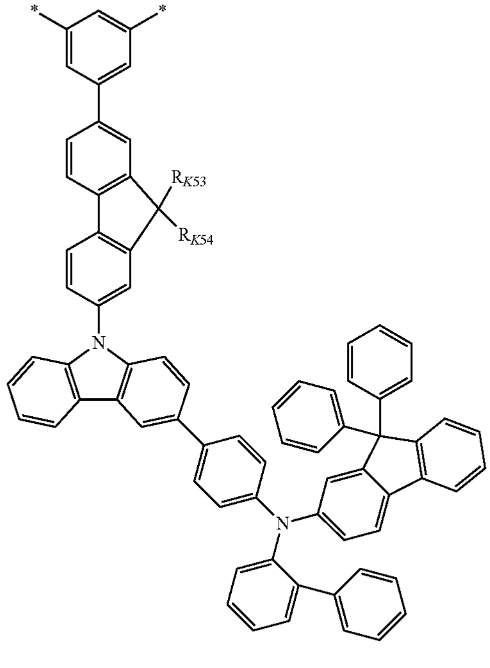

-continued
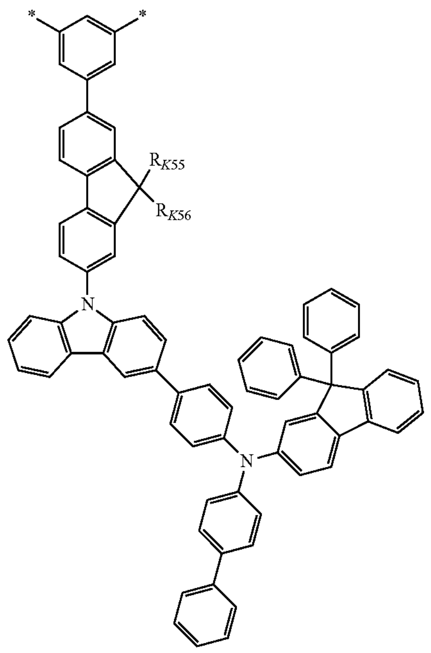
-continued
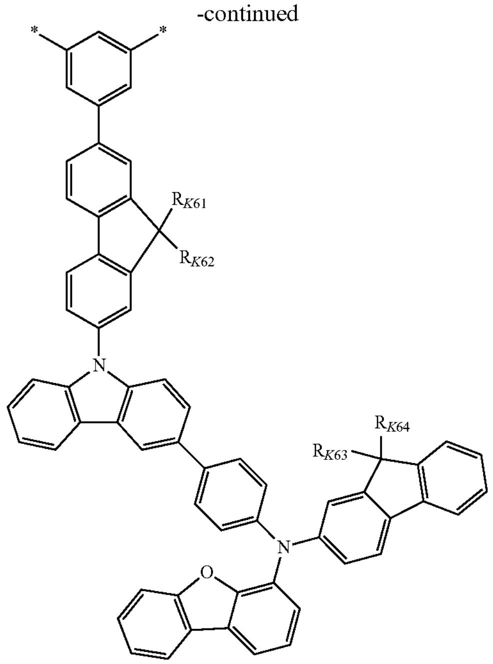
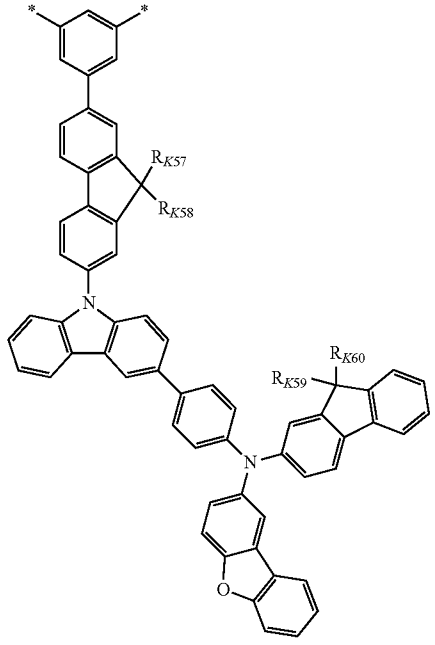
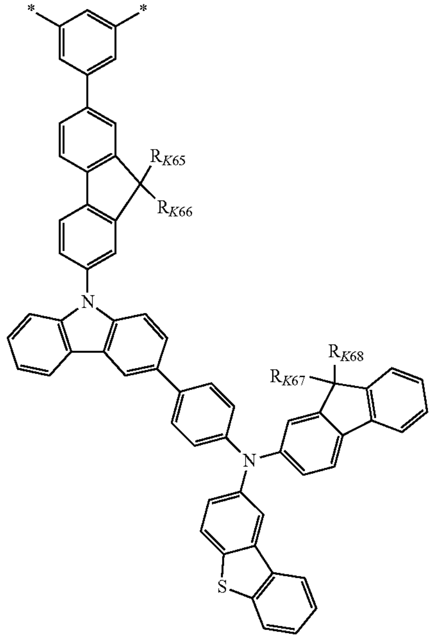

-continued
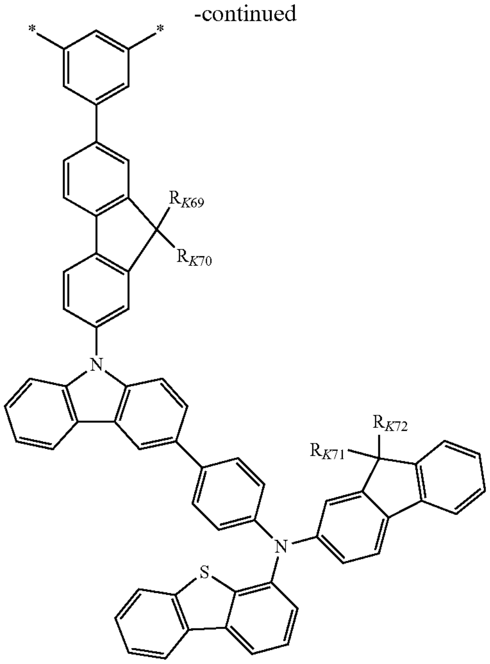
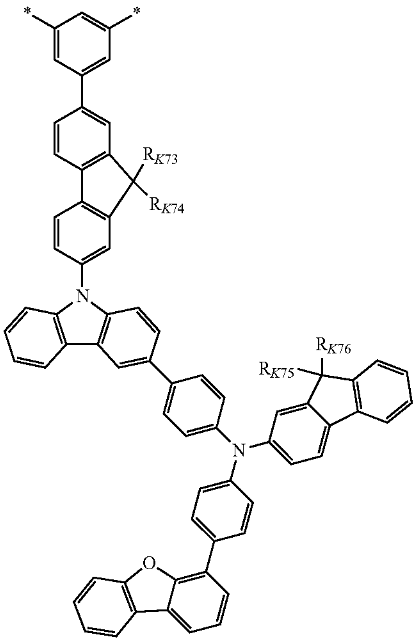
-continued
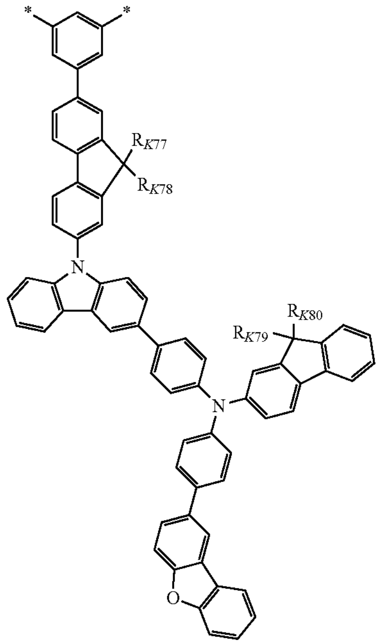
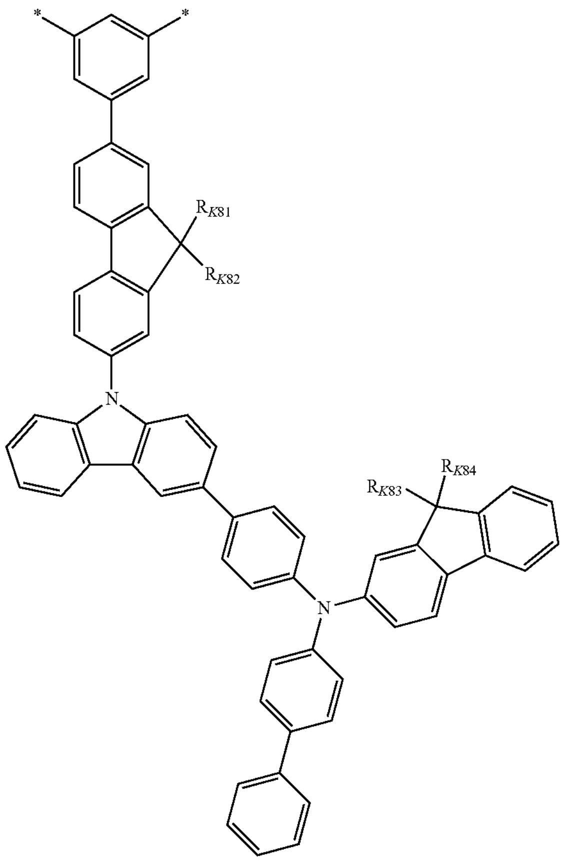

-continued
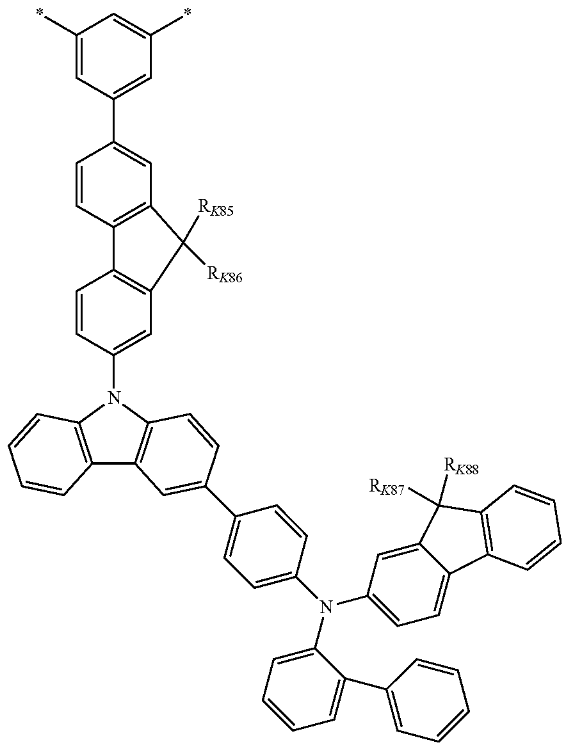
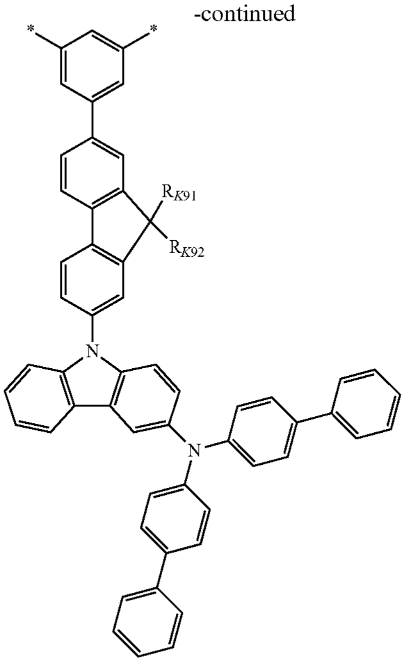
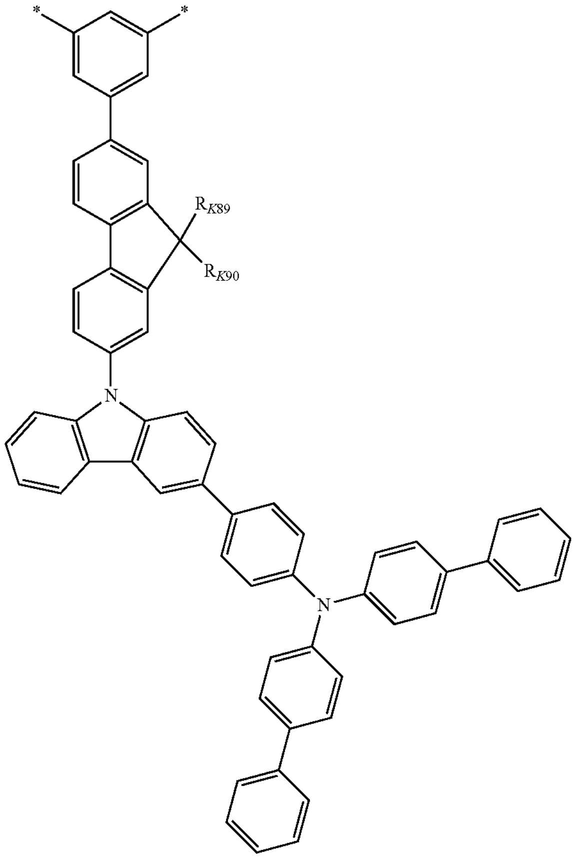
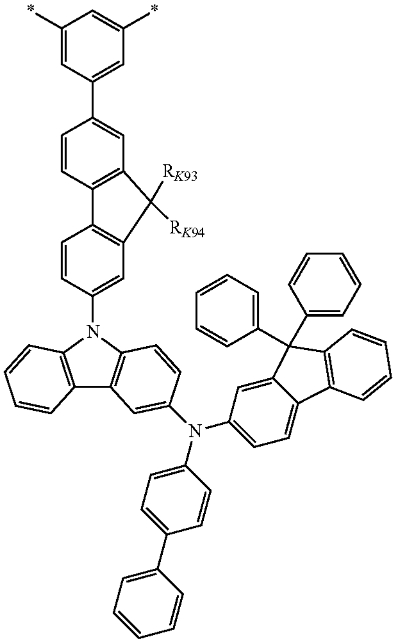

-continued

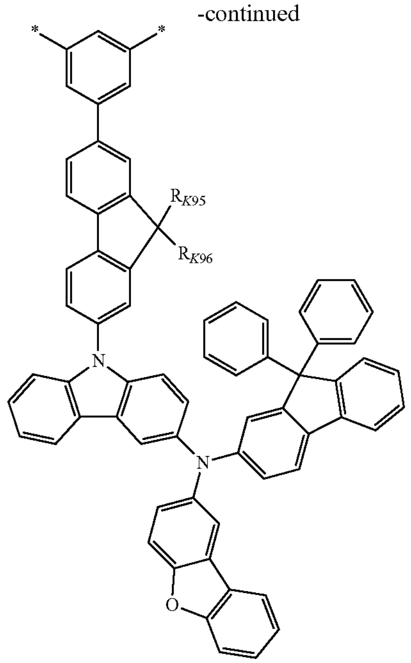

In the above chemical formulae, * is a linking point and $R_{K9}$ to $R_{K96}$ are each independently a substituted or unsubstituted C1 to C20 alkyl group.

Y of Chemical Formula 1

The polymer material according to an embodiment may include multiple structural units, wherein Y in each structural unit is the same or different.

The polymer material according to an embodiment may exhibit excellent solubility due to Y in the structural unit. Accordingly, a thin film may be easily formed by a coating method when the polymer material according to an embodiment is used.

In Chemical Formula 1, Y may be a substituted or unsubstituted C6 to C60 divalent aromatic cyclic group, a substituted or unsubstituted C6 to C60 divalent alicyclic cyclic group, a substituted or unsubstituted C3 to C60 divalent aromatic heterocyclic group, or a substituted or unsubstituted C3 to C60 divalent alicyclic heterocyclic group.

In an embodiment, Y may be a substituted or unsubstituted C6 to C60 divalent aromatic cyclic group, or a substituted or unsubstituted C3 to C60 divalent aromatic heterocyclic group.

Herein, the divalent aromatic cyclic group and the divalent aromatic heterocyclic group may be the same as in the aromatic cyclic group and the aromatic heterocyclic group of $Ar_1$ of Chemical Formula 2, except that the trivalent aromatic cyclic group and the trivalent aromatic heterocyclic group are divalent groups instead of trivalent groups.

In terms of improvement of solubility of the polymer material according to an embodiment, Y may be a phenylene group, a fluorendiyl group, a biphenylene group, a fluorenylene group, a naphthylene group, an ene(tolylene) group, a phenanthrylene group, a naphthacenylene group, a pyrenylene group, a terphenylene group, a tolylene group, a t-butyl phenylene group, a (phenylpropyl)phenylene group, or the like, for example a phenylene group or a fluorendiyl group.

In addition, the substituent of the divalent aromatic hydrocarbon group or the divalent aromatic heterocyclic group may be the same as the substituents described herein in $Ar_1$.

In terms of improvement of solubility of the polymer material according to an embodiment, the substituent may be a C1 to C20 linear or branched alkyl group, for example a C3 to C10 linear or branched alkyl group, or a C6 to C8 linear alkyl group.

In terms of adjustment of the HOMO level, Y may be a group represented by Chemical Formulae 2-7 to 2-14.

Herein, each Y in a plurality of Y's included in a plurality of structural units represented by Chemical Formula 1 may be the same or different.

(2-7)

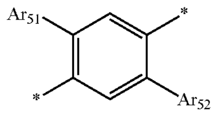

(2-8)

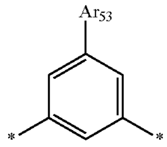

(2-9)

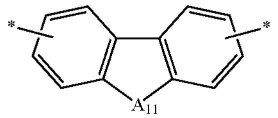

(2-10)

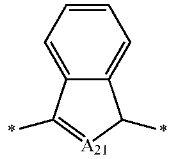

(2-11)

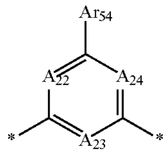

(2-12)

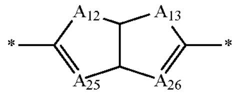

(2-13)

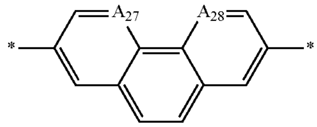

(2-14)

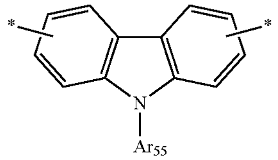

$Ar_{51}$ to $Ar_{55}$ are each independently hydrogen, deuterium, a substituted or unsubstituted C1 to C20 alkyl group, a substituted or unsubstituted C1 to C20 heteroalkyl group, a substituted or unsubstituted C6 to C60 monovalent aromatic cyclic group, or a substituted or unsubstituted C3 to C60 monovalent aromatic heterocyclic group, $A_{11}$ to $A_{13}$ are each independently —O—, —S—, —Se—, —$CR_3R_4$—, or —$SiR_5R_6$— (wherein $R_3$ to $R_6$ are each independently hydrogen, deuterium, a substituted or unsubstituted C1 to C20 alkyl group, a substituted or unsubstituted C6 to C60 aryl group, or a substituted or unsubstituted C3 to C60 heteroaryl group), $A_{21}$ to $A_{28}$ are each independently —$CR_7$═, —N═, or —$SiR_8$═ (wherein $R_7$ to $R_8$ are each independently hydrogen, deuterium, a substituted or unsubstituted C1 to C20 alkyl group, a substituted or unsubstituted C6 to C60 aryl group, or a substituted or unsubstituted C3 to C60 heteroaryl group), and

* is a linking point.

Examples of the Y may be as follows.

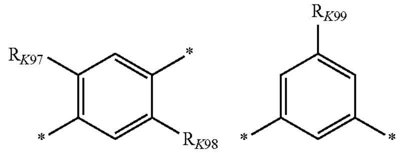

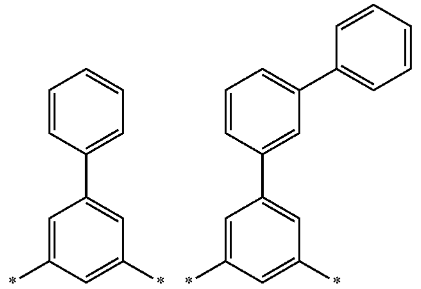

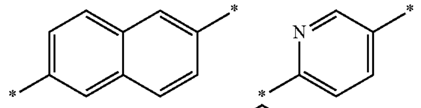

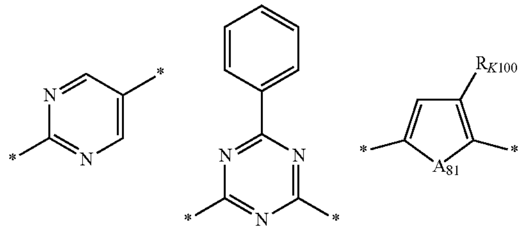

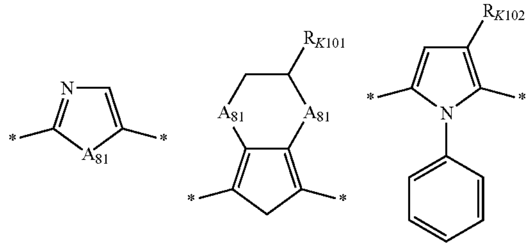

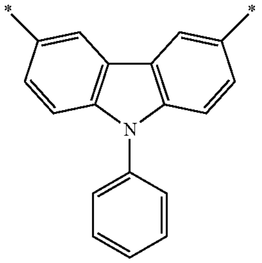

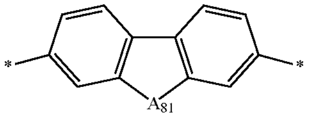

-continued

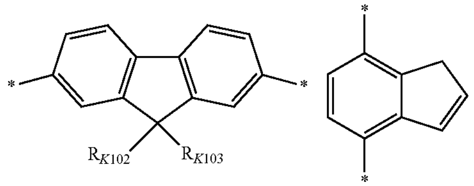

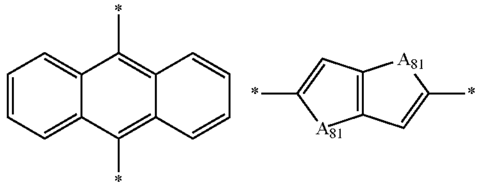

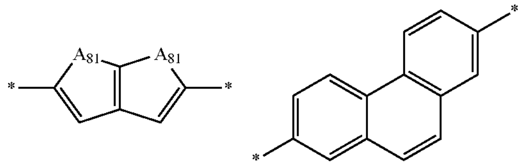

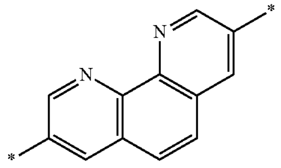

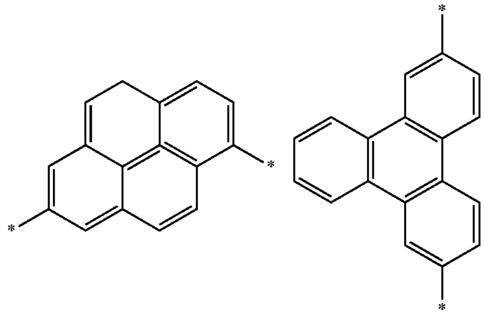

In the chemical formulae, $A_{81}$ is O, S, or Se, * is a linking point, and $R_{K97}$ to $R_{K103}$ are each independently a substituted or unsubstituted C1 to C20 alkyl group. On the other hand, when a plurality of Ys are present, each of the Ys may be the same or different.

The polymer material according to an embodiment may comprises an alternating copolymer comprising the structural unit represented by Chemical Formula 1. The alternating copolymer according to an embodiment may be represented by Chemical Formula 3. When the alternating copolymer represented by Chemical Formula 3 is used, luminescence life-span of an electroluminescence device, for example a quantum dot light emitting device may be improved.

$E-(X-Y)-E_m$ Chemical Formula 3

In Chemical Formula 3, each E is independently a substituted or unsubstituted C6 to C60 monovalent aromatic cyclic group, or a substituted or unsubstituted C3 to C60 monovalent aromatic heterocyclic group, m is an integer of 2 or more, and each X and each Y independently may be the same or different.

Herein, the monovalent aromatic cyclic group and the monovalent aromatic heterocyclic group may be the same as in the aromatic cyclic group and the aromatic heterocyclic group of $Ar_1$ of Chemical Formula 2, except that the trivalent aromatic cyclic group and the trivalent aromatic heterocyclic group are monovalent groups instead of trivalent groups, and substituents may be the same as in $Ar_1$.

In Chemical Formula 3, examples of E (end group) are as follows.

(3-1)

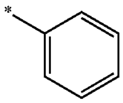

(3-2)

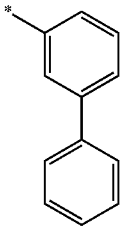

(3-3)

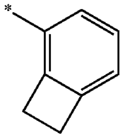

(3-4)

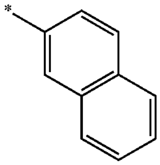

(3-5)

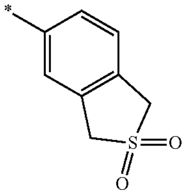

(3-6)

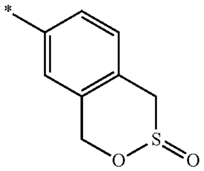

(3-7)

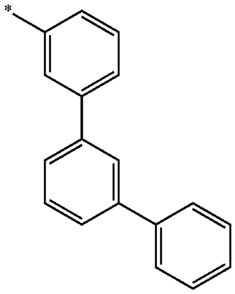

-continued (3-8)

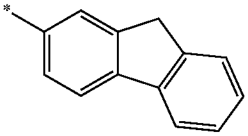

(3-9)

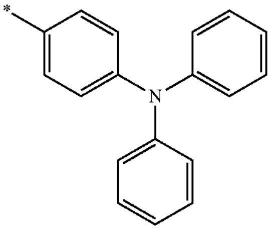

(3-10)

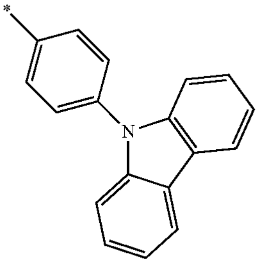

(3-11)

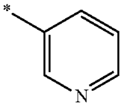

(3-12)

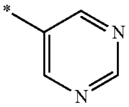

(3-13)

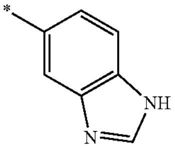

(3-14)

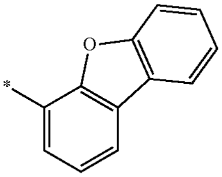

In the above chemical formulae, * is a linking point.

The polymer material according to an embodiment may be used as a material for an electroluminescence device, for example a hole transport material of an electroluminescence device including quantum dots.

Number Average Molecular Weight ($M_n$) and Weight Average Molecular Weight ($M_w$) of Polymer Material A number average molecular weight ($M_n$) of the polymer material according to an embodiment may be for example about 10,000 grams per mole (g/mol) to about 1,000,000 g/mol, for example about 30,000 g/mol to about 500,000 g/mol.

Accordingly, viscosity of coating liquid for forming a thin film (for example, a hole injection layer and/or a hole transport layer) including the polymer material may be appropriately controlled, and as a result, a thin film having a uniform thickness may be formed.

A weight average molecular weight ($M_w$) of the polymer material according to an embodiment may be for example greater than or equal to about 10,000 g/mol, for example greater than or equal to about 50,000 g/mol, about 10,000 g/mol to about 1,000,000 g/mol, or about 50,000 g/mol to about 1,000,000 g/mol.

Accordingly, viscosity of coating liquid for forming a thin film (for example, a hole injection layer and/or a hole transport layer) including the polymer material may be appropriately controlled, and as a result, a thin film having a uniform thickness may be formed.

The number average molecular weight ($M_n$) and the weight average molecular weight ($M_w$) of the polymer material according to an embodiment may be measured using a known method or by appropriately modifying a known method, unless particularly described. In an embodiment, the number average molecular weight ($M_n$) and the weight average molecular weight ($M_w$) may be measured by the following method.

The number average molecular weight ($M_n$) and the weight average molecular weight ($M_w$) of the polymer material may be measured by a gel permeation chromatography (GPC) method under the following exemplary conditions.

Analyzer (GPC): Shimadzu Corporation, Prominence

Column: Polymer La Bora Toirez, PLgel MIXED-B

Column temperature: 40° C.

Flow rate: 1.0 milliliters per minute (mL/min)

Sample solution injection amount: 20 microliters (μL) (concentration: about 0.05 mass %)

Eluent: tetrahydrofuran (THF)

Detector (ultraviolet-visible detector): Shimadzu Corporation, SPD-10AV

Standard sample: polystyrene

Synthesis Method of Polymer Material

The polymer material according to an embodiment may be synthesized by appropriately combining known organic synthesis reactions. A specific method of synthesizing the polymer material according to an embodiment may be understood by those skilled in the art with reference to the following exemplary method.

Specifically, the polymer material according to an embodiment may be synthesized by copolymerizing at least one kind of a first monomer represented by Chemical Formula 4 and at least one kind of a second monomer represented by Chemical Formula 5 in a molar ratio of about 1:1.

On the other hand, the first monomer and the second monomer may be synthesized by appropriately combining known organic synthesis reactions.

In addition, the first monomer and the second monomer may be identified by known analysis methods (e.g., NMR, LC-MS).

Chemical Formula 4

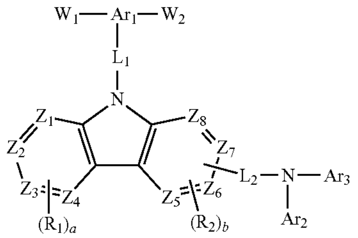

Chemical Formula 5

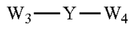

In Chemical Formula 4 and Chemical Formula 5, $Ar_1$, $Ar_2$, $Ar_3$, $Z_1$, $Z_2$, $Z_3$, $Z_4$, $Z_5$, $Z_6$, $Z_7$, $Z_8$, $L_1$, $L_2$, $R_1$, $R_2$, a, and b are the same as in Chemical Formula 2, Y is the same as in Chemical Formula 1, and $W_1$ to $W_4$ are each independently, a halogen atom (a fluorine atom, a chlorine atom, a bromine atom, an iodine atom, for example a bromine atom) or a group represented by Chemical Formula 5-1.

Chemical Formula 5-1

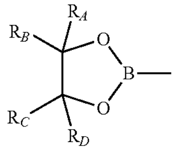

In Chemical Formula 5-1, $R_A$ to $R_D$ are each independently a C1 to C3 alkyl group.

HOMO Level of Polymer Material

A highest occupied molecular orbital (HOMO) level of the polymer material according to an embodiment may be for example greater than or equal to about 5.5 electron Volts (eV), for example greater than or equal to about 5.51 eV, and for example less than or equal to about 6.0 eV, for example less than or equal to about 5.9 eV, or less than or equal to about 5.8 eV, or for example about 5.5 eV to about 6.0 eV, or about 5.51 eV to about 5.8 eV.

Accordingly, when a thin film (for example, a hole injection layer and/or a hole transport layer) including the polymer material is applied to an electroluminescence device, particularly a quantum dot electroluminescence device, an energy barrier at the time of injecting holes into the quantum dot may be reduced, and thus luminous efficiency of the quantum dot may be improved.

Material for Electroluminescence Device and Electroluminescence Device

The material for an electroluminescence device according to an embodiment includes the polymer material according to an embodiment.

The electroluminescence device according to an embodiment may include a pair of electrodes facing each other and at least one organic layer including the polymer material according to an embodiment disposed between the pair of electrodes.

The electroluminescence device according to an embodiment may further include a layer including quantum dots between a pair of electrodes. The quantum dots may include inorganic nanoparticles.

In addition, the electroluminescence device may include at least one organic layer formed by coating a composition including the polymer material.

Examples of the electroluminescence device may be a quantum dot light emitting device, an organic electroluminescence device, an organic-inorganic perovskite light emitting device, and the like.

Composition and Thin Film

The composition according to an embodiment may be a liquid composition including the polymer material, and a solvent or a dispersive medium.

In addition, a thin film according to an embodiment includes the polymer material according to an embodiment.

The polymer material according to an embodiment may have excellent solubility, and thus an electroluminescence device (e.g., thin film) may be easily manufactured by a coating method (wet process).

The polymer material according to an embodiment has improved charge mobility, and thus may be used for a material for an organic layer such as a hole injection layer, a hole transport layer, a light emitting layer, and the like. The polymer material according to an embodiment may be used for a material for forming a hole injection layer and/or a hole transport layer, for example a material for a hole transport layer, in terms of hole transport capability.

Electroluminescence Device

An exemplary electroluminescence device (quantum dot light emitting device) according to an embodiment is described.

FIG. 1 is a schematic view of an electroluminescence device according to an embodiment.

Referring to FIG. 1, the electroluminescence device 100 may have a structure where a first electrode 120, a hole injection layer 130, a hole transport layer 140, a light emitting layer 150, an electron transport layer 160, an electron injection layer 170, and a second electrode 180 are sequentially disposed on a substrate 110.

The polymer material according to an embodiment may be for example included in at least one layer (e.g., at least one organic layer) disposed between the first electrode 120 and the second electrode 180.

Specifically, the polymer material according to an embodiment may be a hole injection material, a hole transport material, a light emitting material, or a material satisfying at least two condition thereof. That is, the polymer material according to an embodiment may be included in at least one layer of the hole injection layer 130, the hole transport layer 140, and the light emitting layer 150.

The polymer material according to an embodiment may be included in a hole injection layer 130 and/or a hole transport layer 140 as a hole injection material and/or a hole transport material. The polymer material according to an embodiment may be included in the hole transport layer 140 as a hole transport material.

The organic layer including the polymer material according to an embodiment may be formed by a coating method (e.g., solution coating method).

The coating method (solution coating method) is not particularly limited, but may be for example a spin coating method, a casting method, microgravure coating method, a gravure coating method, a bar coating method, a roll coating method, a wire bar coating method, dip coating method, a spray coating method, a screen printing method, a flexographic printing method, an offset method, an inkjet printing method, or the like.

On the other hand, a solvent used for a solution coating is not particularly limited as long as it may dissolve the polymer material according to an embodiment and may be for example toluene, xylene, diethylether, chloroform, ethyl acetate, methylene chloride, tetrahydrofuran, acetone, acetonitrile, N,N-dimethyl formamide, dimethyl sulfoxide, anisole, hexamethyl phosphoric acid triamide, 1,2-dichloroethane, 1,1,2-trichloroethane, chlorobenzene, o-dichlorobenzene, dioxane, cyclohexane, n-pentane, n-hexane, n-heptane, n-octane, n-nonane, n-decane, methylethylketone, cyclohexanone, butyl acetate, ethyl cellosolve acetate, ethylene glycol, ethylene glycol monobutylether, ethylene glycol monoethylether, ethylene glycolmonomethyl ether, dimethoxyethane, propylene glycol, diethoxymethane, triethylene glycol monoethyl ether, glycerine, 1,2-hexanediol, methanol, ethanol, propanol, isopropanol, cyclohexanol, N-methyl-2-pyrrolidone, or the like.

When the ease of application is considered, a concentration of the polymer material included in the solution may be, for example, about 0.1 mass percent (mass %) to about 10 mass %, for example about 0.5 mass % to about 5 mass %.

Meanwhile, the method for forming other layers except the organic layer including the polymer material according to an embodiment is not particularly limited, and examples thereof include a vacuum deposition method, a solution coating method, or the like.

The substrate 110 is not particularly limited and a substrate used in general electroluminescence devices may be used. For example, the substrate 110 may be a semiconductor substrate such as a glass substrate, a silicon substrate and the like, a transparent plastic substrate, or the like.

The first electrode 120 may be an anode and may be formed of a metal, an alloy, a conductive compound, or the like of a material having a relatively large work function.

For example, the first electrode 120 that is a transmissive electrode may be formed of a transparent conductive material such as indium tin oxide, indium zinc oxide, tin oxide, zinc oxide, or the like Further, by further forming a film with a reflective material such as magnesium (Mg) or aluminum (Al) on the transmissive electrode, the first electrode 120 can be both a reflective electrode and the transmissive electrode.

The hole injection layer 130 is a layer capable of controlling hole injection from the first electrode 120.

In an embodiment, a thickness of the hole injection layer 130 may be for example about 10 nanometers (nm) to about 1,000 nm, or about 10 nm to about 100 nm.

The hole injection layer 130 may be formed with a known hole injection material by a known method such as a vacuum deposition method, a spin coating method, an inkjet method, or the like.

The hole injection material may be, for example, triphenylamine-containing polyetherketone, 4-isopropyl-4'-methyldiphenyl iodonium tetrakis(pentafluorophenyl)borate, N,N'-diphenyl-N,N'-bis-[4-(phenyl-m-tolyl-amino)-phenyl]-biphenyl-4,4'-diamine, copper phthalocyanine, 4,4',4"-tris(3-methylphenylamino)triphenylamine, N,N'-di(1-naphthyl)-N,N'-diphenyl benzidine, 4,4',4"-tris(diphenylamino)triphenylamine, 4,4',4"-tris(N,N-2-naphtylphenylamino)triphenylamine, polyaniline:dodecyl benzenesulfonic acid, poly (3,4-ethylenedioxythiophene): poly (4-styrenesulfonate) (PEDOT:PSS), poly aniline:10-Camphor sulfonic acid, or the like.

The hole transport layer 140 is a layer having a function of transporting holes.

In an embodiment, a thickness of the hole transport layer 140 may be for example about 10 nm to about 150 nm.

In an embodiment, the hole transport layer 140 may be formed with the polymer material by the solution coating method. As a result, the polymer material capable of improving the luminous efficiency of the electroluminescence device 100 may be efficiently formed in a large area.

However, when other organic layers of the electroluminescence device 100 include the polymer material according to an embodiment, the hole transport layer 140 may be formed using a known hole transport material.

The hole transport material may be, for example, 1,1-bis[(di-4-tolyl amino)phenyl]cyclohexane, a carbazole derivative such as N-phenylcarbazole, polyvinylcarbazole, or the like; or N,N'-bis(3-methylphenyl)-N,N'-diphenyl-[1,1-biphenyl]-4,4'-diamine, 4,4',4"-tris(N-carbazolyl)triphenylamine, N,N'-di(1-naphthyl)-N,N'-diphenyl benzidine, or the like.

The light emitting layer 150 is a layer configured to emit light such as fluorescence or phosphorescence.

In an embodiment, a thickness of the light emitting layer 150 may be for example about 10 nm to about 60 nm.

The light emitting layer 150 may have a plurality of quantum dots arranged in a single layer, or may be arranged in at least two layers.

In an embodiment, the quantum dots may be inorganic nanoparticles having a quantum confinement effect.

In an embodiment, a diameter of the inorganic nanoparticles may be, for example about 1 nm to about 10 nm, but is not limited thereto.

The quantum dots arrayed in the light emitting layer 150 may be synthesized for example by a wet chemical method, vapor deposition methods such as an organic metal chemical vapor deposition method, and a molecular beam epitaxy method, or the like.

In the wet chemical method, a precursor material is put into an organic solvent to grow particles. Therefore, the wet chemical method is convenient compared to the vapor deposition methods such as the metalorganic chemical vapor deposition (MOCVD) method and the molecular beam epitaxy (MBE) method, and may control growths of particles at a low cost.

Herein, by controlling sizes of the quantum dots, the energy bandgap may be controlled, and as a result, light of various wavelength ranges may be emitted through the light emitting layer 150. Therefore, by using quantum dots having a plurality of different sizes, a display device emitting light of a plurality of wavelengths may be manufactured.

The sizes of the quantum dot may be appropriately selected so as to emit red light, green light, and/or blue light constituting the display device. In addition, the sizes of the quantum dots may also be combined so that various colors of light may combine to emit white light.

Materials constituting the quantum dots are not particularly limited, but a semiconductor material that is a Group II-VI compound, a Group III-V compound, a Group IV-VI compound, or a Group IV element or a compound thereof, and may be used individually or two or more thereof may be used together.

Examples of the Group II-VI compound may be a binary element compound such as CdSe, CdTe, ZnS, ZnSe, ZnTe, ZnO, HgS, HgSe, HgTe, or the like; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, or the like; or a quaternary element compound such as CdZnSeS, CdZnSeTe, CdZnSTe, CdHgSeS, CdHgSeTe, CdHgSTe, HgZnSeS, HgZnSeTe, HgZnSTe, or the like.

Examples of the Group III-V compound may be a binary element compound such as GaN, GaP, GaAs, GaSb, AlN, AlP, AlAs, AlSb, InN, InP, InAs, InSb, or the like; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or the like; or a quaternary element compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or the like.

Examples of the Group IV-VI compound may be a binary element compound such as SnS, SnSe, SnTe, PbS, PbSe, PbTe, or the like; a ternary element compound such as SnSeS, SnSeTe, SnSTe, PbSeS, PbSeTe, PbSTe, SnPbS, SnPbSe, SnPbTe, or the like; or a quaternary element compound such as SnPbSSe, SnPbSeTe, SnPbSTe, or the like.

Examples of the Group IV element or the compound thereof may be a elementary substance such as a Si, Ge, or the like; or a binary element compound such as SiC, SiGe, or the like.

The quantum dot according to an embodiment may have a homogeneous structure or a core-shell structure.

Of them, the core-shell structure may include different materials, and materials constituting the core and the shell may be different semiconductor materials. However, in some embodiments the semiconductor material constituting the shell may have a larger energy bandgap than the semiconductor material constituting the core.

For example, quantum dots having a core (CdSe)-shell (ZnS) structure can be used and may be produced as follows.

First, precursor materials for forming a core (CdSe) of $(CH_3)_2Cd$ (dimethyl cadmium), TOPSe (trioctylphosphine selenide), or the like are injected into TOPO (trioctylphosphine oxide) as an organic solvent (a dispersing agent) and a crystal is grown to form a core.

At this time, the crystal is maintained at a high temperature for a predetermined time so that the crystal may be grown to a predetermined size, and then the precursor materials for forming a shell (ZnS) are added, for example injected, to form a shell on the surface of the core.

In this way, TOPO-coated CdSe/ZnS core-shell quantum dots may be prepared.

The electron transport layer 160 is a layer having a function of transporting electrons.

A thickness of the electron transport layer 160 may be, for example about 15 nm to about 50 nm.

The electron transport layer 160 may be formed with a known electron transport material by a known method such as a vacuum deposition method, a spin coating method, or an inkjet method.

The electron transport material may be, for example lithium (8-quinolinolate), aluminum tris(8-quinolinolate), a compound having nitrogen-containing aromatic heterocyclic group, or the like.

Examples of the compound having the nitrogen-containing aromatic heterocyclic group may be a compound including a pyridine ring such as 1,3,5-tri[(3-pyridyl)-phen-3-yl]benzene or the like, a compound including a triazine ring such as 2,4,6-tris(3'-(pyridin-3-yl)biphenyl-3-yl)-1,3,5-triazine or the like, or a compound including an imidazole ring such as 2-(4-(N-phenylbenzoimidazol-1-yl-phenyl)-9,10-dinaphthylanthracene or the like.

The electron injection layer 170 is a layer having a function of facilitating injection of electrons from the second electrode 180.

A thickness of the electron injection layer 170 may be, for example about 0.3 nm to about 9 nm.

The electron injection layer 170 may be formed by forming a known electron injection material by a known method such as a vacuum deposition method.

The electron injection material may be, for example a lithium compound such as lithium (8-quinolinolate), lithium fluoride (LiF), lithium oxide ($Li_2O$), or sodium chloride (NaCl), cesium fluoride (CsF), barium oxide (BaO), or the like.

The second electrode 180 is a cathode, and may be formed using a metal, an alloy, or a conductive compound having a relatively small work function.

The second electrode 180 that is a reflective electrode may be formed with a metal such as lithium (Li), magnesium (Mg), aluminum (Al), calcium (Ca) or the like, or an alloy such as aluminum-lithium (Al—Li), magnesium-indium (Mg—In), magnesium-silver (Mg—Ag), or the like.

In addition, the second electrode 180, which is a transmissive electrode having a thickness of less than or equal to about 20 nm, may be formed using the metal. The second electrode 180, which is a transmissive electrode, may also be formed using a transparent conductive material such as indium tin oxide or indium zinc oxide.

Meanwhile, a laminate structure of the electroluminescence device according to an embodiment is not necessarily limited to the laminate structure of the electroluminescence device 100 shown in FIG. 1. The electroluminescence device according to an embodiment may have other known laminated structures. For example, at least one layer of the hole injection layer 130, the hole transport layer 140, the electron transport layer 160, and the electron injection layer 170 may be omitted under conditions satisfying the function of the electroluminescence device 100. In addition, the electroluminescence device 100 may further include another layer. In addition, each layer in the electroluminescence device 100 may have a multi-layered laminate structure.

For example, the electroluminescence device 100 may further include a hole blocking layer between the hole transport layer 140 and the light emitting layer 150 to prevent excitons or holes from diffusing into the electron transport layer 160.

The hole blocking layer may be formed by using an oxadiazole derivative, a triazole derivative, a phenanthroline derivative, and the like.

Hereinafter, the preparation of the ion conductive film comprising the polymer material according to one or more embodiments and the physical properties of the ion conductive film thus produced will be described in more detail through examples. However, the technical features of the present disclosure are not limited by the following examples, and may be embodied in different forms without departing from the spirit or scope of the example embodiments set forth herein.

EXAMPLES

In the following examples, each step is carried out at room temperature (25° C.), unless otherwise described. Unless otherwise described, "%" and "parts" mean mass % and parts by mass, respectively.

Synthesis Example 1

Compound 1 is synthesized according to the following reaction scheme.

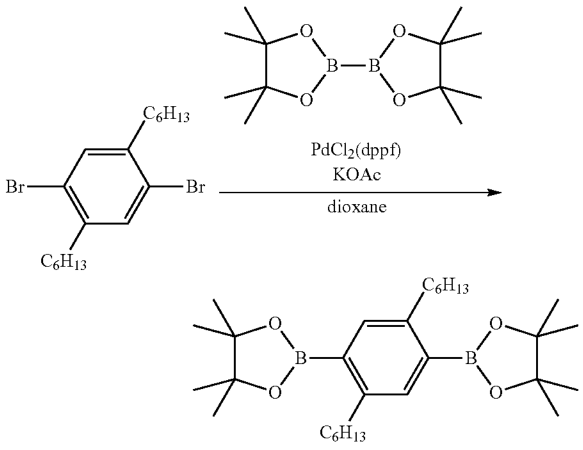

Compound 1

Specifically, 1,4-dihexyl-2,5-dibromobenzene (8.08 g, 20.0 millimoles (mmol)), bis(pinacolato)diboron (12.19 g, 48.0 mmol), [1,1'-bis(diphenyl phosphino)ferrocene]palladium(II) (0.98 g, 1.2 mmol), potassium acetate (11.78 g, 120.0 mmol), and dioxane (100 mL) are added to a reaction vessel under an argon atmosphere and mixed, heated while refluxing, and stirred for 6 hours. Then, toluene and water are added, separated, and washed with water. Then, sodium sulfate and activated carbon are added, stirred, and filtered with Celite™. The filtered solution is concentrated to obtain a crude product (11.94 g). The obtained crude product is recrystallized with hexane and washed in methanol. Obtained crystals are dried under a reduced pressure and thereby Compound 1 (4.23 g) is obtained.

The structure of Compound 1 is identified using a nuclear magnetic resonance device ($^1$H-NMR).

Synthesis Example 2

Synthesis of Compound 2-1

Compound 2-1 is synthesized according to the following reaction scheme.

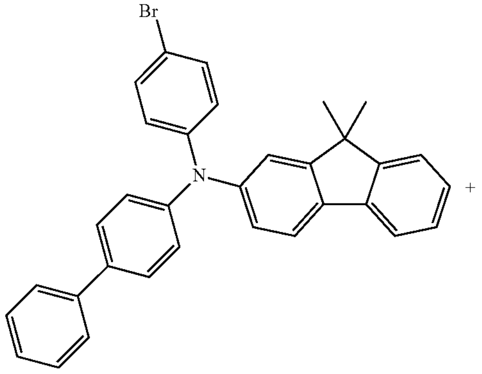

-continued

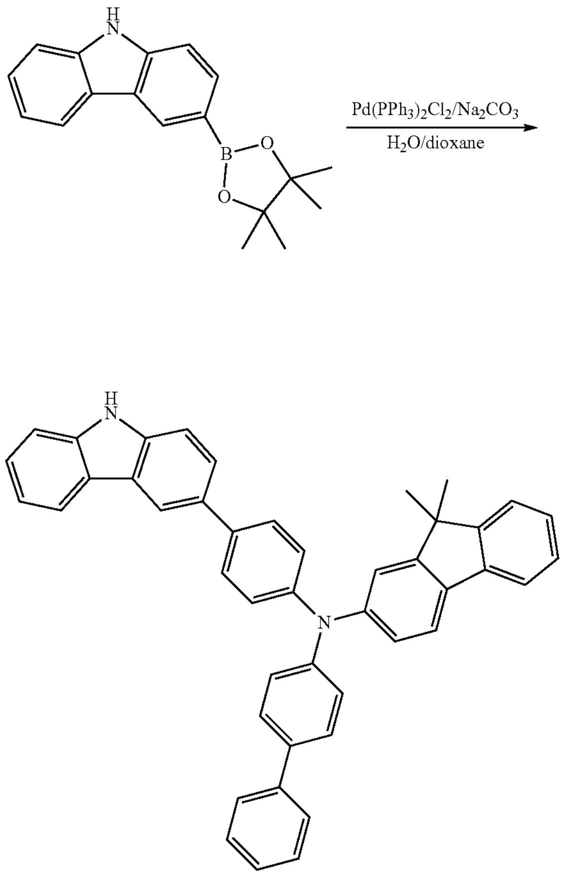

Compound 2-1

Specifically, 2-amino-N-[(1,1'-biphenyl)-4-yl]-N-(4-bromophenyl)-9,9-dimethyl fluorene (15.00 g, 29.04 mmol), 3-(4,4,5,5,-tetramethyl-1,3,2-dioxaborolan-2-yl)carbazole (7.66 g, 26.14 mmol), bis(triphenylphosphine)palladium(II) dichloride (0.41 g, 0.58 mmol), sodium carbonate (7.70 g, 72.61 mmol), dioxane (290 mL), and water (145 mL) are added to a reaction vessel under an argon atmosphere and mixed.

Then, the mixture is stirred at 85° C. for 4 hours and after completion of the reaction, the reaction mixed solution is allowed to be cooled to room temperature. The reaction mixed solution is filtered using Celite and impurities are separated. The solvent is removed from the filtrate by distillation, and then the resultant is purified with a column chromatography to obtain Compound 2-1 (12.7 g).

The structure of Compound 2-1 is identified using a nuclear magnetic resonance device ($^1$H-NMR).

Synthesis of Compound 2

Compound 2 is synthesized according to the following reaction scheme.

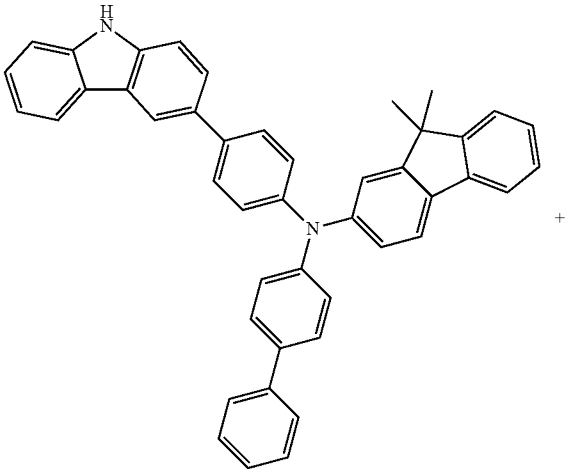

Compound 2-1

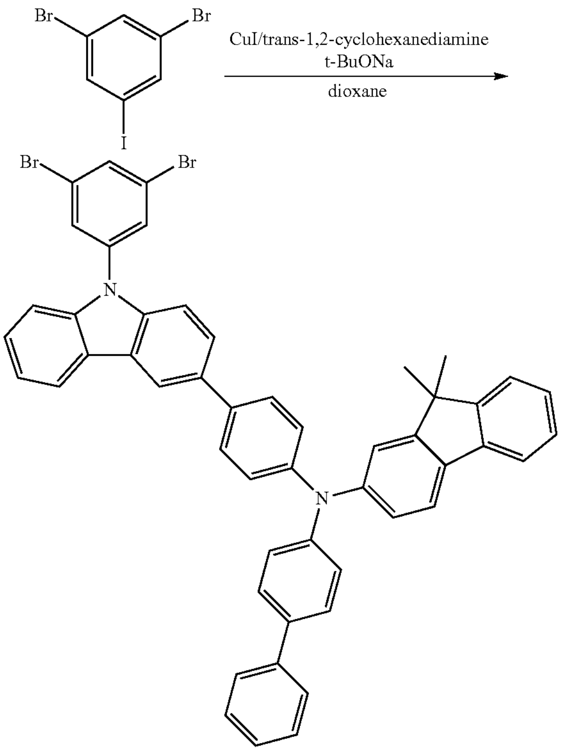

Compound 2

Specifically, Compound 2-1 (7.00 g, 11.6 mmol), 1,3-dibromo-5-iodine benzene (4.62 g, 12.77 mmol), copper (I) iodide (0.11 g, 0.58 mmol), trans-1,2-cyclohexanediamine (0.29 g, 2.55 mmol), sodium tert-butoxide (2.23 g, 23.23 mmol), and dioxane (35 mL) are added to a reaction vessel under an argon atmosphere and mixed. Then, the mixture is stirred at 90° C. for 6 hours, and after completion of the reaction, the reaction mixed solution is allowed to be cooled to room temperature.

The reaction mixed solution is filtered using Celite and impurities are separated. The solvent is removed from the filtrate by distillation, and then the resultant is purified with a column chromatography to obtain Compound 2 (6 g).

The structure of Compound 2 is identified using a nuclear magnetic resonance device ($^1$H-NMR).

Synthesis Example 3

Compound 3 is synthesized according to the following reaction scheme.

allowed to be cooled to room temperature. The reaction mixed solution is filtered using Celite and impurities are separated. The solvent is removed from the filtrate by

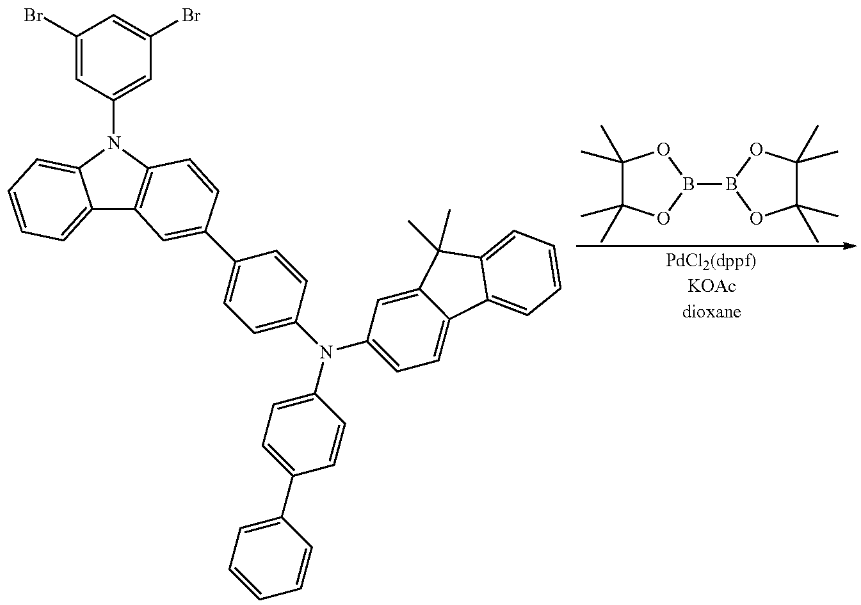

Compound 2

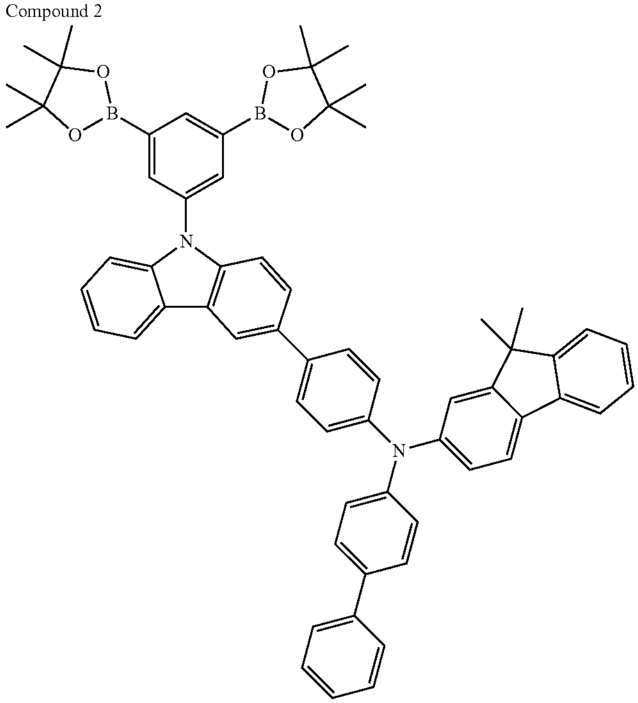

Compound 3

Specifically, Compound 2 (4.00 g, 4.78 mmol), bis(pinacolato)diboron (3.64 g, 14.34 mmol), potassium acetate (2.82 g, 28.69 mmol), [bis(diphenylphosphino)ferrocene] dichloropalladium (0.11 g, 0.13 mmol), and dioxane (50 mL) are added to a reaction vessel under an argon atmosphere and mixed.

Then, the mixture is stirred at 90° C. for 6 hours, and after completion of the reaction, the reaction mixed solution is distillation, and then the resultant is purified with a column chromatography to obtain Compound 3 (3 g).

The structure of Compound 3 is identified using a nuclear magnetic resonance device ($^1$H-NMR).

Synthesis Example 4

Compound 4 is synthesized according to the following reaction scheme.

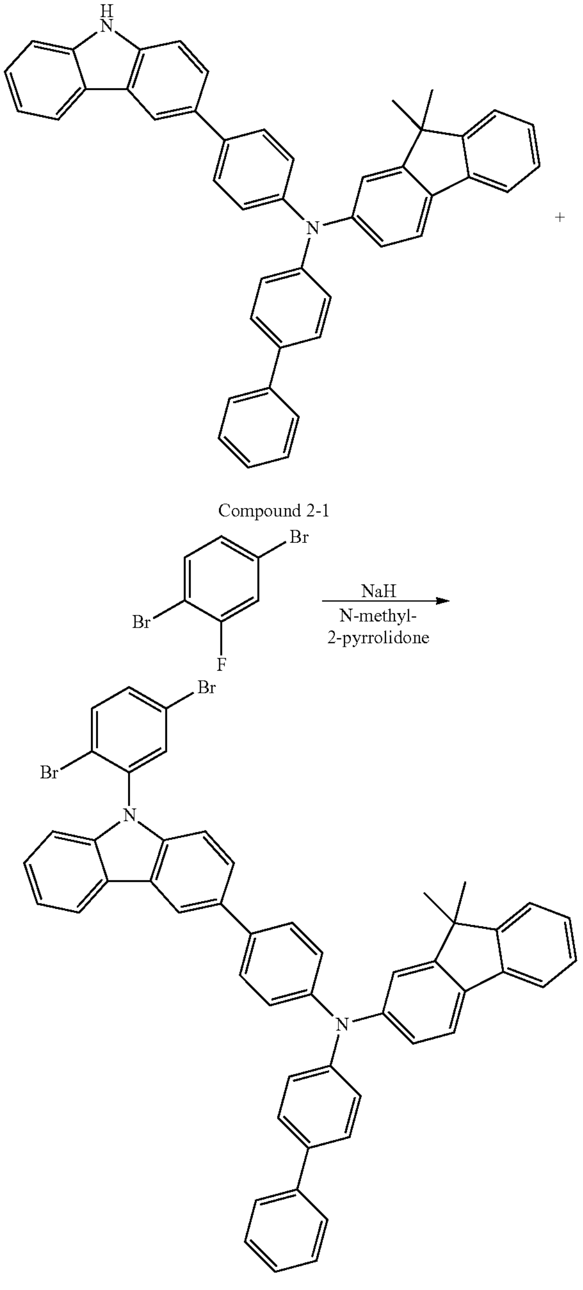

Compound 2-1

Compound 4

Specifically, Compound 2-1 (7.00 g, 11.6 mmol), 1,4-dibromo-2-fluorobenzene (3.04 g, 12.0 mmol), and N-methyl-2-pyrrolidone (NMP) 100 mL are added to a reaction vessel under an argon atmosphere and mixed at room temperature. Then, sodium hydride (content 60%, 0.478 g, 12.0 mmol) is added and mixed. Then, the mixture is stirred at 180° C. for 5 hours, and after completion of the reaction, the reaction mixed solution is allowed to be cooled to room temperature. 100 mL of toluene is added and the mixture is transferred to a separating funnel, and is three times washed with 100 ml of water. Then, the solvent is removed from the reaction mixture by distillation and the resultant is purified with a column chromatography to obtain Compound 4 (6.08 g).

Synthesis Example 5

Synthesis of Compound 5-1

Compound 5-1 is synthesized according to the following reaction scheme.

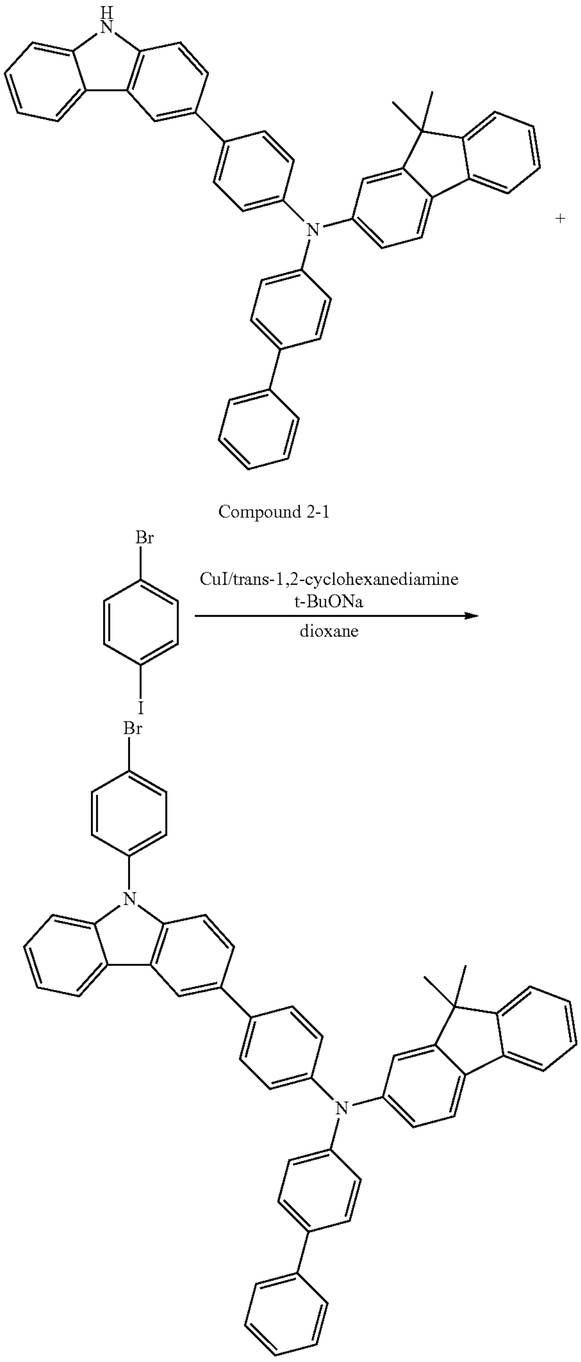

Compound 2-1

Compound 5-1

Specifically, Compound 2-1 (4.0 g, 6.6 mmol), 1-bromo-4-iodine benzene (2.07 g, 7.3 mmol), copper (I) iodide (0.046 g, 0.24 mmol), sodium tert-butoxide (0.88 g, 9.2 mmol), and dioxane (40 mL) are added to a reaction vessel under an argon atmosphere and mixed. Then, the mixture is stirred at 90° C. for 11 hours, and after completion of the reaction, the reaction mixed solution is allowed to be cooled to room temperature. The reaction mixed solution is filtered using Celite and impurities are separated. The solvent is removed from the filtrate by distillation, and then the resultant is purified with a column chromatography to obtain Compound 5-1 (3 g).

Synthesis of Compound 5-2

Compound 5-2 is synthesized according to the following reaction scheme.

Specifically, Compound 5-1 (2.5 g, 3.3 mmol) bis(pinacolato)diboron (1.01 g, 4.0 mmol), potassium acetate (1.21 g, 12.4 mmol), [bis(diphenylphosphino)ferrocene]dichloro palladium (0.049 g, 0.06 mmol), and dioxane (80 mL) are added to a reaction vessel under an argon atmosphere and mixed. Then, the mixture is stirred at 90° C. for 12 hours, and after completion of the reaction, the reaction mixed solution is allowed to be cooled to room temperature. The reaction mixed solution is filtered using Celite and impuri-

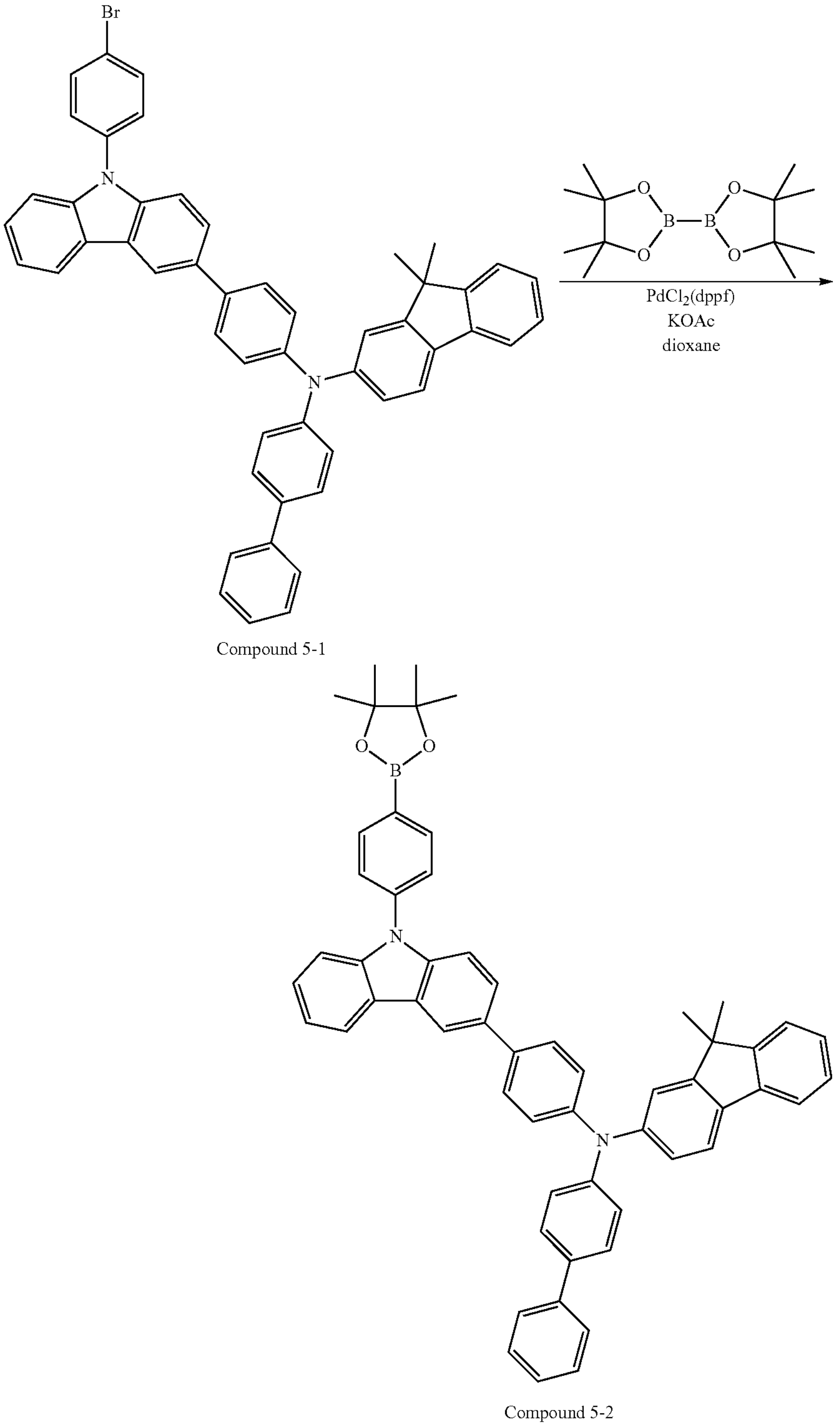

Compound 5-1

Compound 5-2 ties are separated. The solvent is removed from the filtrate by distillation, and then the resultant is purified with a column chromatography to obtain Compound 5-2 (1.5 g).

Synthesis of Compound 5

Compound 5 is synthesized according to the following reaction scheme.

Specifically, Compound 5-2 (1.4 g, 1.74 mmol), 1,4-dibromo-2-iodine benzene (0.65 g, 1.8 mmol), dioxane (50 mL), [tetrakis(triphenylphosphine)]palladium (0.020 g, 0.018 mmol), sodium carbonate (0.19 g, 1.8 mmol), and 100 mL of water are added to a reaction vessel under an argon atmosphere and mixed. Then, the mixture is stirred at 85° C. for 34 hours, and after completion of the reaction, the

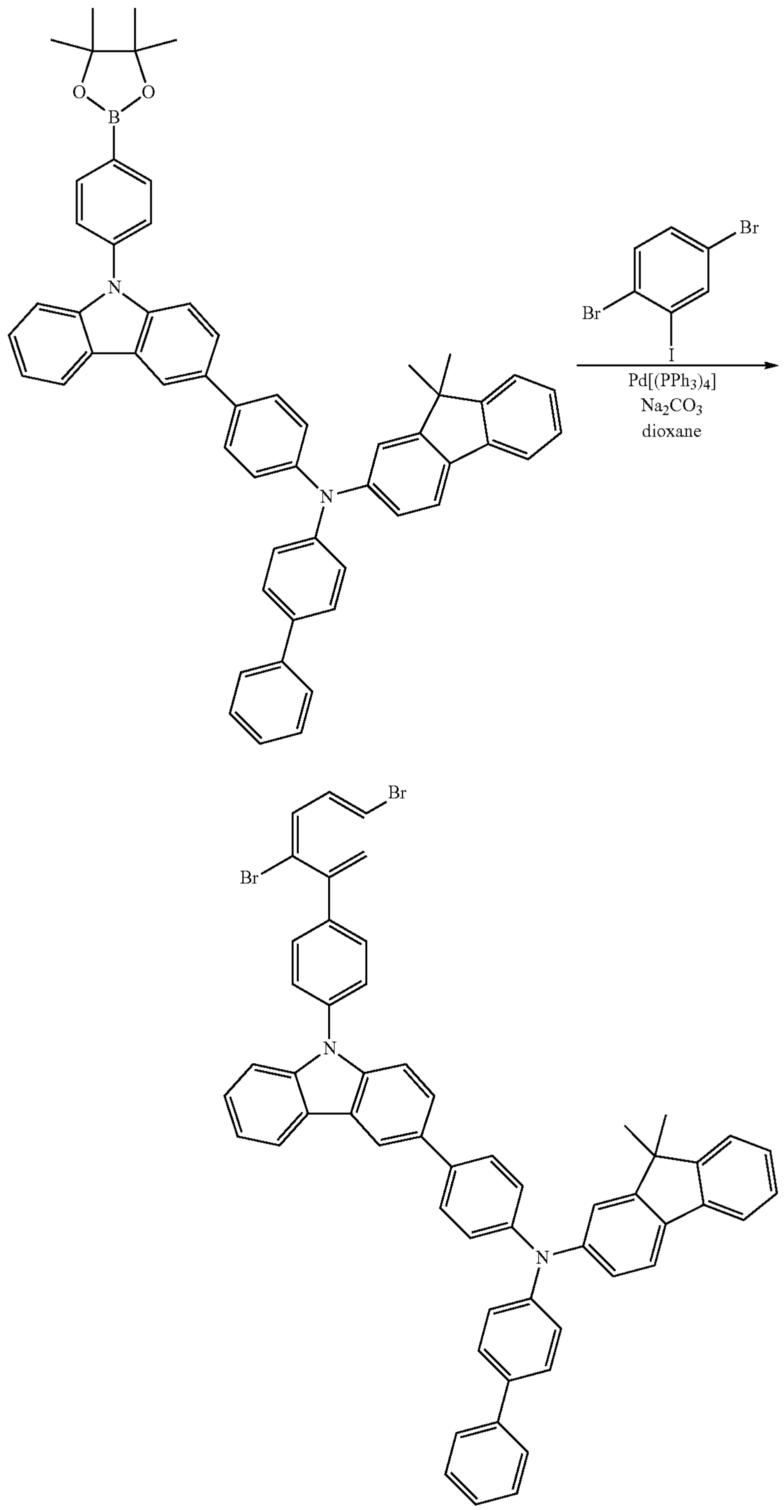

reaction mixed solution is allowed to be cooled to room temperature. The reaction mixed solution is filtered using Celite and impurities are separated. The solvent is removed from the filtrate by distillation, and then the resultant is purified with a column chromatography to obtain Compound 5 (0.6 g).

Example 1

Polymer material A-1 having the following structural unit at a composition ratio (molar ratio) is synthesized using Compound 1 synthesized in Synthesis Example 1 and Compound 2 synthesized in Synthesis Example 2.

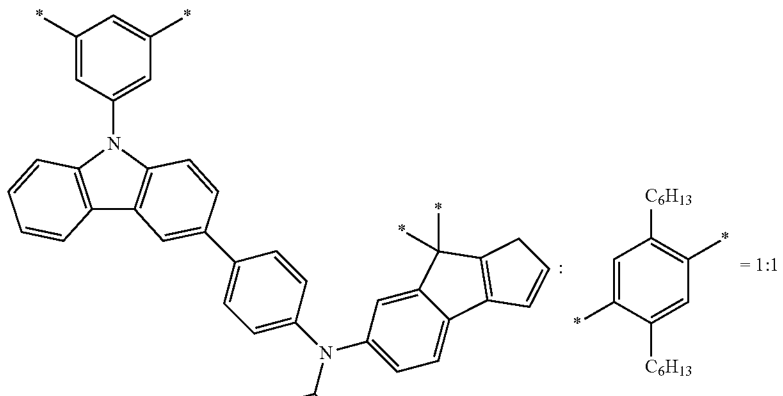

[X] [Y]

Specifically, Compound 1 (1.96 g), Compound 2 (2.58 g), palladium acetate (4.3 mg), tris(2-methoxyphenyl)phosphine (27.0 mg), 55 mL of toluene, and 20 mass % of a tetraethylammonium hydroxide aqueous solution (15.2 g) are added to a reaction vessel under an argon atmosphere and heated while refluxing for 8 hours. Then, phenylboronic acid (0.023 g), palladium acetate (4.3 mg), tris(2-methoxyphenyl)phosphine (27.0 mg), and 20 mass % of a tetraethylammonium hydroxide aqueous solution (15.2 g) are added thereto and heated while refluxing for 7 hours. Then, sodium N,N-diethyldithiocarbamate trihydrate (5.4 g) and 50 mL of ion-exchanged water are added to the reaction mixture except for an aqueous layer, and the mixture is stirred at 85° C. for 2 hours. The reaction mixture is separated into an organic layer and an aqueous layer, and then the organic layer is sequentially washed using water, 3 mass % of an acetic acid solution, and water. The organic layer is dropped into methanol, precipitated, separated by filtration, and then dried to obtain a crude product. The crude product is dissolved in toluene and purified using a column chromatograph packed with silica gel/alumina, and then the solvent is distilled off under a reduced pressure. The obtained liquid is dropped on methanol, precipitated, separated by filtration, and dried to obtain Polymer Material A-1 (1.14 g).

Polymeric Material A-1 is expected to be an alternating polymer having a structure in which each of structural units are alternately bonded with each other at the above-mentioned composition (the structural unit derived from Compound 1:the structural unit derived from Compound 2=1:1 (molar ratio)) from the addition ratio of the monomers. The number average molecular weight ($M_n$), the weight average molecular weight ($M_w$) and the molecular weight distribution ($M_w/M_n$) of Polymeric Material A-1 are estimated using a size exclusion chromatography (SEC) and the results are $M_n$=44,000 g/mol, $M_w$=80,000 g/mol, and $M_w/M_n$=1.83.

Example 2

Polymeric Material A-2 having the following structural unit at the composition ratio (molar ratio) is synthesized using Compound 3 synthesized in Synthesis Example 3 and p-diiodobenzene.

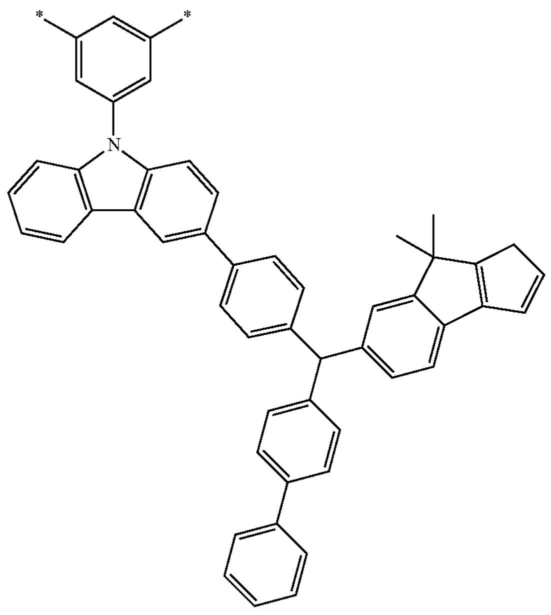

[X]

:

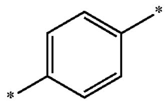

[Y]

= 1:1

Specifically, Compound 3 (2.53 g), p-diiodinebenzene (3.30 g), palladium acetate (4.3 mg), tris(2-methoxyphenyl) phosphine (27.0 mg), 55 mL of toluene, and 20 mass % of a tetraethylammonium hydroxide aqueous solution (15.2 g) are added under an argon atmosphere and heated while refluxing for 8 hours.

Then, phenylboronic acid (0.023 g), palladium acetate (4.3 mg), tris(2-methoxyphenyl)phosphine (27.0 mg), and 20 mass % of a tetraethylammonium hydroxide aqueous solution (15.2 g) are added thereto and heated while refluxing for 7 hours. Then, sodium N,N-diethyldithiocarbamate trihydrate (5.4 g) and 50 mL of ion-exchanged water are added to the reaction mixture except for an aqueous layer, and the mixture is stirred at 85° C. for 2 hours. The reaction mixture is separated into an organic layer and an aqueous layer, and then the organic layer is sequentially washed using water, 3 mass % of an acetic acid solution, and water.

The organic layer is dropped into methanol, precipitated, separated by filtration, and then dried to obtain a crude product. The crude product is dissolved in toluene and purified using a column chromatograph packed with silica gel/alumina, and then the solvent is distilled off under a reduced pressure. The obtained liquid is dropped on methanol, precipitated, separated by filtration, and dried to obtain Polymer Material A-2 (0.8 g).

Polymeric Material A-2 is expected to be an alternating polymer having a structure in which each of structural units are alternately bonded with each other at the above-mentioned composition (the structural unit derived from Compound 3:the structural unit derived from p-diiodinebenzene=1:1 (molar ratio)) from the addition ratio of the monomers. The number average molecular weight ($M_n$), the weight average molecular weight ($M_w$) and the molecular weight distribution ($M_w/M_n$) of Polymeric Material A-2 are estimated using a size exclusion chromatography (SEC) and the results are $M_n$=14,000 g/mol, $M_w$=26,000 g/mol, and $M_w/M_n$=1.88.

Example 3

Polymeric Material A-3 having the following structural unit at the composition ratio (molar ratio) is synthesized using Compound 3 synthesized in Synthesis Example 3 and 3,5-dibromobiphenyl.

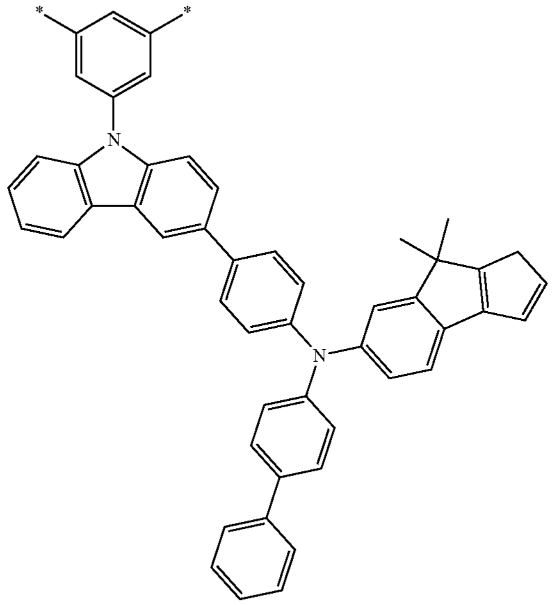

[X]

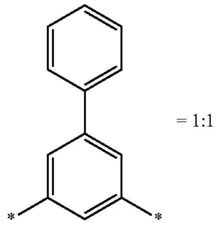

[Y]

Specifically, Compound 3 (3.21 g, 3.45 mmol), 3,5-dibromobiphenyl (1.08 g), palladium acetate (5.5 mg), tris (2-methoxyphenyl)phosphine (34.3 mg), 55 mL of toluene, and 20 mass % of tetraethylammonium hydroxide aqueous solution (19.3 g) are added under an argon atmosphere and heated while refluxing for 8 hours. Then, phenylboronic acid (0.023 g), palladium acetate (4.3 mg), tris(2-methoxyphenyl)phosphine (27.0 mg), and 20 mass % of tetraethylammonium hydroxide aqueous solution (15.2 g) are added thereto and heated while refluxing for 7 hours.

Then, sodium N,N-diethyldithiocarbamate trihydrate (5.4 g) and 50 mL of ion-exchanged water are added to the reaction mixture except for an aqueous layer, and the mixture is stirred at 85° C. for 2 hours. The reaction mixture is separated into an organic layer and an aqueous layer, and then the organic layer is sequentially washed using water, 3 mass % of an acetic acid solution, and water.

The organic layer is dropped into methanol, precipitated, separated by filtration, and then dried to obtain a crude product. The crude product is dissolved in toluene and purified using a column chromatograph packed with silica gel/alumina, and then the solvent is distilled off under a reduced pressure. The obtained liquid is dropped on methanol, precipitated, separated by filtration, and dried to obtain Polymer Material A-3 (0.17 g).

Polymeric Material A-3 is expected to be an alternating polymer having a structure in which each of structural units are alternately bonded with each other at the above-mentioned composition (the structural unit derived from Compound 3:the structural unit derived from 3,5-dibromobiphenyl=1:1 (molar ratio)) from the addition ratio of the monomers. The number average molecular weight ($M_n$), the weight average molecular weight ($M_w$) and the molecular weight distribution ($M_w/M_n$) of Polymeric Material A-3 are estimated using a size exclusion chromatography (SEC) and the results are $M_n$=15,200 g/mol, $M_w$=33,500 g/mol, and $M_w/M_n$=2.20.

Example 4

Polymeric Material A-4 having the following structural unit at the composition ratio (molar ratio) is synthesized using Compound 3 synthesized in Synthesis Example 3 and 1,3-dibromo-5-dodecyl benzene.

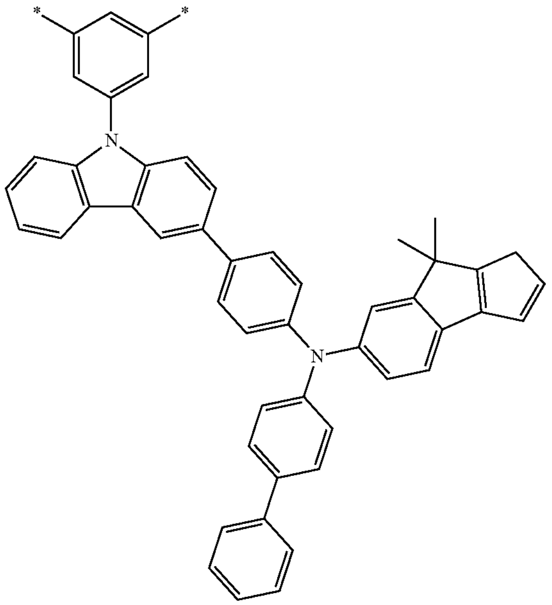

[X]

:

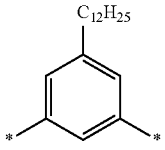

[Y]

= 1:1

Specifically, Compound 3 (1.60 g, 1.71 mmol), 1,3-dibromo-5-dodecylbenzene (0.84 g), palladium acetate (2.2 mg), tris(2-methoxyphenyl)phosphine (13.5 mg), 55 mL of toluene, and 20 mass % of a tetraethylammonium hydroxide aqueous solution (7.10 g) are added under an argon atmosphere and heated while refluxing for 8 hours.

Then, phenylboronic acid (0.023 g), palladium acetate (4.3 mg), tris(2-methoxyphenyl)phosphine (27.0 mg), and 20 mass % of tetraethylammonium hydroxide aqueous solution (15.2 g) are added thereto and heated while refluxing for 7 hours. Then, sodium N,N-diethyldithiocarbamate trihydrate (5.4 g) and 50 mL of ion-exchanged water are added to the reaction mixture except for an aqueous layer, and the mixture is stirred at 85° C. for 2 hours. The reaction mixture is separated into an organic layer and an aqueous layer, and then the organic layer is sequentially washed using water, 3 mass % of an acetic acid solution, and water.

The organic layer is dropped into methanol, precipitated, separated by filtration, and then dried to obtain a crude product. The crude product is dissolved in toluene and purified using a column chromatograph packed with silica gel/alumina, and then the solvent is distilled off under a reduced pressure. The obtained liquid is dropped on methanol, precipitated, separated by filtration, and dried to obtain Polymer Material A-4 (0.98 g).

Polymeric Material A-4 is expected to be an alternating polymer having a structure in which each of structural units are alternately bonded with each other at the above-mentioned composition (the structural unit derived from Compound 3:the structural unit derived from 1,3-dibromo-5-dodecylbenzene=1:1 (molar ratio)) from the addition ratio of the monomers. The number average molecular weight ($M_n$), the weight average molecular weight ($M_w$) and the molecular weight distribution ($M_w/M_n$) of Polymeric Material A-4 are estimated using a size exclusion chromatography (SEC) and the results are $M_n$=7,300 g/mol, $M_w$=16,100 g/mol, and $M_w/M_n$=2.18.

Example 5

Polymeric Material A-5 having the following structural unit at the composition ratio (molar ratio) is synthesized using Compound 4 synthesized in Synthesis Example 4 and 1,4-dibromo-2-iodobenzene.

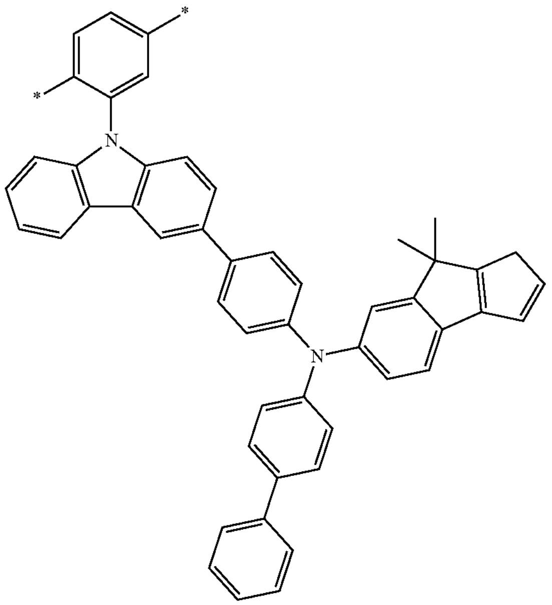

[X]

:

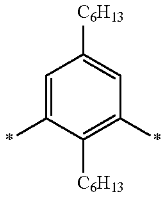

[Y]

= 1:1

Specifically, Compound 4 (2.58 g, 3.08 mmol), Compound 1 (1.54 g), palladium acetate (4.3 mg), tris(2-methoxyphenyl)phosphine (27.0 mg), 55 mL of toluene, and 20 mass % of a tetraethylammonium hydroxide aqueous solution (15.2 g) are added under an argon atmosphere and heated while refluxing for 8 hours.

Then, phenylboronic acid (0.023 g), palladium acetate (4.3 mg), tris(2-methoxyphenyl)phosphine (27.0 mg), and 20 mass % of tetraethylammonium hydroxide aqueous solution (15.2 g) are added thereto and heated while refluxing for 7 hours. Then, sodium N,N-diethyldithiocarbamate trihydrate (5.4 g) and 50 mL of ion-exchanged water are added to the reaction mixture except for an aqueous layer, and the mixture is stirred at 85° C. for 2 hours. The reaction mixture is separated into an organic layer and an aqueous layer, and then the organic layer is sequentially washed using water, 3 mass % of an acetic acid solution, and water.

The organic layer is dropped into methanol, precipitated, separated by filtration, and then dried to obtain a crude product. The crude product is dissolved in toluene and purified using a column chromatograph packed with silica gel/alumina, and then the solvent is distilled off under a reduced pressure. The obtained liquid is dropped on methanol, precipitated, separated by filtration, and dried to obtain Polymer Material A-5 (0.84 g).

Polymeric Material A-5 is expected to be an alternating polymer having a structure in which each of structural units are alternately bonded with each other at the above-mentioned composition (the structural unit derived from Compound 4:the structural unit derived from Compound 1=1:1 (molar ratio)) from the addition ratio of the monomers. The number average molecular weight ($M_n$), the weight average molecular weight ($M_w$) and the molecular weight distribution (Mw/Mn) of Polymeric Material A-5 are estimated using a size exclusion chromatography (SEC) and the results are $M_n$=29,300 g/mol, $M_w$=77,500 g/mol, and $M_w/M_n$=2.64.

Example 6

Polymeric Material A-6 having the following structural unit at the composition ratio (molar ratio) is synthesized using Compound 1 synthesized in Synthesis Example 1, Compound 2 synthesized in Synthesis Example 2, and 1,3-dibromoazulene.

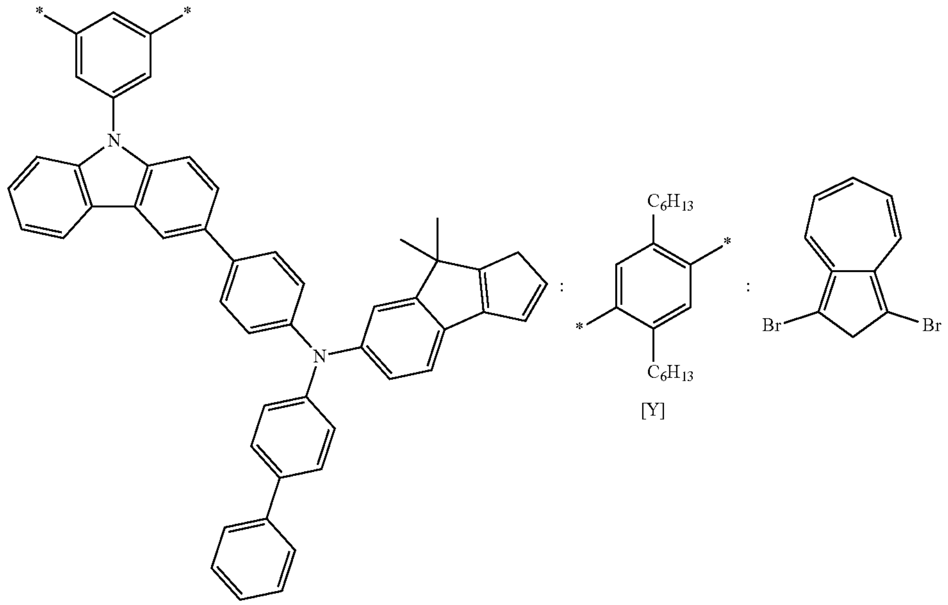

[Y]

[X]

= 50:48.5:1.5

Specifically, Compound 2 (2.10 g, 2.26 mmol), Compound 1 (0.89 g, 2.19 mmol), 1,3-dibromoazulene (19.4 mg), palladium acetate (4.4 mg), tris(2-methoxyphenyl) phosphine (27.8 mg), 55 mL of toluene and 20 mass % of a tetraethylammonium hydroxide aqueous solution (15.7 g) are added under an argon atmosphere and heated while refluxing for 8 hours. Then, phenylboronic acid (0.023 g), palladium acetate (4.3 mg), tris(2-methoxyphenyl)phosphine (27.0 mg), and 20 mass % of tetraethylammonium hydroxide aqueous solution (15.2 g) are added thereto and heated while refluxing for 7 hours. Then, sodium N,N-diethyldithiocarbamate trihydrate (5.4 g) and 50 mL of ion-exchanged water are added to the reaction mixture except for an aqueous layer, and the mixture is stirred at 85° C. for 2 hours. The reaction mixture is separated into an organic layer and an aqueous layer, and then the organic layer is sequentially washed using water, 3 mass % of an acetic acid solution, and water.

The organic layer is dropped into methanol, precipitated, separated by filtration, and then dried to obtain a crude product. The crude product is dissolved in toluene and purified using a column chromatograph packed with silica gel/alumina, and then the solvent is distilled off under a reduced pressure. The obtained liquid is dropped on methanol, precipitated, separated by filtration, and dried to obtain Polymer Material A-6 (0.47 g).

Polymeric Material A-6 is expected to be an alternating polymer having a structure in which each of the structural unit derived from Compound 2 and the structural unit derived from Compound 1 and the structural unit derived from 1,3-dibromoazulene are alternately bonded with each other at the above-mentioned composition (the structural unit derived from Compound 2:the structural unit derived from Compound 1:the structural unit derived from 1,3-dibromoazulene=48.5:50:1.5 (molar ratio)). The number average molecular weight ($M_n$), the weight average molecular weight ($M_w$) and the molecular weight distribution ($M_w/M_n$) of Polymeric Material A-6 are estimated using a size exclusion chromatography (SEC) and the results are $M_n$=28200 g/mol, $M_w$=41,500 g/mol, and $M_w/M_n$=1.47.

Example 7

Polymeric Material A-7 having the following structural unit at the composition ratio (molar ratio) is synthesized using Compound 2 synthesized in Synthesis Example 2 and 2,7-dibromo-9,9-di-n-octylfluorene.

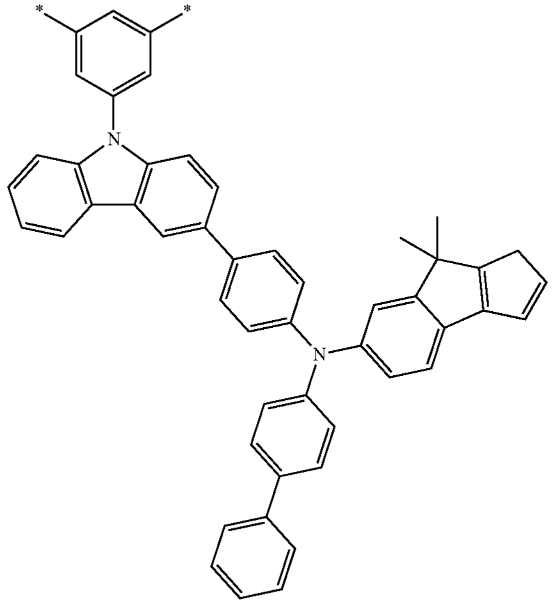

[X]

:

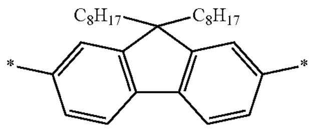

= 1:1

[Y]

Specifically, Compound 2 (2.00 g, 2.19 mmol), 2,7-dibromo-9,9-di-n-octylfluorene (1.20 g), palladium acetate (3.4 mg), tris(2-methoxyphenyl)phosphine (21.3 mg), 50 mL of toluene, and 20 mass % of a tetraethylammonium hydroxide aqueous solution (15.2 g) are added under an argon atmosphere and heated while refluxing for 8 hours. Then, phenylboronic acid (0.023 g), palladium acetate (4.3 mg), tris(2-methoxyphenyl)phosphine (27.0 mg), and 20 mass % of a tetraethylammonium hydroxide aqueous solution (12.0 g) are added thereto and heated while refluxing for 7 hours. Then, sodium N,N-diethyldithiocarbamate trihydrate (5.4 g) and 50 mL of ion-exchanged water are added to the reaction mixture except for an aqueous layer, and the mixture is stirred at 85° C. for 2 hours. The reaction mixture is separated into an organic layer and an aqueous layer, and then the organic layer is sequentially washed using water, 3 mass % of an acetic acid solution, and water.

The organic layer is dropped into methanol, precipitated, separated by filtration, and then dried to obtain a crude product. The crude product is dissolved in toluene and purified using a column chromatograph packed with silica gel/alumina, and then the solvent is distilled off under a reduced pressure. The obtained liquid is dropped on methanol, precipitated, separated by filtration, and dried to obtain Polymer Material A-7 (1.2 g).

Polymeric Material A-7 is expected to be an alternating polymer having a structure in which each of structural units are alternately bonded with each other at the above-mentioned composition (the structural unit derived from Compound 2:the structural unit derived from 2,7-dibromo-9,9-di-n-octyl fluorene=1:1 (molar ratio)) from the addition ratio of the monomers. The number average molecular weight ($M_n$), the weight average molecular weight ($M_w$) and the molecular weight distribution ($M_w/M_n$) of Polymeric Material A-7 are estimated using a size exclusion chromatography (SEC) and the results are $M_n$=61,000 g/mol, $M_w$=133,000 g/mol, and $M_w/M_n$=1.86.

Example 8

Polymeric Material A-8 having the following structural unit at the composition ratio (molar ratio) is synthesized using Compound 5 synthesized in Synthesis Example 5 and Compound 1 synthesized in Synthesis Example 1.

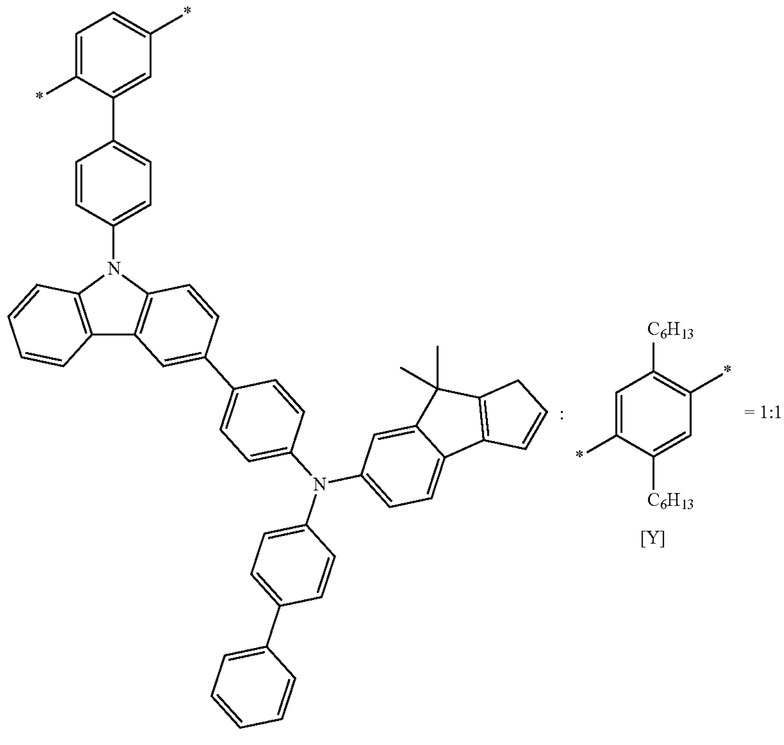

[X] [Y]

Specifically, Compound 5 (2.00 g, 2,19 mmol), Compound 1 (1.09 g), palladium acetate (3.4 mg), tris(2-methoxyphenyl)phosphine (21.3 mg), 55 mL of toluene, and 20 mass % of a tetraethylammonium hydroxide aqueous solution (12.0 g) are added under an argon atmosphere and heated while refluxing for 8 hours. Then, phenylboronic acid (0.023 g), palladium acetate (4.3 mg), tris(2-methoxyphenyl)phosphine (27.0 mg), and 20 mass % of tetraethylammonium hydroxide aqueous solution (15.2 g) are added thereto and heated while refluxing for 7 hours. Then, sodium N,N-diethyldithiocarbamate trihydrate (5.4 g) and 50 mL of ion-exchanged water are added to the reaction mixture except for an aqueous layer, and the mixture is stirred at 85° C. for 2 hours. The reaction mixture is separated into an organic layer and an aqueous layer, and then the organic layer is sequentially washed using water, 3 mass % of an acetic acid solution, and water.

The organic layer is dropped into methanol, precipitated, separated by filtration, and then dried to obtain a crude product. The crude product is dissolved in toluene and purified using a column chromatograph packed with silica gel/alumina, and then the solvent is distilled off under a reduced pressure. The obtained liquid is dropped on methanol, precipitated, separated by filtration, and dried to obtain Polymer Material A-8 (1.19 g).

Polymeric Material A-8 is expected to be an alternating polymer having a structure in which each of structural units are alternately bonded with each other at the above-mentioned composition (the structural unit derived from Compound 5:the structural unit derived from Compound 1=1:1 (molar ratio)) from the addition ratio of the monomers. The number average molecular weight ($M_n$), the weight average molecular weight ($M_w$) and the molecular weight distribution ($M_w/M_n$) of Polymeric Material A-8 are estimated using a size exclusion chromatography (SEC) and the results are $M_n$=29,000 g/mol, $M_w$=70,000 g/mol, and $M_w/M_n$=2.41.

Each of Polymeric Material A-1 to Polymeric Material A-8 obtained in Examples 1 to 8 and poly[(9,9-dioctyl fluorenyl-2,7-diyl)-co-(4,4'-(N-(4-sec-butylphenyl)diphenylamine)] (TFB) having the following structural unit (Luminescence Technology, a polymer material of Comparative Example 1) are measured with respect to HOMO levels and lowest occupied molecular orbital level (Hereinafter, referred to as a LUMO level).

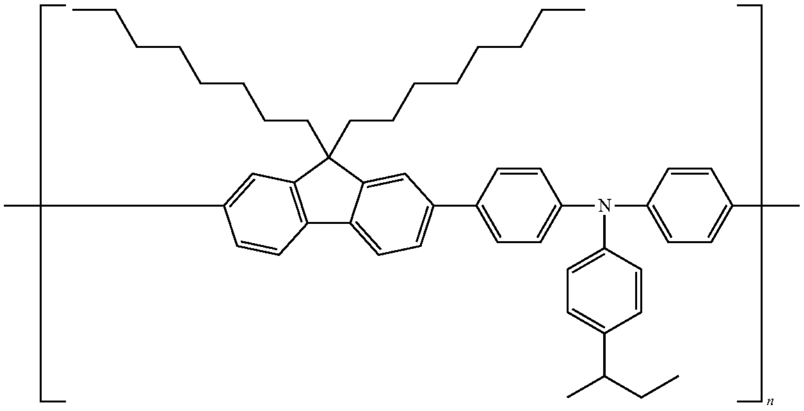

TFB

HOMO Level Measurement Method

Each polymer material is dissolved in xylene to prepare a coating solution so that a concentration may be 1 mass %.

On the ITO-adhered glass substrate cleaned with ultraviolet rays, the prepared coating solution is spin-coated at a rotation rate of 2000 revolutions per minute (rpm) to form a film, and then dried on a hot plate at 150° C. for 30 minutes to prepare test specimens.

Measure the HOMO levels of the specimens using an atmospheric photoelectronic spectrometer (Riken Instruments, AC-3). Herein, the tangent intersection point of the rise is calculated from the measurement result and is referred to as a HOMO level.

On the other hand, the HOMO level normally has a negative value.

LUMO Level Measurement Method

Each polymer material is dissolved in toluene to prepare a coating solution so that a concentration may be 3.2 mass %.

On the ITO-adhered glass substrate cleaned with ultraviolet rays, the prepared coating solution is spin-coated at a rotation rate of 1600 rpm to form a film, and then dried on a hot plate at 250° C. for 60 minutes to prepare test specimens. Herein, a thickness of the formed film is about 70 nm. The obtained specimens are cooled to 77K (−196° C.), and photoluminescence spectra are measured. The LUMO level [eV] is calculated from peak values of the shortest wavelength side of the photoluminescence spectra. On the other hand, the LOMO level also has a negative value.

The HOMO levels and LUMO levels of the polymer materials are summarized in Table 1.

TABLE 1

| | Polymer Material | HOMO level [eV] | LUMO level [eV] |
|---|---|---|---|
| Example 1 | A-1 | 5.60 | 2.50 |
| Example 2 | A-2 | 5.65 | 2.54 |
| Example 3 | A-3 | 5.56 | 2.51 |
| Example 4 | A-4 | 5.55 | 2.48 |
| Example 5 | A-5 | 5.51 | 2.42 |
| Example 6 | A-6 | 5.60 | 2.54 |
| Example 7 | A-7 | 5.65 | 2.55 |
| Example 8 | A-8 | 5.52 | 2.48 |
| Comparative Example 1 | TFB | 5.48 | 2.60 |

From the results shown in Table 1, Polymer Materials A-1 to A-8 obtained in Examples 1 to 8 have a high HOMO level and a low LUMO level compared to the conventional polymer material (TFB) of Comparative Example 1.

Example 9

The ITO-adhered glass substrate on which ITO is patterned as the first electrode (anode) is sequentially cleaned with a neutral detergent, deionized water, water, and isopropyl alcohol, and ultraviolet-ozone treatment is performed. Then, PEDOT:PSS (Sigma-Aldrich) is spin-coated on the ITO-adhered glass substrate, followed by drying. As a result, a hole injection layer having a thickness (dry film thickness) of 30 nm is formed on the ITO-adhered glass substrate.

A toluene solution including 1.0 mass % of Polymer Material A-1 (hole transport material) of Example 1 is spin-coated on the hole injection layer, and then heat-treated at 150° C. for 30 minutes to form a hole transport layer. As a result, a hole transport layer having a thickness (dry film thickness) of 25 nm is formed on the hole injection layer.

Quantum dot dispersion including 1.0 mass % of a quantum dot (refer to FIG. 2) having a structure of ZnTeSe/ZnSe/ZnS (core/shell/shell) in cyclohexane in which the hole transport layer is not dissolved is spin-coated on the hole transport layer and the dried. As a result, a quantum dot light emitting layer having a thickness (dry film thickness) of 25 nm is formed on the hole transport layer. On the other hand, the light generated by irradiating ultraviolet rays to the quantum dot dispersion has a center wavelength of 458 nm and a full width at half max (FWHM) of 29 nm (refer to FIGS. 3 and 4).

Figure 2:
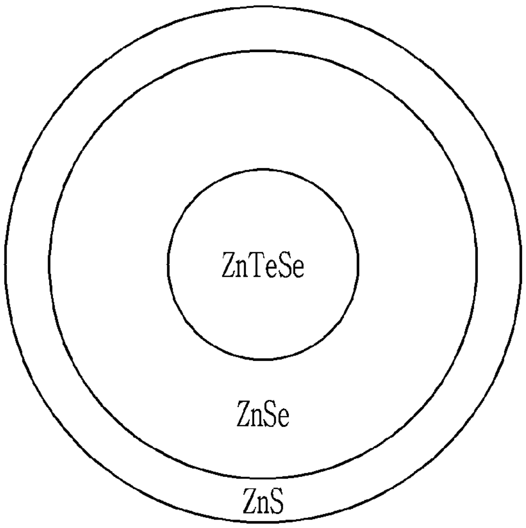
FIG. 2 is a schematic cross-sectional view of a structure of the quantum dot according to Example 9.
Figure 3:
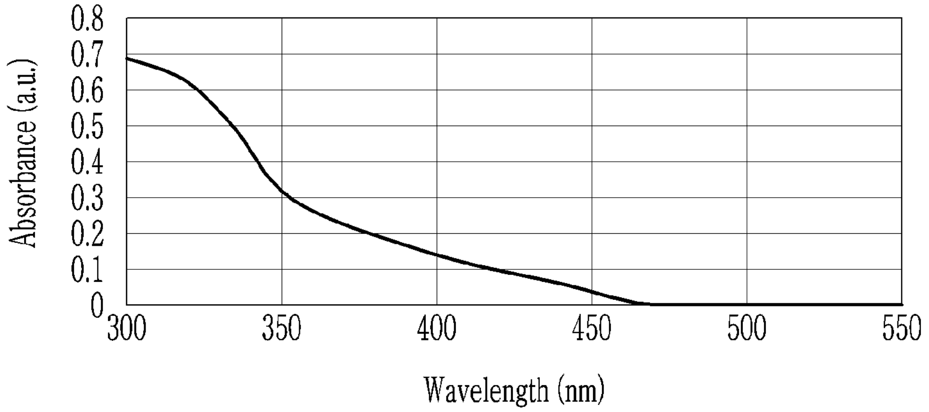
FIG. 3 is a graph of absorbance (arbitrary units, a.u.) versus wavelength (nanometers, nm) and shows an ultraviolet-visible (UV-vis) absorption spectrum of the quantum dot according to Example 9.
Figure 4:
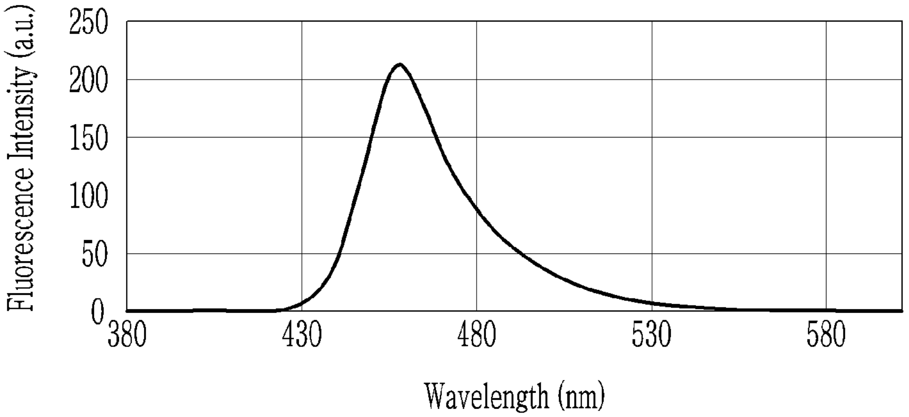
FIG. 4 is a graph of fluorescence intensity (a.u.) versus wavelength (nm) and shows a photoluminescence spectrum of the quantum dot according to Example 9.

FIG. 2 is a schematic cross-sectional view of a structure of the quantum dot according to Example 9, FIG. 3 shows an ultraviolet (UV) absorption spectrum of the quantum dot according to Example 9, and FIG. 4 shows a photoluminescence spectrum of the quantum dot according to Example 9.

After the quantum dot light emitting layer is completely dried, lithium quinolate (Liq) and TPBI (Sigma-Aldrich) as an electron transport material are co-deposited on the quantum dot light emitting layer using a vacuum deposition apparatus. As a result, an electron transport layer having a thickness of 36 nm is formed on the quantum dot light emitting layer.

Then, Liq is deposited on the electron transport layer by using a vacuum deposition apparatus. As a result, an electron injecting layer with a thickness of 0.5 nm is formed on the electron transport layer.

Then, aluminum is deposited on the electron injecting layer using a vacuum deposition apparatus. As a result, an electroluminescence device (quantum dot light emitting device) having a second electrode (cathode) with a thickness of 100 nm formed on the electron injecting layer is obtained.

Example 10 to Example 16

Electroluminescence devices (quantum dot light emitting devices) according to Example 10 to Example 16 are obtained according to the same method as in Example 9, except that Polymeric Material A-2 to Polymeric Material A-8 obtained in Examples 2 to 8 are used to form hole transport layers instead of Polymeric Material A-1.

Comparative Example 2

An electroluminescence device (a quantum dot light emitting device) according to Comparative Example 2 is obtained according to the same method as in Example 9, except that the polymer material (TFB) of Comparative Example 1 is used to form a hole transport layer instead of Polymeric Material A-1

Figure 5:
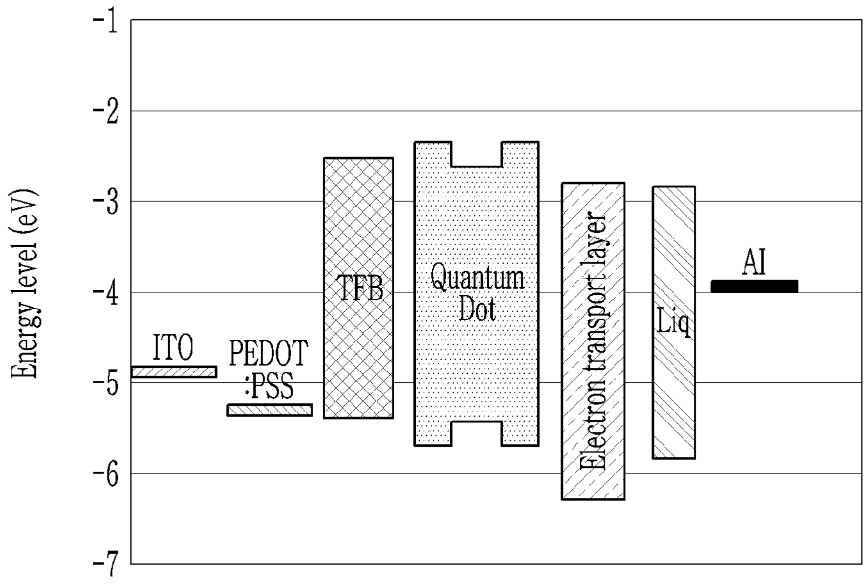
FIG. 5 shows an energy diagram for the energy levels (electron Volts, eV) of the electroluminescence device according to Comparative Example 2.
Figure 6:
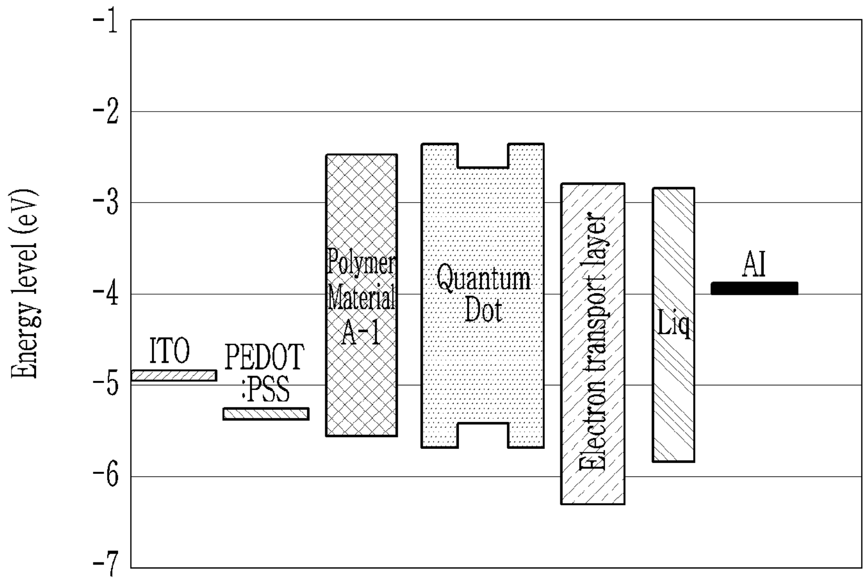
FIG. 6 shows an energy diagram for the energy levels (eV) of the electroluminescence device according to Example 9.

The energy diagrams of the electroluminescence devices according to Comparative Example 2 and Example 9 are shown in FIG. 5 (Comparative Example 2) and FIG. 6 (Example 9), respectively.

FIG. 5 shows an energy diagram of the electroluminescence device according to Comparative Example 2 and FIG. 6 shows an energy diagram of the electroluminescence device according to Example 9.

Evaluation Method of Light Emitting Device

Driving voltages and luminous efficiency of the electroluminescence devices according to Example 9 to Example 16 and Comparative Example 2 are evaluated.

When a voltage is applied to each electroluminescence device using a DC constant voltage power source (KEYENCE, source meter), a current starts to flow at a constant voltage, and the electroluminescence device emits light. Herein, a voltage at a current density of 5 milliamperes per square centimeter ($mA/cm^2$) is referred to as a driving voltage ($V_{op}$) [Volts, V].

Further, the current is gradually increased and the current is fixed/left at a point when the luminance reaches 100 nits (candela per square meter, $cd/m^2$). Herein, external quantum efficiency (EQE) at a luminance of 100 nits is calculated assuming that scattering radiation was performed in a spectral radiance luminance spectrum measured, and the luminous efficiency is evaluated.

$V_{op}$ and EQE evaluation results of the electroluminescence devices according to Examples 9 to 16 and Comparative Example 2 are summarized in Table 2. On the other hand, the EQE is converted into a relative value when the measured value of the electroluminescence device according to Comparative Example 2 is taken as 100.

TABLE 2

| | Hole transport material | Vop [V] | EQE [arbitrary unit] |
|---|---|---|---|
| Example 9 | Polymer Material A-1 | 4.25 | 181 |
| Example 10 | Polymer Material A-2 | 4.30 | 142 |
| Example 11 | Polymer Material A-3 | 4.13 | 170 |
| Example 12 | Polymer Material A-4 | 4.14 | 166 |
| Example 13 | Polymer Material A-5 | 4.21 | 182 |
| Example 14 | Polymer Material A-6 | 4.14 | 180 |
| Example 15 | Polymer Material A-7 | 4.12 | 168 |

TABLE 2-continued

| | Hole transport material | Vop [V] | EQE [arbitrary unit] |
|---|---|---|---|
| Example 16 | Polymer Material A-8 | 4.18 | 175 |
| Comparative Example 2 | TFB | 4.73 | 100 |

From the results of FIG. 5, FIG. 6, and Table 2, the electroluminescence devices according to Examples 9 to 16 using Polymer Material A-1 to Polymer Material A-8 as a hole transport material exhibit low Vop and high EQE.

On the other hand, the electroluminescence device according to Comparative Example 2 using poly((9,9-dioctylfluorenyl-2,7-diyl)-co-(4,4'-(N-(4-sec-butylphenyl)diphenylamine)) (TFB) as a hole transport material exhibits relatively high Vop and low EQE compared with examples.

As shown in Table 1, FIG. 5, and FIG. 6, the difference between examples and comparative examples is caused by that the HOMO levels of Polymer Material A-1 to Polymer Material A-8 are closer to the HOMO level of the quantum dot than the HOMO level of the TFB, and thus an energy barrier at the time of injecting holes from the hole transport layer into the quantum dots is reduced.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A polymer material comprising a structural unit represented by Chemical Formula 1:

$$-\!\!\!+X-Y+\!\!\!-$$ Chemical Formula 1 wherein, in Chemical Formula 1, each X is the same or different, and is represented by Chemical Formula 2, and each Y is the same or different, and is a substituted or unsubstituted C6 to C60 divalent aromatic cyclic group, a substituted or unsubstituted C6 to C60 divalent alicyclic cyclic group, a substituted or unsubstituted C3 to C60 divalent aromatic heterocyclic group, or a substituted or unsubstituted C3 to C60 divalent alicyclic heterocyclic group, Chemical Formula 2

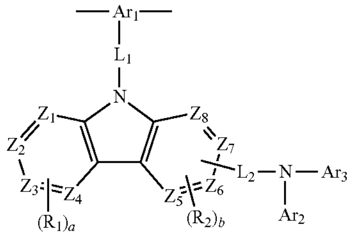

wherein, in Chemical Formula 2, $Ar_1$ is a substituted or unsubstituted C6 to C60 trivalent aromatic cyclic group, or a substituted or unsubstituted C3 to C60 trivalent aromatic heterocyclic group, $Ar_2$ and $Ar_3$ are each independently a substituted or unsubstituted C6 to C60 monovalent aromatic cyclic group, or a substituted or unsubstituted C3 to C60 monovalent aromatic heterocyclic group, $L_1$ and $L_2$ are each independently a single bond, a substituted or unsubstituted C6 to C60 divalent aromatic cyclic group, or a substituted or unsubstituted C3 to C60 divalent aromatic heterocyclic group, each $R_1$ and $R_2$ are the same or different, and are each independently a substituted or unsubstituted C1 to C20 alkyl group, a substituted or unsubstituted C1 to C20 alkoxy group, a substituted or unsubstituted C6 to C60 monovalent aromatic cyclic group, or a substituted or unsubstituted C3 to C60 monovalent aromatic heterocyclic group, or $R_1$ and $R_2$ are combined with each other to form one ring that is a pentagonal ring, a hexagonal ring, or a fused ring, a is an integer ranging from 0 to 4, b is an integer ranging from 0 to 3, and $Z_1$ to $Z_8$ are each independently a nitrogen atom or —CH=.

2. The polymer material of claim 1, wherein Y is a substituted or unsubstituted C6 to C60 divalent aromatic cyclic group, or a substituted or unsubstituted C3 to C60 divalent aromatic heterocyclic group.

3. The polymer material of claim 1, wherein X is a group represented by one of Chemical Formulae 2-1 to 2-6:

(2-1)

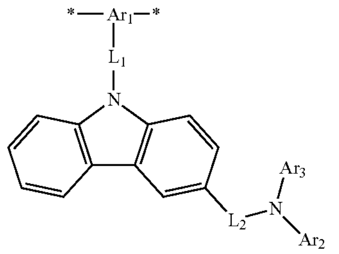

(2-2)

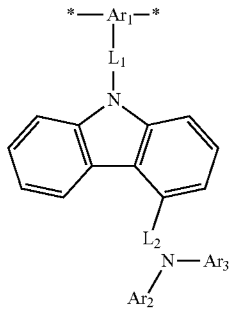

(2-3)

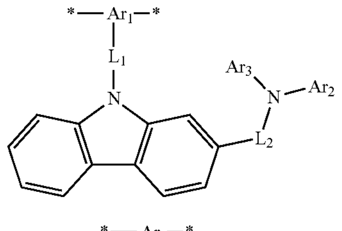

(2-4)

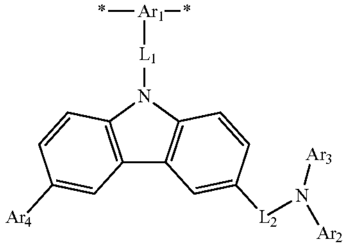

-continued (2-5)

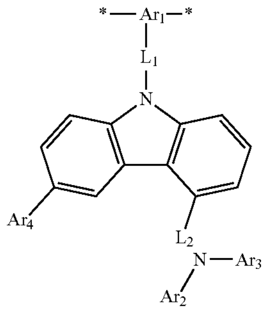

(2-6)

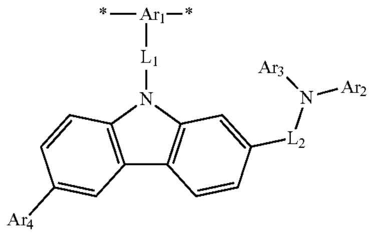

wherein, in Chemical Formulae 2-1 to 2-6, $Ar_1$, $Ar_2$, $Ar_3$, $L_1$, and $L_2$ are the same as in claim 1, $Ar_4$ is a substituted or unsubstituted C6 to C60 monovalent aromatic cyclic group, or a substituted or unsubstituted C3 to C60 monovalent aromatic heterocyclic group, and

* is a linking point.

4. The polymer material of claim 3, wherein $L_1$ and $L_2$ are each independently a single bond, a phenylene group, a biphenylene group, a fluorenylene group, a naphthylene group, an anthrylene group, a phenanthrylene group, a naphthacenylene group, a pyrenylene group, a terphenylene group, a tolylene group, a t-butyl phenylene group, or a (phenylpropyl)phenylene group.

5. The polymer material of claim 1, wherein Y is a group represented by one of Chemical Formulae 2-7 to 2-14:

(2-7)

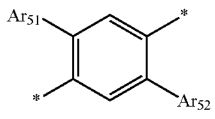

(2-8)

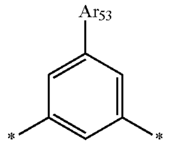

(2-9)

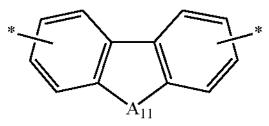

(2-10)

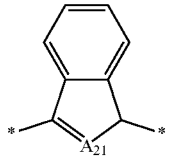

-continued (2-11)

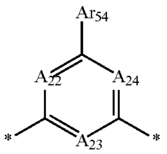

(2-12)

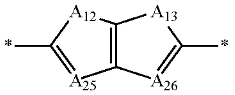

(2-13)

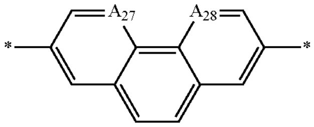

(2-14)

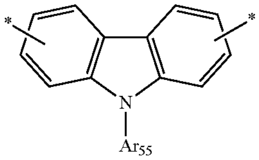

wherein, in Chemical Formulae 2-7 to 2-14, $Ar_{51}$ to $Ar_{55}$ are each independently hydrogen, deuterium, a substituted or unsubstituted C1 to C20 alkyl group, a substituted or unsubstituted C1 to C20 heteroalkyl group, a substituted or unsubstituted C6 to C60 monovalent aromatic cyclic group, or a substituted or unsubstituted C3 to C60 monovalent aromatic heterocyclic group, $A_{11}$ to $A_{13}$ are each independently —O—, —S—, —Se—, —$CR_3R_4$—, or —$SiR_5R_6$— wherein $R_3$ to $R_6$ are each independently hydrogen, deuterium, a substituted or unsubstituted C1 to C20 alkyl group, a substituted or unsubstituted C6 to C60 aryl group, or a substituted or unsubstituted C3 to C60 heteroaryl group, $A_{21}$ to $A_{28}$ are each independently —$CR_7$═, —N═, or —$SiR_8$═ wherein $R_7$ to $R_8$ are each independently hydrogen, deuterium, a substituted or unsubstituted C1 to C20 alkyl group, a substituted or unsubstituted C6 to C60 aryl group, or a substituted or unsubstituted C3 to C60 heteroaryl group, and

* is a linking point.

6. The polymer material of claim 1, wherein $Ar_1$ is a group represented by one of Chemical Formulae 2-15 to 2-26:

(2-15)

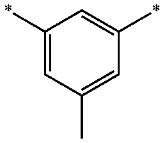

(2-16)

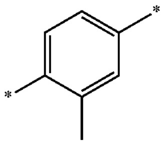

-continued (2-17)

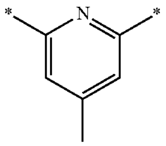

(2-18)

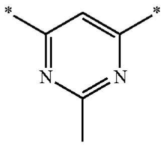

(2-19)

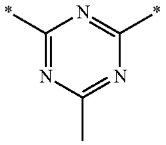

(2-20)

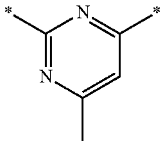

(2-21)

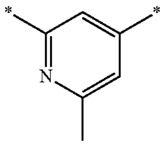

(2-22)

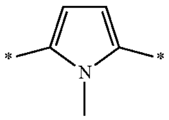

(2-23)

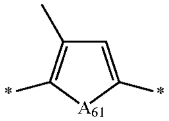

(2-24)

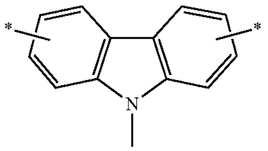

(2-25)

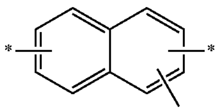

(2-26)

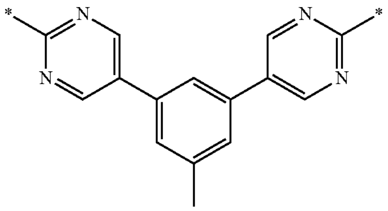

wherein, in Chemical Formulae 2-15 to 2-26, $A_{61}$ is —O—, —S—, —Se—, —$NR_{61}$— wherein $R_{61}$ is hydrogen, deuterium, a substituted or unsubstituted C1 to C20 alkyl group, a substituted or unsubstituted C6 to C60 aryl group, or a substituted or unsubstituted C3 to C60 heteroaryl group, or —$CR_{62}R_{63}$— wherein $R_{62}$ and $R_{63}$ are each independently hydrogen, deuterium, a substituted or unsubstituted C1 to C20 alkyl group, a substituted or unsubstituted C6 to C60 aryl group, or a substituted or unsubstituted C3 to C60 heteroaryl group, and

* is a linking point.

7. The polymer material of claim 1, wherein $Ar_2$ and $Ar_3$ are each independently a group represented by one of Chemical Formulae 2-27 to 2-70:

(2-27)

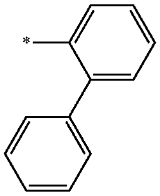

(2-28)

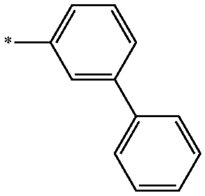

(2-29)

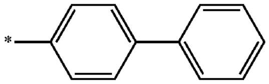

(2-30)

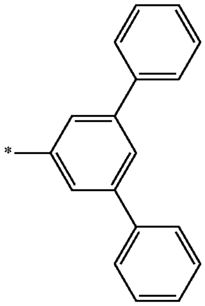

(2-31)

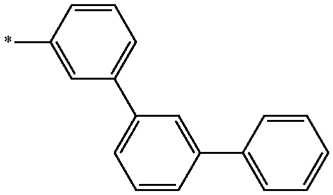

(2-32)

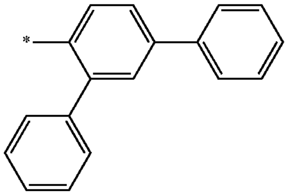

-continued (2-33)

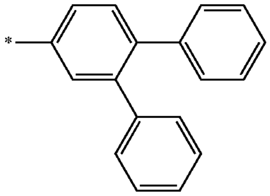

(2-34)

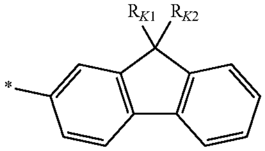

(2-35)

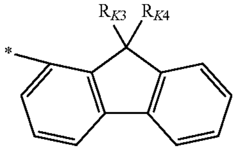

(2-36)

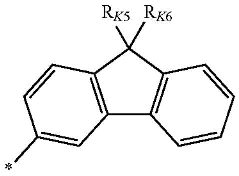

(2-37)

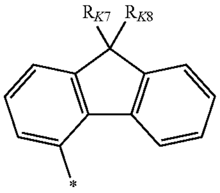

(2-38)

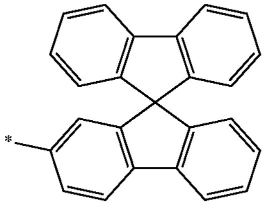

(2-39)

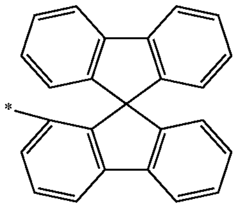

(2-40)

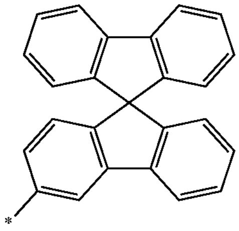

-continued
(2-41)
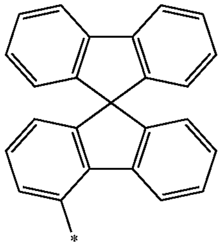
(2-42)
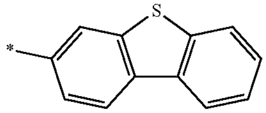
(2-43)
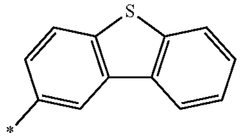
(2-44)
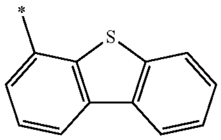
(2-45)
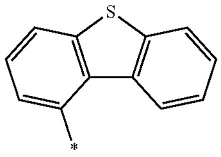
(2-46)
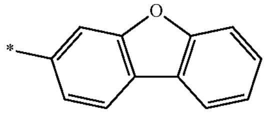
(2-47)
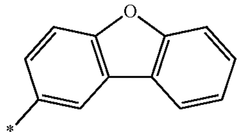
(2-48)
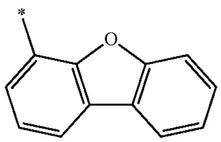
(2-49)
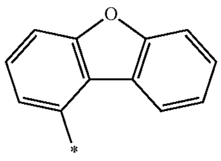
(2-50)
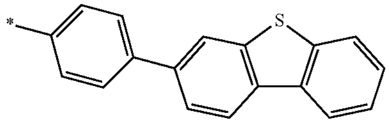
-continued
(2-51)
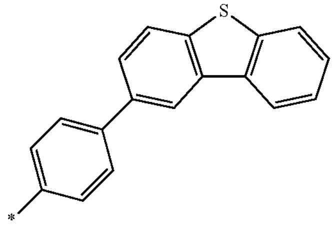
(2-52)
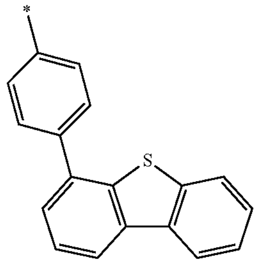
(2-53)
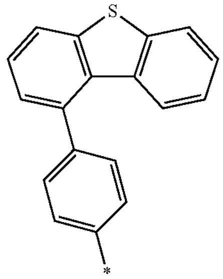
(2-54)
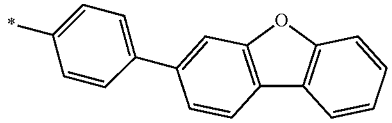
(2-55)
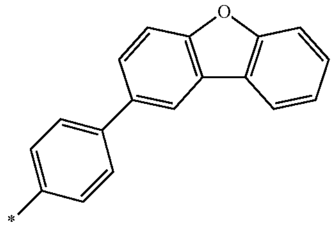
(2-56)
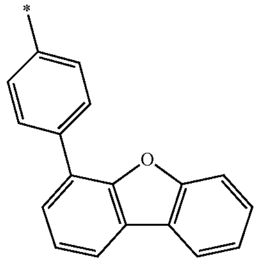

-continued
(2-57)
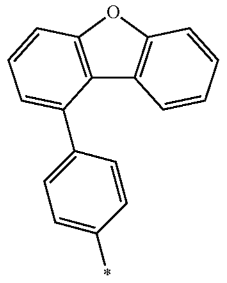
(2-58)
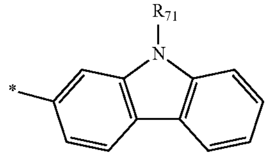
(2-59)
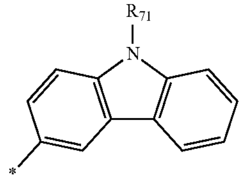
(2-60)
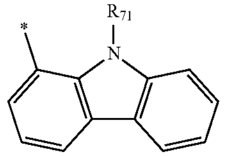
(2-61)
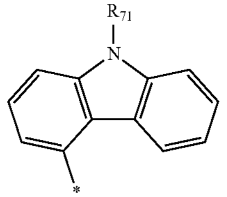
(2-62)
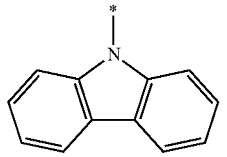
(2-63)
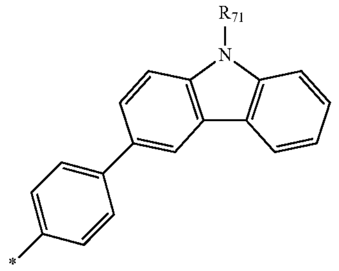
(2-64)
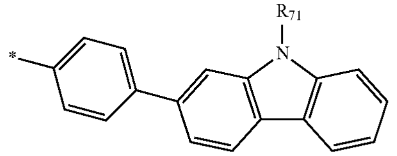
-continued
(2-65)
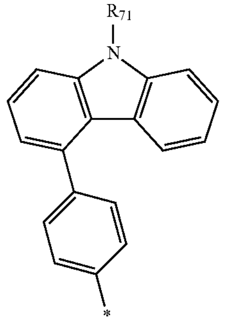
(2-66)
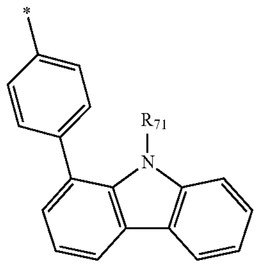
(2-67)
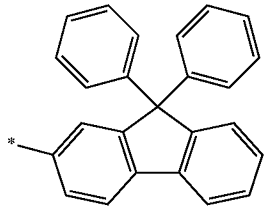
(2-68)
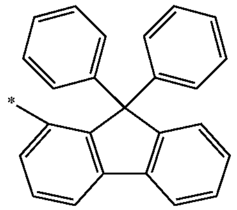
(2-69)
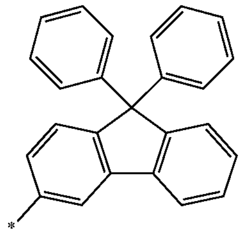
(2-70)
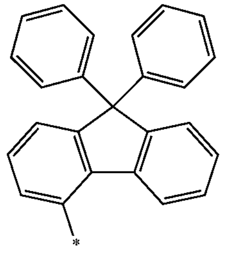
wherein, in Chemical Formulae 2-27 to 2-70,
$R_{71}$ is a substituted or unsubstituted C1 to C20 alkyl group, a substituted or unsubstituted C1 to C20 alkoxy group, a substituted or unsubstituted C6 to C60 monovalent aromatic cyclic group, or a substituted or unsubstituted C3 to C60 monovalent aromatic heterocyclic group, wherein, in Chemical Formula 2-34, 2-35, 2-36, and 2-37, $R_{K1}$ to $R_{K8}$ are each independently a substituted or unsubstituted C1 to C20 alkyl group, and

* is a linking point.

8. The polymer material of claim 1, wherein the polymer material comprises an alternating copolymer comprising the structural unit represented by Chemical Formula 1, and the alternating copolymer is represented by Chemical Formula 3:

$$E\!\left(X-Y\right)_m\!E$$ Chemical Formula 3 wherein, in Chemical Formula 3, each E is independently a substituted or unsubstituted C6 to C60 monovalent aromatic cyclic group, or a substituted or unsubstituted C3 to C60 monovalent aromatic heterocyclic group, m is an integer of 2 or more, and each X and each Y is independently the same or different.

9. The polymer material of claim 8, wherein E is a group represented by one of Chemical Formulae 3-1 to 3-14:

(3-1)

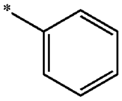

(3-2)

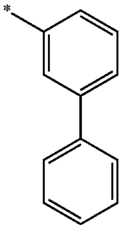

(3-3)

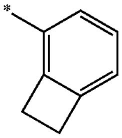

(3-4)

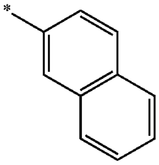

(3-5)

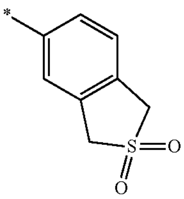

(3-6)

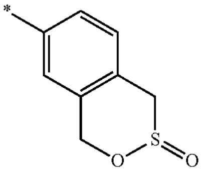

-continued (3-7)

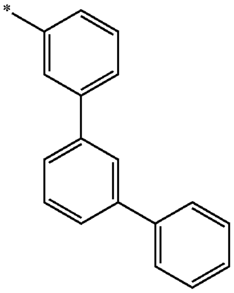

(3-8)

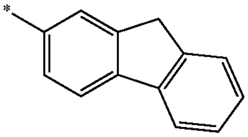

(3-9)

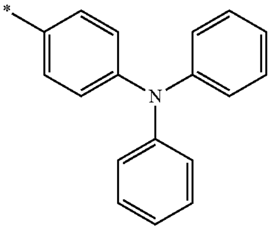

(3-10)

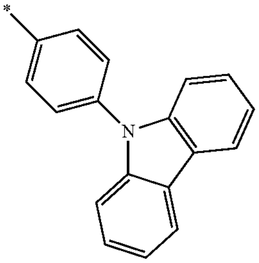

(3-11)

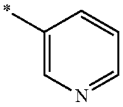

(3-12)

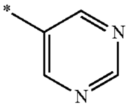

(3-13)

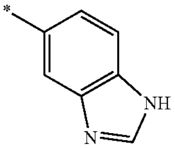

(3-14)

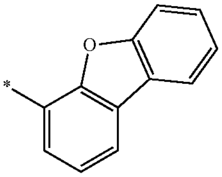

wherein, in Chemical Formulae 3-1 to 3-14,

* is a linking point.

10. The polymer material of claim 1, wherein a number average molecular weight ($M_n$) of the polymer material is about 10,000 grams per mole to about 1,000,000 grams per mole.

11. The polymer material of claim 1, wherein a HOMO (highest occupied molecular orbital) energy level of the polymer material is about 5.5 electron Volts to about 6.0 electron Volts.

12. A material for an electroluminescence device, the material comprising the polymer material of claim 1.

13. A composition comprising:

the polymer material of claim 1; and at least one of a solvent or a dispersive medium.

14. A thin film comprising the polymer material of claim 1.

15. An electroluminescence device comprising:

a pair of electrodes facing each other; and at least one organic layer comprising the polymer material of claim 1 disposed between the pair of electrodes.

16. The electroluminescence device of claim 15, wherein the at least one organic layer is formed by coating a composition comprising the polymer material.

17. The electroluminescence device of claim 15, further comprising a quantum dot layer comprising a plurality of inorganic nanoparticles disposed between the pair of electrodes.

18. The electroluminescence device of claim 15, wherein the at least one organic layer comprises a hole transport layer, and the hole transport layer comprises the polymer material.

19. A method for the manufacture of a polymer material, the method comprising:

providing at least one first monomer represented by Chemical Formula 4;

Chemcial Formula 4

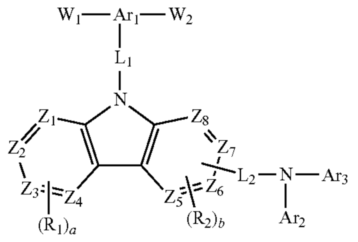

providing at least one second monomer represented by Chemical Formula 5; and $$W_3—Y—W_4$$ Chemical Formula 5 polymerizing the first monomer and the second monomer to obtain the polymer material, wherein, in Chemical Formulae 4 and 5, $Ar_1$ is a substituted or unsubstituted C6 to C60 trivalent aromatic cyclic group, or a substituted or unsubstituted C3 to C60 trivalent aromatic heterocyclic group, $Ar_2$ and $Ar_3$ are each independently a substituted or unsubstituted C6 to C60 monovalent aromatic cyclic group, or a substituted or unsubstituted C3 to C60 monovalent aromatic heterocyclic group, Y is a substituted or unsubstituted C6 to C60 divalent aromatic cyclic group, a substituted or unsubstituted C6 to C60 divalent alicyclic cyclic group, a substituted or unsubstituted C3 to C60 divalent aromatic heterocyclic group, or a substituted or unsubstituted C3 to C60 divalent alicyclic heterocyclic group, $L_1$ and $L_2$ are each independently a single bond, a substituted or unsubstituted C6 to C60 divalent aromatic cyclic group, or a substituted or unsubstituted C3 to C60 divalent aromatic heterocyclic group, each $R_1$ and $R_2$ are the same or different, and are each independently a substituted or unsubstituted C1 to C20 alkyl group, a substituted or unsubstituted C1 to C20 alkoxy group, a substituted or unsubstituted C6 to C60 monovalent aromatic cyclic group, or a substituted or unsubstituted C3 to C60 monovalent aromatic heterocyclic group, or $R_1$ and $R_2$ are combined with each other to form one ring that is a pentagonal ring, a hexagonal ring, or a fused ring, a is an integer ranging from 0 to 4, b is an integer ranging from 0 to 3, $Z_1$ to $Z_8$ are each independently a nitrogen atom or —CH═, and $W_1$ to $W_4$ are each independently a halogen atom or a group represented by Chemical Formula 5-1

Chemical Formula 5-1

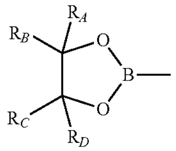

wherein, in Chemical Formula 5-1, $R_A$ to $R_D$ are each independently a C1 to C3 alkyl group.

* * * * *